(12) United States Patent
Yamatani

(10) Patent No.: US 11,251,380 B2
(45) Date of Patent: Feb. 15, 2022

(54) ORGANIC ELECTROLUMINESCENCE DEVICE AND POLYCYCLIC COMPOUND FOR ORGANIC ELECTROLUMINESCENCE DEVICE

(71) Applicant: Samsung Display Co., Ltd., Yongin-Si (KR)

(72) Inventor: Akinori Yamatani, Yokohama (JP)

(73) Assignee: Samsung Display Co., Ltd., Yongin-si (KR)

( * ) Notice: Subject to any disclaimer, the term of this patent is extended or adjusted under 35 U.S.C. 154(b) by 442 days.

(21) Appl. No.: 16/239,438

(22) Filed: Jan. 3, 2019

(65) Prior Publication Data

US 2019/0214585 A1 Jul. 11, 2019

(30) Foreign Application Priority Data

Jan. 8, 2018 (KR) .................. 10-2018-0002395

(51) Int. Cl.
*C07F 7/08* (2006.01)
*C07F 7/30* (2006.01)
(Continued)

(52) U.S. Cl.
CPC ........ *H01L 51/0094* (2013.01); *C07F 7/0816* (2013.01); *C07F 7/30* (2013.01);
(Continued)

(58) Field of Classification Search
CPC .. C07F 7/30; C07F 7/0816; C07F 5/02; C07F 9/65685; C07F 9/6596; H01L 51/0071; H01L 51/0072
See application file for complete search history.

(56) References Cited

U.S. PATENT DOCUMENTS

2009/0251049 A1 10/2009 Kim et al.
2010/0045170 A1 2/2010 Lee et al.
(Continued)

FOREIGN PATENT DOCUMENTS

CN 107056842 A 8/2017
JP 2012-169465 A 9/2012
(Continued)

OTHER PUBLICATIONS

STN Search (Mar. 2021).*
(Continued)

*Primary Examiner* — Vu A Nguyen
(74) *Attorney, Agent, or Firm* — Lewis Roca Rothgerber Christie LLP

(57) ABSTRACT

An organic electroluminescence device and a polycyclic compound used for the organic electroluminescence device are provided. The polycyclic compound according to an embodiment of the inventive concept is represented by Formula 1. In Formula 1, Y is B, P=O, or P=S, and X is $SiR_3R_4$, or $GeR_5R_6$. At least one of $R_1$ or $R_2$ is $NAr_2Ar_3$.

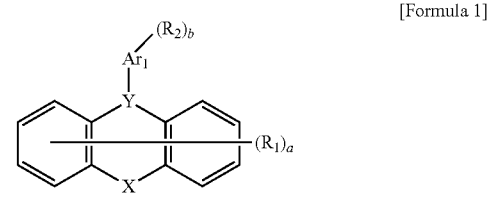

[Formula 1]

24 Claims, 2 Drawing Sheets

(51) Int. Cl.
  *C07F 9/6568* (2006.01)
  *H01L 51/00* (2006.01)
  *H01L 51/50* (2006.01)
  *C07F 9/6596* (2006.01)

(52) U.S. Cl.
  CPC ........ *C07F 9/6596* (2013.01); *C07F 9/65685* (2013.01); *H01L 51/0072* (2013.01); *H01L 51/5012* (2013.01); *H01L 51/5056* (2013.01); *H01L 51/5072* (2013.01)

(56) References Cited

U.S. PATENT DOCUMENTS

| | | | |
|---|---|---|---|
| 2015/0162542 A1 | 6/2015 | Ryu et al. | |
| 2018/0019415 A1* | 1/2018 | Nakano | C09K 11/06 |
| 2018/0266653 A1* | 9/2018 | Jiang | G02B 3/0037 |
| 2018/0287090 A1* | 10/2018 | Sato | H01L 51/0071 |

FOREIGN PATENT DOCUMENTS

| | | |
|---|---|---|
| JP | 5659819 B2 | 1/2015 |
| JP | 2015-029117 A | 2/2015 |
| JP | 5724588 B2 | 5/2015 |
| KR | 10-0910150 B1 | 7/2009 |
| KR | 10-2009-0098585 A | 9/2009 |
| KR | 10-2011-0049244 A | 5/2011 |
| KR | 10-2014-0025120 A | 3/2014 |
| KR | 10-2014-0134884 A | 11/2014 |
| KR | 10-2018-0112152 A | 10/2018 |
| WO | 2011/055912 A1 | 5/2011 |
| WO | 2015/072537 A1 | 5/2015 |
| WO | 2015/080182 A1 | 6/2015 |
| WO | 2016/029137 A1 | 2/2016 |

OTHER PUBLICATIONS

SciFinder Search (Mar. 28, 2021).*
"Light blue and green thermally activated delayed fluorescence from 10H-phenoxaborin-derivatives and their application to organic light-emitting diodes" Journal of Materials Chemistry C: 2015, 9 pages.
European Communication corresponding to European Patent Application No. 19150255.8 dated Jun. 3, 2019 8 pages.
Duan, Chunbo, et al. "Multi-dipolar chromophores featuring phosphine oxide as joint acceptor: a new strategy toward highefficiency blue thermally activated delayed fluorescence dyes", Chemistry of Materials, 2016, 28.16: 5667-5679 (Jun. 28, 2018), 13 pages.
Suzuki, Katsuaki, et al. "Triarylboron-Based Fluorescent Organic Light-Emitting Diodes with External Quantum Efficiencies Exceeding 20%", Angewandte Chemie, 2015, 54, 15231-15235 (May 27, 2015), 5 pages.

* cited by examiner

ORGANIC ELECTROLUMINESCENCE DEVICE AND POLYCYCLIC COMPOUND FOR ORGANIC ELECTROLUMINESCENCE DEVICE

CROSS-REFERENCE TO RELATED APPLICATIONS

This U.S. non-provisional patent application claims priority under 35 U.S.C. § 119 of Korean Patent Application No. 10-2018-0002395, filed on Jan. 8, 2018, the entire contents of which are hereby incorporated by reference.

BACKGROUND

The present disclosure herein relates to an organic electroluminescence device and a polycyclic compound used for the organic electroluminescence device.

Application of organic electroluminescence display devices in an image display devices is being actively developed. Unlike a liquid crystal display device, the organic electroluminescence display device is a self-luminescent display device in which holes and electrons injected from a first electrode and a second electrode recombine in an emission layer, and a light-emitting material which is an organic compound included in the emission layer emits light.

As an organic electroluminescence device, an organic device including, for example, a first electrode, a hole transport layer disposed on the first electrode, an emission layer disposed on the hole transport layer, an electron transport layer disposed on the emission layer, and a second electrode disposed on the electron transport layer is well known. Holes are injected from the first electrode, and the injected holes move via the hole transport layer and are injected into the emission layer. Meanwhile, electrons are injected from the second electrode, and the injected electrons move via the electron transport layer and are injected into the emission layer. The holes and electrons injected into the emission layer recombine to produce excitons in the emission layer. The organic electroluminescence device emits light using light generated by the transition of the excitons to a ground state. In addition, an embodiment of the configuration of the organic electroluminescence device is not limited thereto, but various modifications may be possible. In the application of an organic electroluminescence device to a display device, increased efficiency and lifespan of the organic electroluminescence device is desired.

SUMMARY

The present disclosure provides an organic electroluminescence device having high emission efficiency and long life.

The present disclosure also provides a polycyclic compound which is applicable to an organic electroluminescence device having high emission efficiency and long life.

An organic electroluminescence device according to an embodiment of the inventive concept includes a first electrode, a hole transport region disposed on the first electrode, an emission layer disposed on the hole transport region, an electron transport region disposed on the emission layer, and a second electrode disposed on the electron transport region. The emission layer includes a polycyclic compound represented by Formula 1:

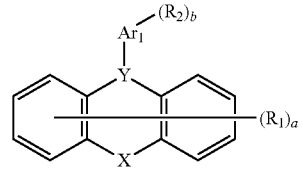

[Formula 1]

In Formula 1, Y is B, P=O, or P=S, $R_1$ and $R_2$ are each independently a hydrogen atom, a deuterium atom, a halogen atom, a substituted or unsubstituted amine group, a substituted or unsubstituted silyl group, a substituted or unsubstituted boryl group, a substituted or unsubstituted aralkyl group having 6 to 30 carbon atoms, a substituted or unsubstituted aryloxy group having 6 to 30 carbon atoms, a substituted or unsubstituted arylthio group having 6 to 30 carbon atoms, a substituted or unsubstituted phosphine group, a substituted or unsubstituted phosphine oxide group, a substituted or unsubstituted phosphine sulfide group, a substituted or unsubstituted alkyl group having 1 to 20 carbon atoms, a substituted or unsubstituted aryl group having 6 to 30 carbon atoms for forming a ring, or a substituted or unsubstituted heteroaryl group having 2 to 30 carbon atoms for forming a ring, or may be combined with an adjacent group to form a hydrocarbon ring or a heterocycle, at least one of $R_1$ or $R_2$ is $NAr_2Ar_3$, each of $Ar_1$, $Ar_2$, and $Ar_3$ is independently a substituted or unsubstituted aryl group having 6 to 30 carbon atoms for forming a ring, or a substituted or unsubstituted heteroaryl group having 2 to 30 carbon atoms for forming a ring, where $Ar_2$ and $Ar_3$ may be combined with each other to form a hydrocarbon ring or a heterocycle, X is $SiR_3R_4$ or $GeR_5R_6$, each of $R_3R_4$, $R_5$, and $R_6$ is independently a substituted or unsubstituted alkyl group having 1 to 20 carbon atoms, a substituted or unsubstituted aryl group having 6 to 30 carbon atoms for forming a ring, or a substituted or unsubstituted heteroaryl group having 2 to 30 carbon atoms for forming a ring, "a" is an integer between 0 and 8, inclusive, "b" is an integer between 0 and 5, inclusive, a+b≠0, if $R_1$ is $NAr_2Ar_3$, "a" is an integer between 1 and 8, inclusive, and if $R_2$ is $NAr_2Ar_3$, "b" is an integer between 1 and 5, inclusive.

In an embodiment, at least one of $R_1$ and $R_2$ may be represented by the following Formula 2:

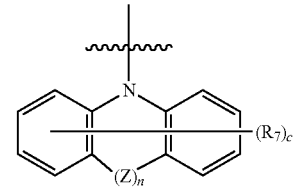

[Formula 2]

In Formula 2, Z is a direct linkage, O, S, Se, $NAr_{11}$, $POAr_{12}$, $CAr_{14}Ar_5$, $SiAr_{16}Ar_{17}$, $GeAr_{18}Ar_{19}$, or $BAr_{20}$, n is 0 or 1, each Ar from $Ar_{11}$ to $Ar_{20}$ is independently a substituted or unsubstituted alkyl group having 1 to 20 carbon atoms, a substituted or unsubstituted aryl group having 6 to 30 carbon atoms for forming a ring, or a substituted or unsubstituted heteroaryl group having 2 to 30 carbon atoms for forming a ring, or may be combined with an adjacent group to form a hydrocarbon ring or a heterocycle, $R_7$ is a hydrogen atom, a deuterium atom, a halogen atom, a substituted or unsubstituted amine group, a substituted or unsubstituted alkyl group having 1 to 20 carbon atoms, a substituted or unsubstituted aryl group having 6 to 30 carbon atoms for forming a ring, or a substituted or unsubstituted heteroaryl group having 2 to 30 carbon atoms for forming a ring, and "c" is an integer between 0 and 8, inclusive.

In an embodiment, "b" may be 1, and $R_2$ may be represented by Formula 2.

In an embodiment, "a" may be 1 or 2, and $R_1$ may be represented by Formula 2.

In an embodiment, the polycyclic compound represented by Formula 1 may be represented by one of the following Formulae 3-1 to 3-3:

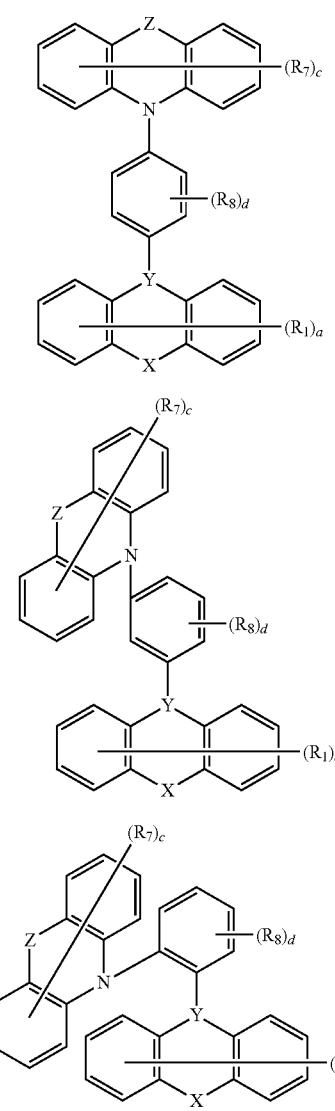

[Formula 3-1]

[Formula 3-2]

[Formula 3-3]

In Formulae 3-1 to 3-3, $R_8$ is a hydrogen atom, a deuterium atom, a halogen atom, a substituted or unsubstituted alkyl group having 1 to 20 carbon atoms, a substituted or unsubstituted aryl group having 6 to 30 carbon atoms for forming a ring, or a substituted or unsubstituted heteroaryl group having 2 to 30 carbon atoms for forming a ring, and "d" is an integer between 0 and 4, inclusive. $R_1$, $R_7$, "a", "c", X, Y, and Z are the same as defined above.

In an embodiment, the polycyclic compound represented by Formula 1 may be represented by one of the following Formulae 4-1 to 4-4:

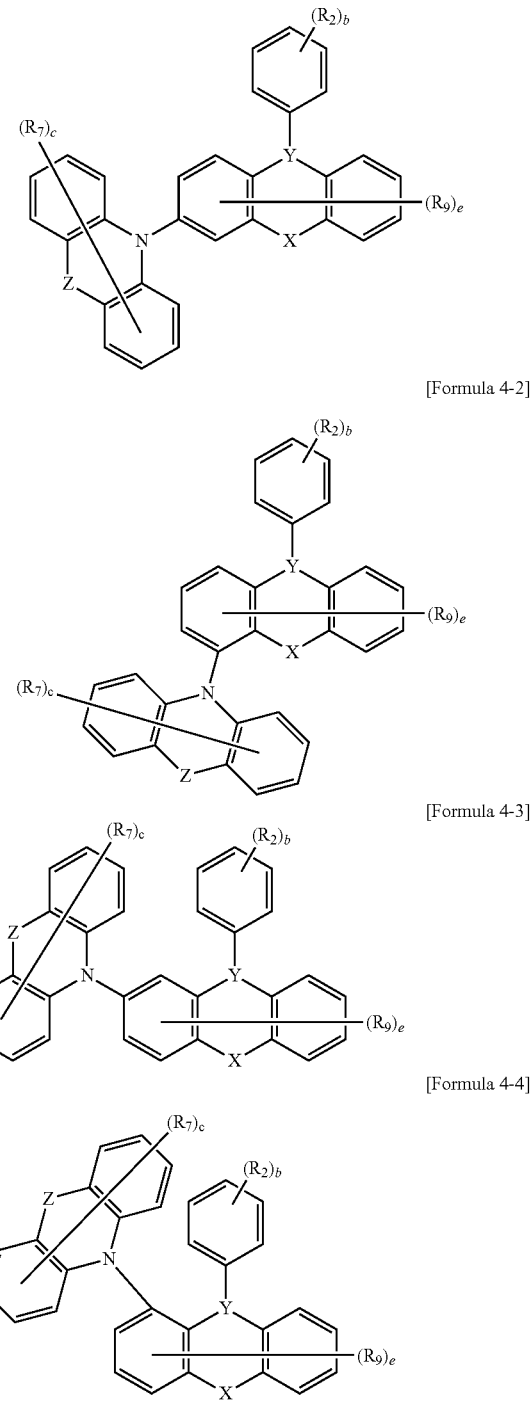

[Formula 4-1]

[Formula 4-2]

[Formula 4-3]

[Formula 4-4]

In Formulae 4-1 to 4-4, each R from $R_2$ to $R_9$ is independently a hydrogen atom, a deuterium atom, a halogen atom, a substituted or unsubstituted alkyl group having 1 to 20 carbon atoms, a substituted or unsubstituted aryl group having 6 to 30 carbon atoms for forming a ring, or a substituted or unsubstituted heteroaryl group having 2 to 30 carbon atoms for forming a ring, or may be combined with an adjacent group to form a hydrocarbon ring or a heterocycle, "e" is an integer between 0 and 7, inclusive, and $R_7$, "b", "c", X, Y, and Z are the same as defined above.

In an embodiment, at least one of $R_1$ or $R_2$ may be represented by one of the following Formulae 2-1 to 2-14:

[Formula 2-1]

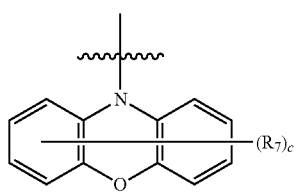

[Formula 2-2]

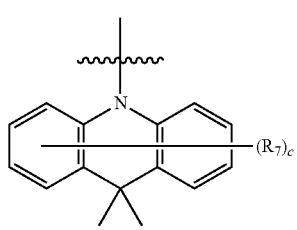

[Formula 2-3]

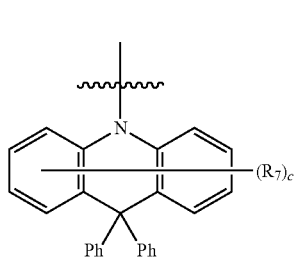

[Formula 2-4]

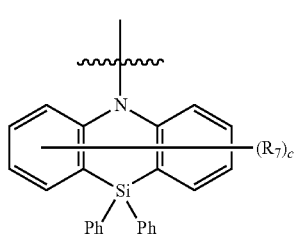

[Formula 2-5]

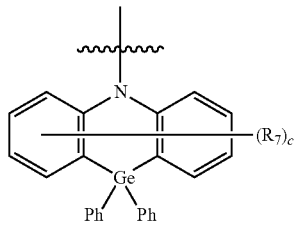

[Formula 2-6]

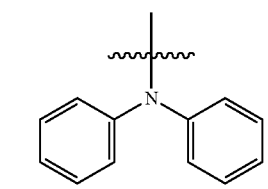

-continued

[Formula 2-7]

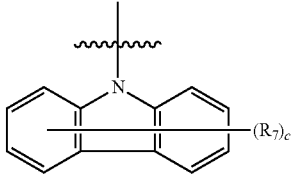

[Formula 2-8]

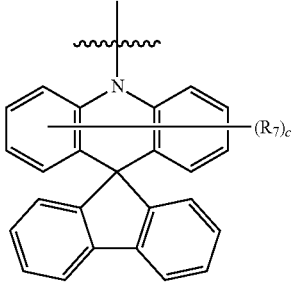

[Formula 2-9]

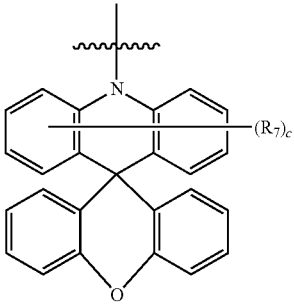

[Formula 2-10]

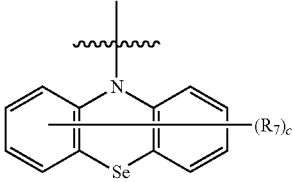

[Formula 2-11]

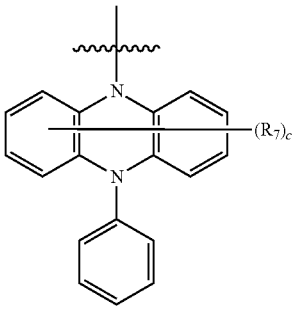

[Formula 2-12]

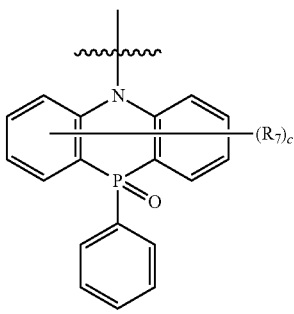

[Formula 2-13]

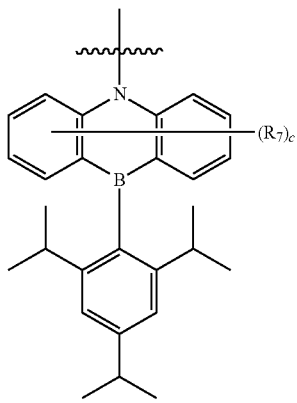

[Formula 2-14]

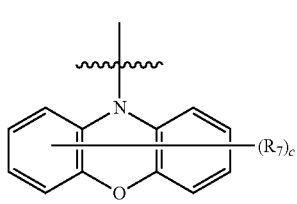

In Formulae 2-1 to 2-14, $R_7$ and "c" are the same as defined above.

In an embodiment, each R from $R_3$ to $R_6$ may be independently a substituted or unsubstituted alkyl group having 3 to 10 carbon atoms, or a substituted or unsubstituted phenyl group.

In an embodiment, the emission layer may include a host and a dopant, and the dopant may include the polycyclic compound represented by Formula 1.

In an embodiment, the polycyclic compound represented by Formula 1 may have an energy difference ($\Delta E_{ST}$) between the lowest singlet energy level ($S_1$) and the lowest triplet energy level ($T_1$) of about 0.2 eV or less.

In an embodiment, the maximum light-emitting wavelength of the emission layer may be about 510 nm or less.

An embodiment of the inventive concept provides the polycyclic compound represented by Formula 1.

An embodiment of the inventive concept provides a polycyclic compound represented by the following Formula 5:

[Formula 5]

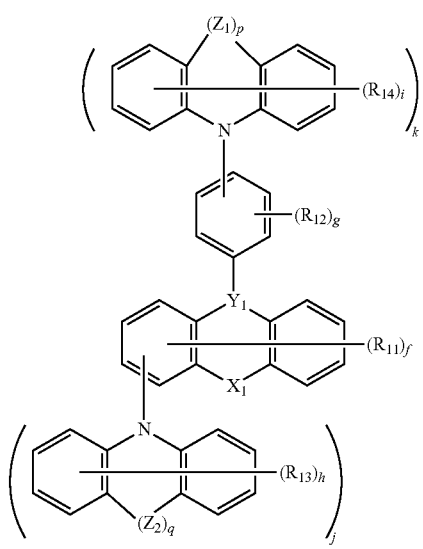

In Formula 5, $Y_1$ is B, P=O, or P=S, $X_1$ is $SiR_{15}R_{16}$, or $GeR_{17}R_{18}$, each R from $R_{11}$ to $R_{18}$ is independently a hydrogen atom, a deuterium atom, a halogen atom, a substituted or unsubstituted silyl group, a substituted or unsubstituted boryl group, a substituted or unsubstituted aralkyl group having 6 to 30 carbon atoms, a substituted or unsubstituted aryloxy group having 6 to 30 carbon atoms, a substituted or unsubstituted arylthio group having 6 to 30 carbon atoms, a substituted or unsubstituted phosphine group, a substituted or unsubstituted phosphine oxide group, a substituted or unsubstituted phosphine sulfide group, a substituted or unsubstituted alkyl group having 1 to 20 carbon atoms, a substituted or unsubstituted aryl group having 6 to 30 carbon atoms for forming a ring, or a substituted or unsubstituted heteroaryl group having 2 to 30 carbon atoms for forming a ring, or may be combined with an adjacent group to form a hydrocarbon ring or a heterocycle, each of $Z_1$ and $Z_2$ is independently a direct linkage, O, S, Se, $NAr_{21}$, $POAr_{22}$, $CAr_{24}Ar_{25}$, $SiAr_{26}Ar_{27}$, $GeAr_{28}Ar_{29}$, or $BAr_{30}$, each Ar from $Ar_{21}$ to $Ar_{30}$ is independently a substituted or unsubstituted alkyl group having 1 to 20 carbon atoms, a substituted or unsubstituted aryl group having 6 to 30 carbon atoms for forming a ring, or a substituted or unsubstituted heteroaryl group having 2 to 30 carbon atoms for forming a ring, or may be combined with an adjacent group to form a hydrocarbon ring or a heterocycle, each of "p" and "q" is independently 0 or 1, "f" is an integer between 0 and 7, inclusive, "g" is an integer between 0 and 4, inclusive, each of "h" and "i" is independently an integer between 0 and 8, inclusive, each of "j" and "k" is independently an integer between 0 and 1, inclusive, and j+k≠0.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
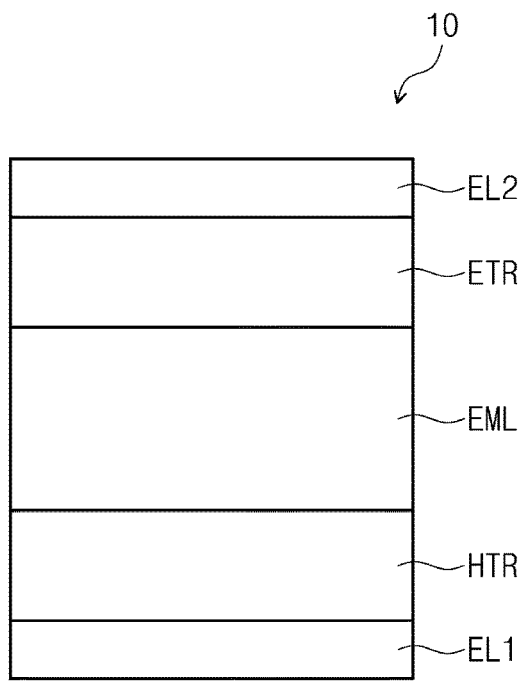
FIG. 1 is a cross-sectional view schematically illustrating an organic electroluminescence device according to an embodiment of the inventive concept.

The above objects, other objects, features and advantages of the inventive concept will be easily understood from preferred exemplary embodiments with reference to the accompanying drawings. The inventive concept may, however, be embodied in different forms and should not be construed as limited to the embodiments set forth herein. Rather, exemplary embodiments are provided so that the contents disclosed herein become thorough and complete, and the spirit of the inventive concept is sufficiently accepted for a person skilled in the art.

Like reference numerals refer to like elements for explaining each drawing. In the drawings, the sizes of elements may be enlarged for clarity of the inventive concept. It will be understood that, although the terms first, second, etc. may be used herein to describe various elements, these elements should not be limited by these terms. These terms are only used to distinguish one element from another element. For example, a first element discussed below could be termed a second element, and similarly, a second element could be termed a first element. As used herein, the singular forms are intended to include the plural forms as well, unless the context clearly indicates otherwise.

It will be further understood that the terms "comprises" or "comprising," when used in this specification, specify the presence of stated features, numerals, steps, operations, elements, parts, or a combination thereof, but do not preclude the presence or addition of one or more other features, numerals, steps, operations, elements, parts, or a combination thereof. It will also be understood that when a layer, a film, a region, a plate, etc. is referred to as being "on" another part, it can be "directly on" the other part, or intervening layers may also be present. On the contrary, when a layer, a film, a region, a plate, etc. is referred to as being "under" another part, it can be "directly under" the other part, or intervening layers may also be present.

First, organic electroluminescence devices according to exemplary embodiments of the inventive concept will be explained referring to FIG. 1 to FIG. 3.

FIG. 1 is a cross-sectional view schematically illustrating an organic electroluminescence device according to an embodiment of the inventive concept. FIG. 2 is a cross-sectional view schematically illustrating an organic electroluminescence device according to an embodiment of the inventive concept. FIG. 3 is a cross-sectional view schematically illustrating an organic electroluminescence device according to an embodiment of the inventive concept.

Figure 2:
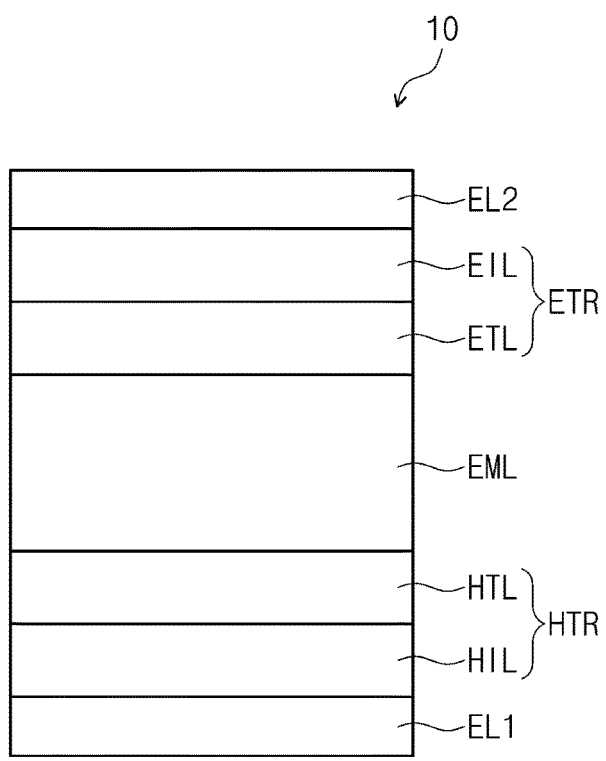
FIG. 2 is a cross-sectional view schematically illustrating an organic electroluminescence device according to an embodiment of the inventive concept.
Figure 3:
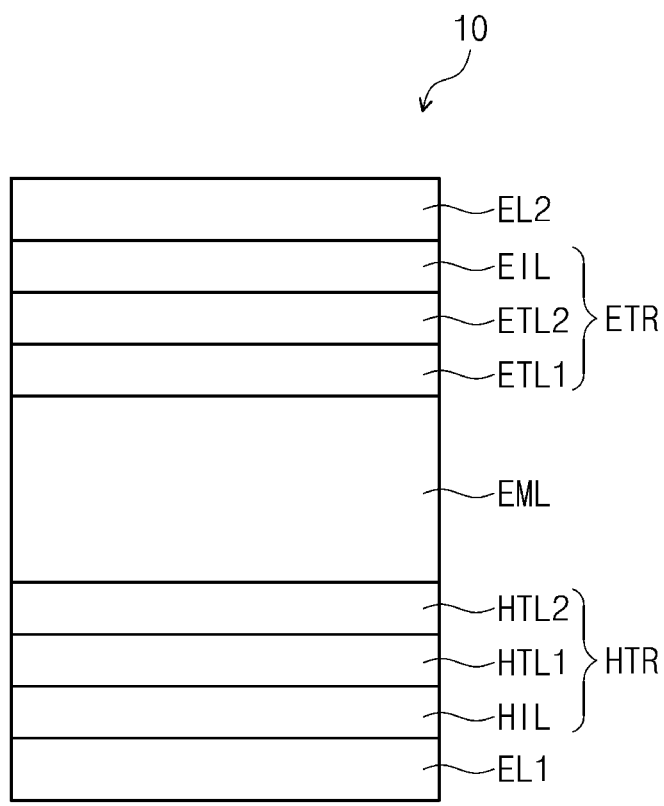
FIG. 3 is a cross-sectional view schematically illustrating an organic electroluminescence device according to an embodiment of the inventive concept.

Referring to FIG. 1 to FIG. 3, an organic electroluminescence device 10 according to an embodiment of the inventive concept includes a first electrode EL1, a hole transport region HTR, an emission layer EML, an electron transport region ETR and a second electrode EL2.

The emission layer EML includes a polycyclic compound according to an embodiment of the inventive concept. Hereinafter, the polycyclic compound according to an embodiment of the inventive concept will be explained in detail and then, each layer of the organic electroluminescence device 10 will be explained.

The polycyclic compound according to an embodiment of the inventive concept is represented by the following Formula 1:

[Formula 1]

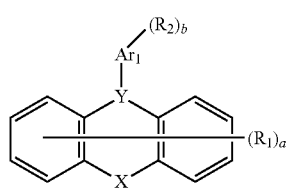

In Formula 1, Y is B, P=O, or P=S. If Y is P=O, $Ar_1$ and the oxygen atom are connected with P. If Y is P=S, $Ar_1$ and the sulfur atom are connected with P.

$R_1$ and $R_2$ are each independently a hydrogen atom, a deuterium atom, a halogen atom, a substituted or unsubstituted amine group, a substituted or unsubstituted silyl group, a substituted or unsubstituted boryl group, a substituted or unsubstituted aralkyl group having 6 to 30 carbon atoms, a substituted or unsubstituted aryloxy group having 6 to 30 carbon atoms, a substituted or unsubstituted arylthio group having 6 to 30 carbon atoms, a substituted or unsubstituted phosphine group, a substituted or unsubstituted phosphine oxide group, a substituted or unsubstituted phosphine sulfide group, a substituted or unsubstituted alkyl group having 1 to 20 carbon atoms, a substituted or unsubstituted aryl group having 6 to 30 carbon atoms for forming a ring, or a substituted or unsubstituted heteroaryl group having 2 to 30 carbon atoms for forming a ring. $R_1$ and $R_2$ may be each independently combined with an adjacent group to form a ring. $R_1$ and $R_2$ may be each independently combined with an adjacent group to form a hydrocarbon ring or a heterocycle.

At least one of $R_1$ or $R_2$ is $NAr_2Ar_3$. For example, $R_1$ may be $NAr_2Ar_3$ and $R_2$ may be a hydrogen atom, a substituted or unsubstituted isopropyl group, a substituted or unsubstituted phenyl group, or a substituted or unsubstituted silyl group. Alternatively, $R_2$ may be $NAr_2Ar_3$ and $R_1$ may be a hydrogen atom. However, an embodiment of the inventive concept is not limited thereto. "a" and "b" may be each independently 1, and $R_1$ and $R_2$ may be each independently represented by $NAr_2Ar_3$.

$Ar_1$ to $Ar_3$ are each independently a substituted or unsubstituted aryl group having 6 to 30 carbon atoms for forming a ring, or a substituted or unsubstituted heteroaryl group having 2 to 30 carbon atoms for forming a ring. $Ar_1$ to $Ar_3$ may be each independently a substituted or unsubstituted phenyl group. $Ar_2$ and $Ar_3$ may be combined with each other to form a hydrocarbon ring or a heterocycle.

X is $SiR_3R_4$, or $GeR_5R_6$.

$R_3$ to $R_6$ are each independently a substituted or unsubstituted alkyl group having 1 to 20 carbon atoms, a substituted or unsubstituted aryl group having 6 to 30 carbon atoms for forming a ring, or a substituted or unsubstituted heteroaryl group having 2 to 30 carbon atoms for forming a ring. $R_3$ to $R_6$ may be each independently a substituted or unsubstituted isopropyl group, or a substituted or unsubstituted phenyl group.

"a" is an integer between 0 and 8, inclusive. "b" is an integer between 0 and 5, inclusive. If "a" is 0, the polycyclic compound represented by Formula 1 may not be substituted with $R_1$. If "a" is an integer of 2 or more, a plurality of $R_1$ groups may be the same or different. If "b" is 0, the polycyclic compound represented by Formula 1 may not be substituted with $R_2$. If "b" is an integer of 2 or more, a plurality of $R_2$ groups may be the same or different.

a+b≠0. That is, at least one of "a" or "b" is an integer of 1 or more. More particularly, if $R_1$ is $NAr_2Ar_3$, "a" is an integer between 1 and 8, inclusive, and if $R_2$ is $NAr_2Ar_3$, "b" is an integer between 1 and 5, inclusive. The polycyclic compound represented by Formula 1 is substituted with at least one $NAr_2Ar_3$.

In the description,

indicates a part to be connected.

In the description, "substituted or unsubstituted" may mean substituted with at least one substituent selected from the group consisting of a deuterium atom, a halogen group, a cyano group, a nitro group, an amino group, a silyl group, an oxy group, a thio group, a sulfinyl group, a sulfonyl group, a carbonyl group, a boron group (boryl group), an amine group, a phosphine group, a phosphine oxide group, a phosphine sulfide group, an alkyl group, an alkenyl group, an aryl group, and a heterocycle, or unsubstituted. In addition, each of the substituents illustrated above may be substituted or unsubstituted. For example, a biphenyl group may be interpreted as an aryl group or a phenyl group substituted with a phenyl group.

In the description, the term "forming a ring via the combination with an adjacent group" may mean forming a substituted or unsubstituted hydrocarbon ring, or substituted or unsubstituted heterocycle via the combination with an adjacent group. The hydrocarbon ring includes an aliphatic hydrocarbon ring and an aromatic hydrocarbon ring. The heterocycle includes an aliphatic heterocycle and an aromatic heterocycle. The hydrocarbon ring and the heterocycle may be monocyclic or polycyclic. In addition, the ring formed via the combination with an adjacent group may be combined with another ring to form a spiro structure.

In the description, the term "an adjacent group" may mean a substituent substituted for an atom which is directly combined with an atom substituted with a corresponding substituent, another substituent substituted for an atom which is substituted with a corresponding substituent, or a substituent sterically positioned at the nearest position to a corresponding substituent. For example, in 1,2-dimethylbenzene, two methyl groups may be interpreted as "adjacent groups" to each other, and in 1,1-diethylcyclopentene, two ethyl groups may be interpreted as "adjacent groups" to each other.

In the description, the direct linkage may mean a single bond.

In the description, examples of the halogen atom may include a fluorine atom, a chlorine atom, a bromine atom and an iodine atom.

In the description, the alkyl may be a linear, branched or cyclic type. The carbon number of the alkyl may be 1 to 30, 1 to 20, 1 to 15, 1 to 10, 3 to 10, or 1 to 6. Examples of the alkyl may include methyl, ethyl, n-propyl, isopropyl, n-butyl, s-butyl, t-butyl, i-butyl, 2-ethylbutyl, 3,3-dimethylbutyl, n-pentyl, i-pentyl, neopentyl, t-pentyl, cyclopentyl, 1-methylpentyl, 3-methylpentyl, 2-ethylpentyl, 4-methyl-2-pentyl, n-hexyl, 1-methylhexyl, 2-ethylhexyl, 2-butylhexyl, cyclohexyl, 4-methylcyclohexyl, 4-t-butylcyclohexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, cyclooctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldocecyl, 2-octyldodecyl, n-tridecyl, n-tetradecyl, c-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyleicosyl, 2-butyleicosyl, 2-hexyleicosyl, 2-octyleicosyl, n-henicosyl, n-docosyl, n-tricosyl, n-tetracosyl, n-pentacosyl, n-hexacosyl, n-heptacosyl, n-octacosyl, n-nonacosyl, n-triacontyl, etc., without limitation.

In this description, "aryl" means an optional functional group or substituent derived from an aromatic hydrocarbon ring. "Aryl" may be a monocyclic aryl or a polycyclic aryl. The carbon number for forming a ring in the aryl may be 6 to 30, 6 to 20, or 6 to 15. Examples of "aryl" may include phenyl, naphthyl, fluorenyl, anthracenyl, phenanthryl, biphenyl, terphenyl, quaterphenyl, quinqphenyl, sexiphenyl, biphenylene, triphenylene, pyrenyl, benzofluoranthenyl, chrysenyl, etc., without limitation.

In the description, the fluorenyl group may be substituted, and two substituents may be combined with each other to form a spiro structure. Examples of the substituted fluorenyl group are shown below. However, an embodiment of the inventive concept is not limited thereto.

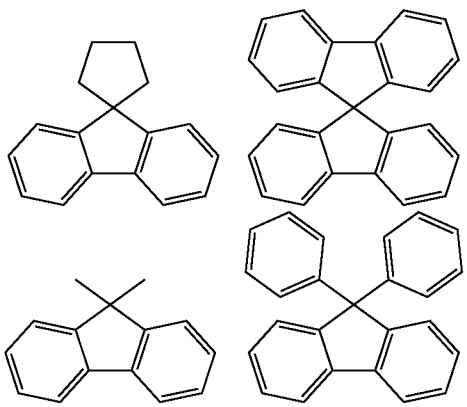

In the description, alkyl in the aralkyl may be the same as the examples of the alkyl.

In the description, aryl in the aralkyl, aryloxy, and arylthio may be the same as the examples of the aryl.

In the description, the heteroaryl may be a heteroaryl including at least one of O, N, P, Si or S as a heteroatom. If the heteroaryl includes two heteroatoms, two heteroatoms may be the same or different. The carbon number for forming a ring of the heteroaryl may be 2 to 30, or 2 to 20. The heteroaryl may be monocyclic heteroaryl or polycyclic heteroaryl. Examples of the polycyclic heteroaryl may have a dicyclic or tricyclic structure. Examples of the heteroaryl may include thiophene, furan, pyrrole, imidazole, thiazole, oxazole, oxadiazole, triazole, pyridine, bipyridine, pyrimidine, triazine, triazole, acridine, pyridazine, quinoline, quinazoline, quinoxaline, phenoxazine, phthalazine, pyrido pyrimidine, pyrido pyrazine, pyrazino pyrazine, isoquinoline, indole, carbazole, N-arylcarbazole, N-heteroarylcarbazole, N-alkylcarbazole, benzoxazole, benzoimidazole, benzothiazole, benzocarbazole, benzothiophene, dibenzothiophene, thienothiophene, benzofuran, phenanthroline, thiazole, isooxazole, oxadiazole, thiadiazole, phenothiazine, dibenzosilole, dibenzofuran, etc., without limitation.

In this description, "silyl" includes an alkyl silyl and aryl silyl. Examples of silyl may include trimethylsilyl, triethylsilyl, t-butyldimethylsilyl, vinyldimethylsilyl, propyldimethylsilyl, triphenylsilyl, diphenylsilyl, phenylsilyl, etc. However, an embodiment of the inventive concept is not limited thereto.

In the description, the carbon number of the amino group (amine group) is not specifically limited, but may be 1 to 30. The amino group may include an alkyl amino group and an aryl amino group. Examples of the amino group may include a methylamino group, a dimethylamino group, a phenylamino group, a diphenylamino group, a naphthylamino group, a 9-methyl-anthracenylamino group, a triphenylamino group, etc., without limitation.

In the description, the boron group (boryl group) includes an alkyl boron group and an aryl boron group. Examples of the boron group include trimethylboron, triethylboron, t-butyldimethylboron, triphenylboron, diphenylboron, phenylboron, etc., without limitation.

In the description, the alkenyl may be a linear chain or a branched chain. The number of carbons is not specifically limited but may be 2 to 30, 2 to 20, or 2 to 10. Examples of the alkenyl include vinyl, 1-butenyl, 1-pentenyl, 1,3-butadienyl aryl, styrenyl, styrylvinyl, etc., without limitation.

In the description, the phosphine oxide group may be substituted with, for example, at least one of alkyl or aryl.

In the description, the phosphine sulfide group may be substituted with, for example, at least one of alkyl or aryl.

At least one of $R_1$ or $R_2$ may be represented by the following Formula 2:

[Formula 2]

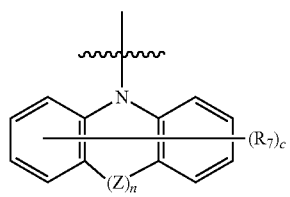

In Formula 2, Z is a direct linkage, O, S, Se, $NAr_{11}$, $POAr_{12}$, $CAr_{14}Ar_{15}$, $SiAr_{16}Ar_{17}$, $GeAr_{18}Ar_{19}$, or $BAr_{20}$. Z may be a direct linkage, O, S, or $CAr_{14}Ar_{15}$. If Z is a direct linkage, at least one of $R_1$ or $R_2$ may be a carbazole group. If Z is O, at least one of $R_1$ or $R_2$ may be a dibenzofuran group. If Z is S, at least one of $R_1$ or $R_2$ may be a dibenzothiophene group. If Z is $CAr_{14}Ar_{15}$, at least one of $R_1$ or $R_2$ may be an acridine group.

n is 0 or 1. If n is 0, Formula 2 may be a substituted or unsubstituted aryl amino group.

$Ar_{11}$ to $Ar_{20}$ are each independently a substituted or unsubstituted alkyl group having 1 to 20 carbon atoms, a substituted or unsubstituted aryl group having 6 to 30 carbon atoms for forming a ring, or a substituted or unsubstituted heteroaryl group having 2 to 30 carbon atoms for forming a ring. $Ar_{11}$ to $Ar_{20}$ may be each independently a substituted or unsubstituted methyl group or a substituted or unsubstituted phenyl group. $Ar_{11}$ to $Ar_{20}$ may be each independently combined with an adjacent group to form a hydrocarbon ring or a heterocycle, $R_7$ is a hydrogen atom, a deuterium atom, a halogen atom, a substituted or unsubstituted amine group, a substituted or unsubstituted alkyl group having 1 to 20 carbon atoms, a substituted or unsubstituted aryl group having 6 to 30 carbon atoms for forming a ring, or a substituted or unsubstituted heteroaryl group having 2 to 30 carbon atoms for forming a ring.

"c" is an integer between 0 and 8, inclusive. If "c" is 0, a substituent represented by Formula 2 may not be substituted with $R_7$. If "c" is an integer of 2 or more, a plurality of $R_7$ groups may be the same or different.

In Formula 1, "b" may be 1 and $R_2$ may be represented by Formula 2. In this case, "a" may be 0. However, an embodiment of the inventive concept is not limited thereto. "a" may be 1 or more, and $R_1$ may be a substituent other than a hydrogen atom. For example, $R_1$ may be represented by Formula 2.

In Formula 1, "a" is 1 or 2. If "a" is 1, $R_1$ may be represented by Formula 2. If "a" is 2, two $R_1$ groups may be each independently represented by Formula 2.

Formula 2 may be represented by one of the following Formulae 2-1 to 2-14, but an embodiment of the inventive concept is not limited thereto:

[Formula 2-1]

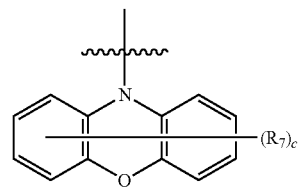

[Formula 2-2]

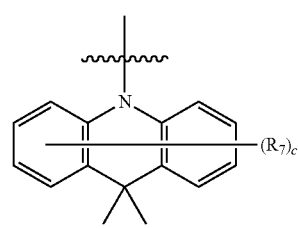

[Formula 2-3]

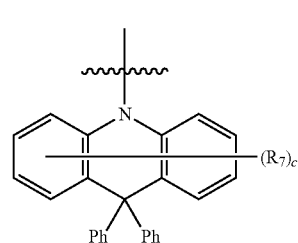

[Formula 2-4]

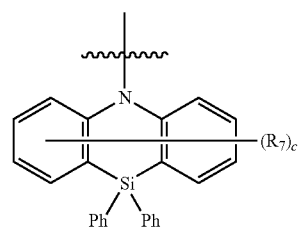

[Formula 2-5]

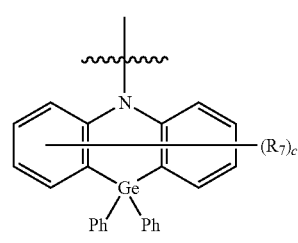

[Formula 2-6]

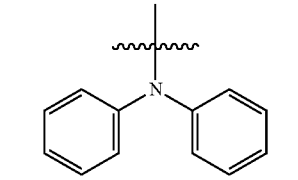

[Formula 2-7]

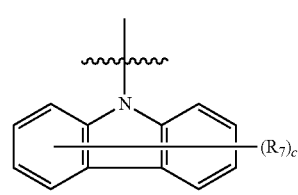

-continued

[Formula 2-8]

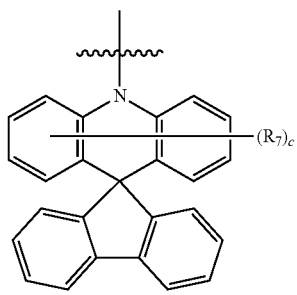

[Formula 2-9]

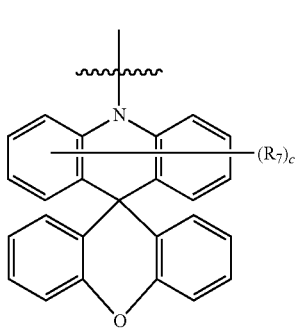

[Formula 2-10]

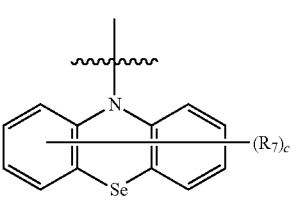

[Formula 2-11]

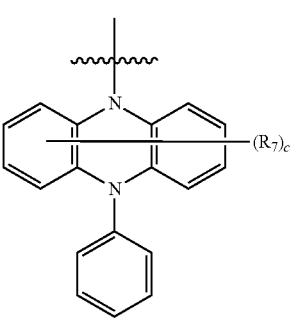

[Formula 2-12]

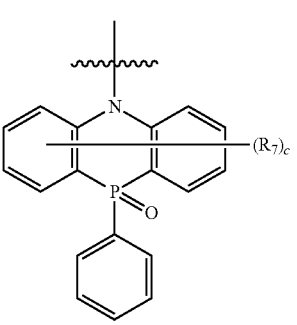

-continued

[Formula 2-13]

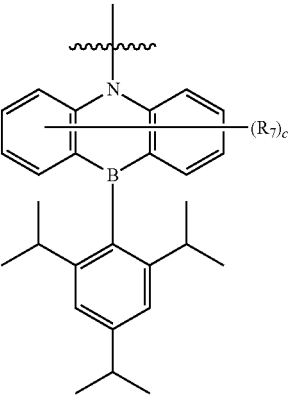

[Formula 2-14]

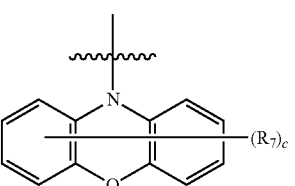

In Formulae 2-1 to 2-14, $R_7$ and "c" are the same as defined above.

The polycyclic compound represented by Formula 1 may be represented by the following Formula 3:

[Formula 3]

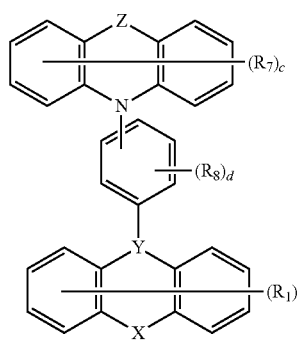

In Formula 3, $R_1$, $R_7$, "a", "c", X, Y and Z are the same as defined above.

$R_8$ may be a hydrogen atom, a deuterium atom, a halogen atom, a substituted or unsubstituted alkyl group having 1 to 20 carbon atoms, a substituted or unsubstituted aryl group having 6 to 30 carbon atoms for forming a ring, or a substituted or unsubstituted heteroaryl group having 2 to 30 carbon atoms for forming a ring. $R_8$ may be a hydrogen atom or a substituted or unsubstituted isopropyl group.

"d" is an integer between 0 and 4, inclusive. If "d" is 0, the polycyclic compound represented by Formula 3 may not be substituted with $R_8$. If "d" is an integer of 2 or more, a plurality of $R_8$ groups may be the same or different.

The polycyclic compound represented by Formula 3 may be represented by one of the following Formulae 3-1 to 3-3:

[Formula 3-1]

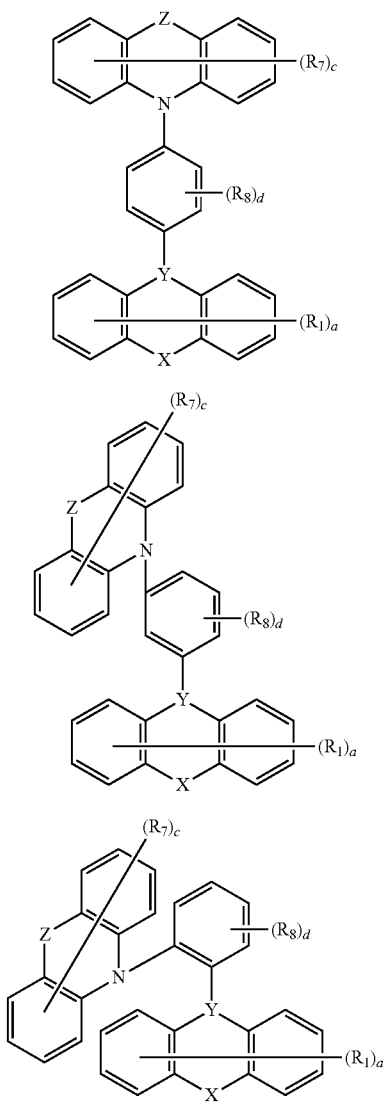

[Formula 3-2]

[Formula 3-3]

In Formulae 3-1 to 3-3, $R_1$, $R_7$, $R_8$, "a", "c", "d", X, Y and Z are the same as defined above.

The polycyclic compound represented by Formula 1 may be represented by one of the following Formulae 4-1 to 4-4:

[Formula 4-1]

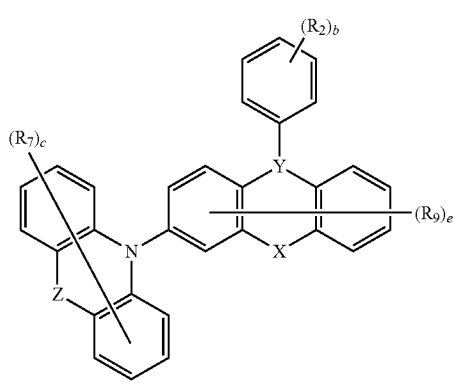

[Formula 4-2]

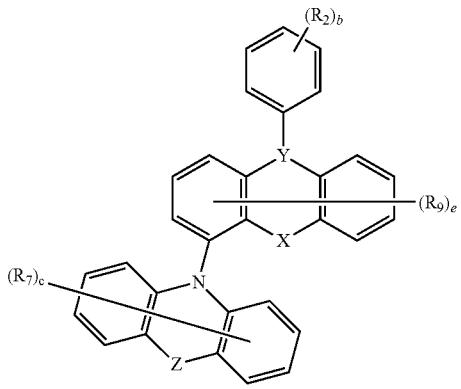

[Formula 4-3]

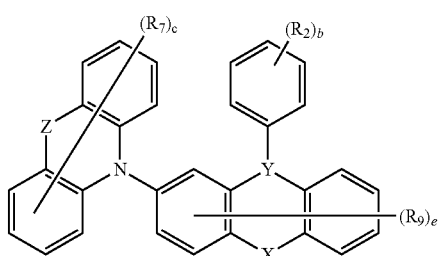

[Formula 4-4]

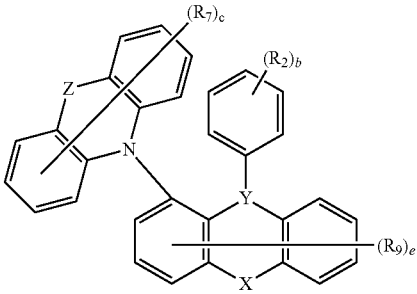

In Formulae 4-1 to 4-4, $R_7$, "b", "c", X, Y and Z are the same as defined above, $R_2$ and $R_9$ are each independently a hydrogen atom, a deuterium atom, a halogen atom, a substituted or unsubstituted alkyl group having 1 to 20 carbon atoms, a substituted or unsubstituted aryl group having 6 to 30 carbon atoms for forming a ring, or a substituted or unsubstituted heteroaryl group having 2 to 30 carbon atoms for forming a ring. $R_2$ may be a hydrogen atom, a substituted or unsubstituted isopropyl group, a substituted or unsubstituted phenyl group, or a substituted or unsubstituted silyl group. $R_2$ may be combined with an adjacent group to form a hydrocarbon ring or a heterocycle. $R_9$ may be a hydrogen atom.

"e" is an integer between 0 and 7, inclusive. If "e" is 0, the polycyclic compound represented by Formula 4 may not be substituted with $R_9$. If "e" is an integer of 2 or more, a plurality of $R_9$ groups may be the same or different.

The polycyclic compound represented by Formula 3 according to an embodiment of the inventive concept may correspond to Formula 1 where $R_2$ is represented by Formula 2. The polycyclic compound represented by Formula 4 according to an embodiment of the inventive concept may correspond to Formula 1 where $R_1$ is represented by Formula 2.

In Formula 1, $Ar_1$ may be a substituted or unsubstituted aryl group having 6 to 30, or 6 to 15 carbon atoms for forming a ring. $Ar_1$ may be a substituted or unsubstituted phenyl group or a substituted or unsubstituted biphenyl group, without limitation. $Ar_1$ may be a phenyl group or a biphenyl group, or may be unsubstituted or substituted with one or more $R_2$ groups.

The polycyclic compound according to an embodiment of the inventive concept may be represented by the following Formula 5:

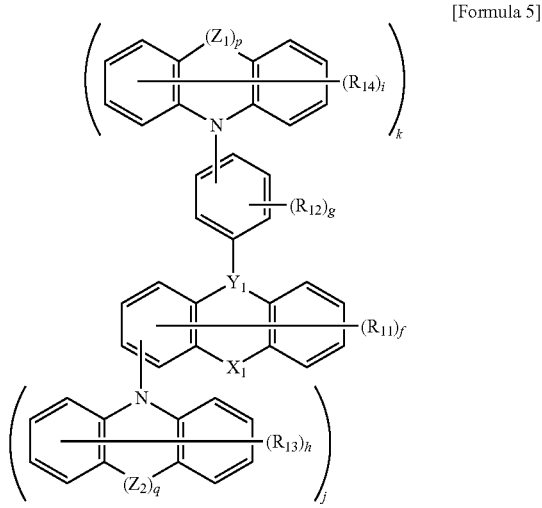

[Formula 5]

In Formula 5, $Y_1$ is B, P=O, or P=S. If $Y_1$ is P=O, $Ar_1$ and an oxygen atom may be connected with P. If $Y_1$ is P=S, $Ar_1$ and a sulfur atom may be connected with P.

$X_1$ is $SiR_{15}R_{16}$, or $GeR_{17}R_{18}$.

$R_{11}$ to $R_{18}$ are each independently a hydrogen atom, a deuterium atom, a halogen atom, a substituted or unsubstituted silyl group, a substituted or unsubstituted boryl group, a substituted or unsubstituted aralkyl group having 6 to 30 carbon atoms, a substituted or unsubstituted aryloxy group having 6 to 30 carbon atoms, a substituted or unsubstituted arylthio group having 6 to 30 carbon atoms, a substituted or unsubstituted phosphine group, a substituted or unsubstituted phosphine oxide group, a substituted or unsubstituted phosphine sulfide group, a substituted or unsubstituted alkyl group having 1 to 20 carbon atoms, a substituted or unsubstituted aryl group having 6 to 30 carbon atoms for forming a ring, or a substituted or unsubstituted heteroaryl group having 2 to 30 carbon atoms for forming a ring. $R_{11}$ to $R_{18}$ may be combined with an adjacent group to form a hydrocarbon ring or a heterocycle.

$Z_1$ and $Z_2$ are each independently a direct linkage, O, S, Se, $NAr_{21}$, $POAr_{22}$, $CAr_{24}Ar_{25}$, $SiAr_{26}Ar_{27}$, $GeAr_{28}Ar_{29}$, or $BAr_{30}$. $Z_1$ and $Z_2$ are each independently a direct linkage, O, S, or $CAr_{24}Ar_{25}$.

$Ar_{21}$ to $Ar_{30}$ are each independently a substituted or unsubstituted alkyl group having 1 to 20 carbon atoms, a substituted or unsubstituted aryl group having 6 to 30 carbon atoms for forming a ring, or a substituted or unsubstituted heteroaryl group having 2 to 30 carbon atoms for forming a ring. $Ar_{21}$ to $Ar_{30}$ may be each independently combined with an adjacent group to form a hydrocarbon ring or a heterocycle.

"p" and "q" are each independently 0 or 1. A case where "p" is 0 corresponds to a substituted or unsubstituted aryl amine group. A case where "q" is 0 corresponds to a substituted or unsubstituted aryl amine group.

"f" is an integer between 0 and 7, inclusive. "g" is an integer between 0 and 4, inclusive. Each of "h" and "i" is independently an integer between 0 and 8, inclusive. If "f" is 0, the polycyclic compound represented by Formula 5 may not be substituted with $R_{11}$. If "f" is an integer of 2 or more, a plurality of $R_{11}$ groups may be the same or different. If "g" is 0, the polycyclic compound represented by Formula 5 may not be substituted with $R_{12}$. If "g" is an integer of 2 or more, a plurality of $R_{12}$ groups may be the same or different. If "h" is 0, the polycyclic compound represented by Formula 5 may not be substituted with $R_{13}$. If "h" is an integer of 2 or more, a plurality of $R_{13}$ groups may be the same or different. If "i" is 0, the polycyclic compound represented by Formula 5 may not be substituted with $R_{14}$. If "i" is an integer of 2 or more, a plurality of $R_{14}$ groups may be the same or different.

Each of "j" and "k" is independently an integer of 0 or 1. j+k≠0. That is, at least one of "j" or "k" is 1. The polycyclic compound represented by Formula 5 is substituted with a nitrogen-containing polycyclic structure.

The polycyclic compound represented by Formula 1 or the polycyclic compound represented by Formula 5 may be one selected from the compounds represented in Compound Group 1. However, an embodiment of the inventive concept is not limited thereto.

[Compound Group 1]

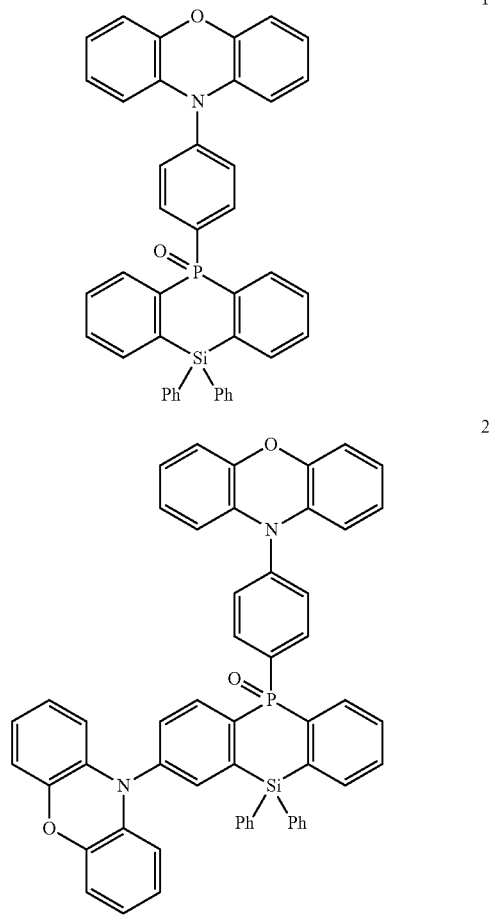

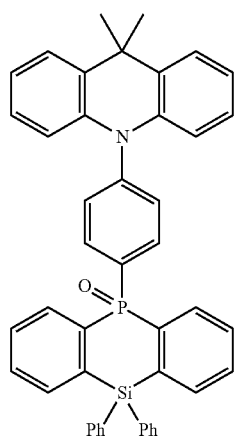
3
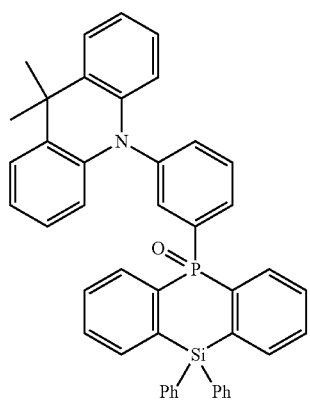
4
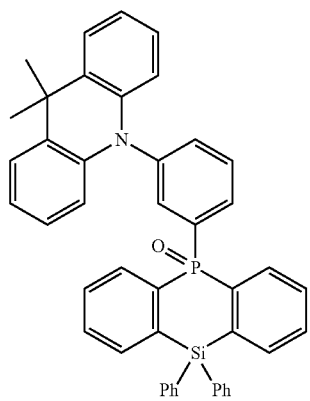
5
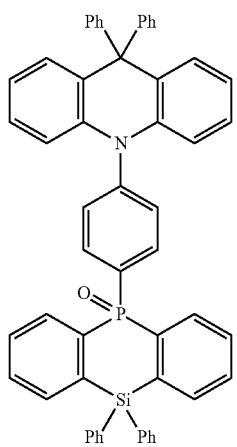
6
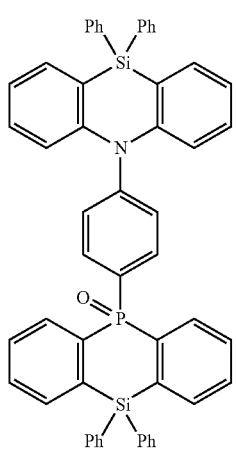
7
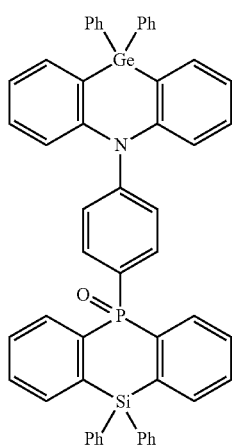
8

9
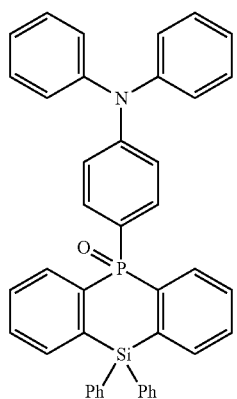
10
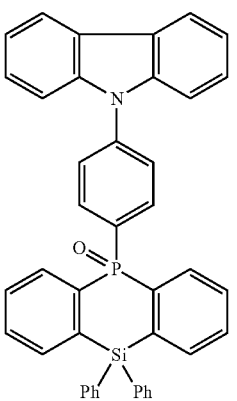
11
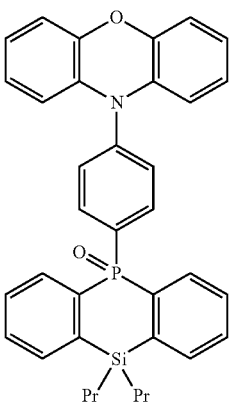
12
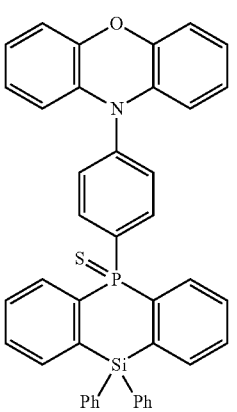
13
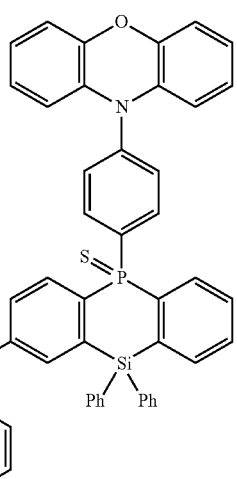
14
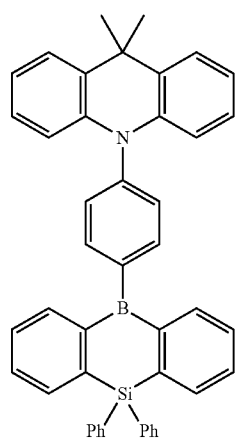
15
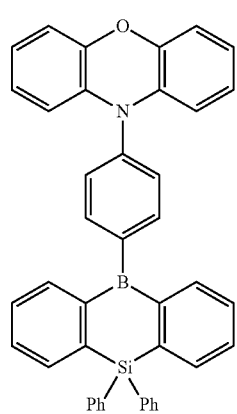

-continued
16
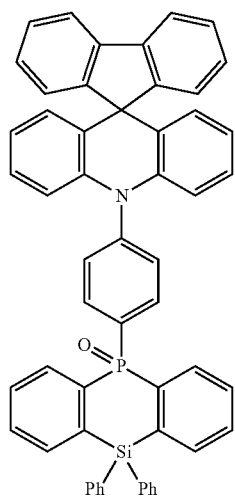
17
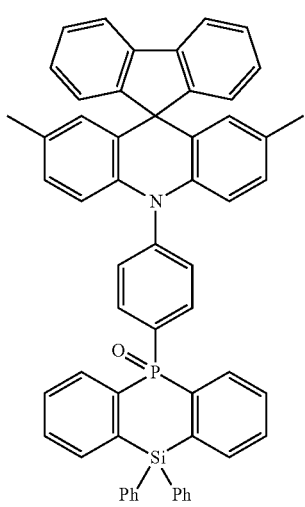
18
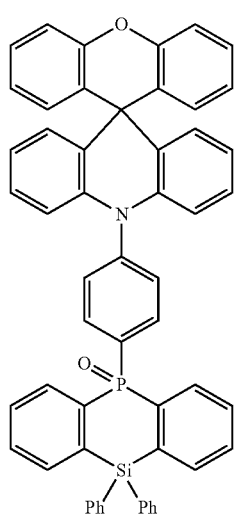
-continued
19
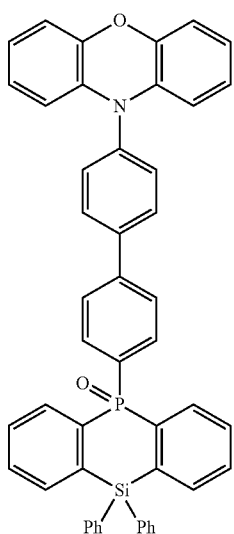
20
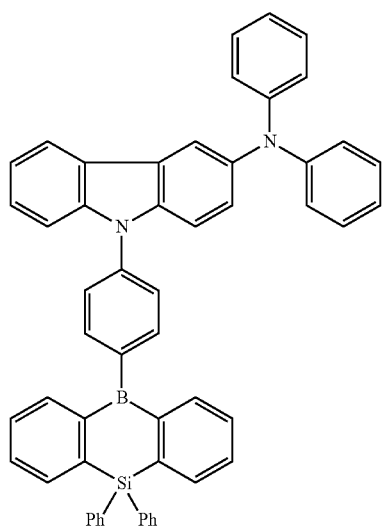
21
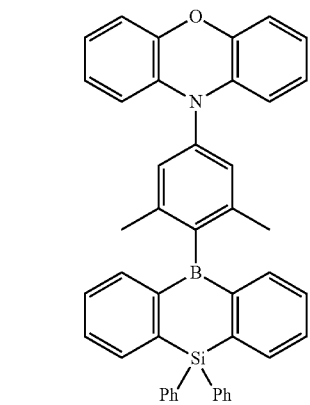

22
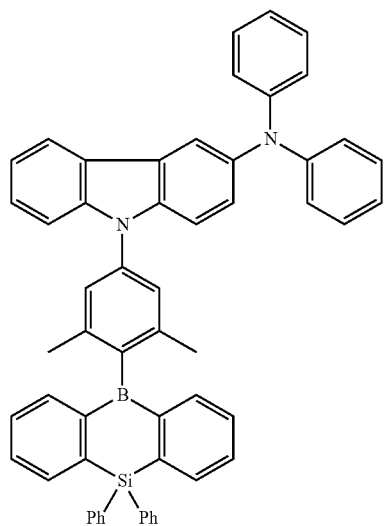
23
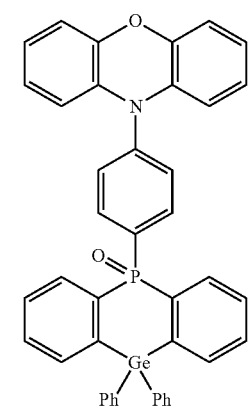
24
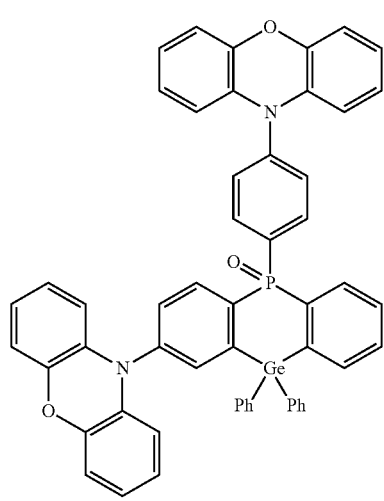
25
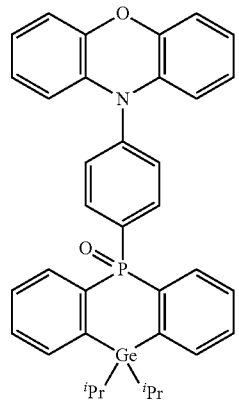
26
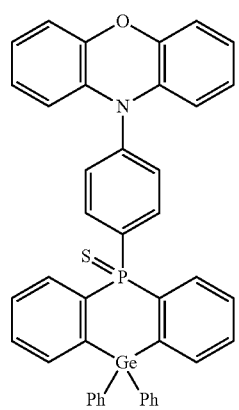
27
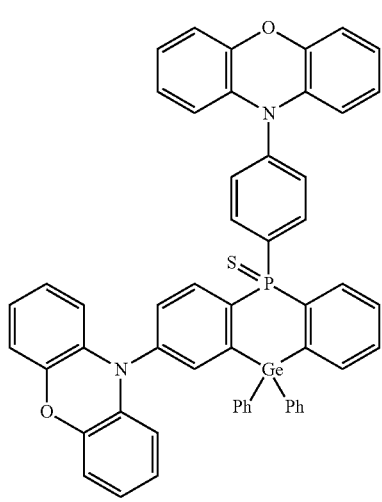

28
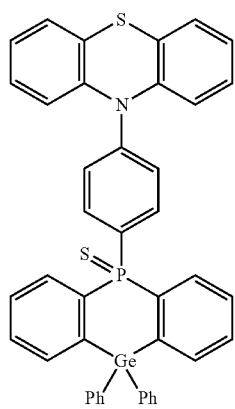
29
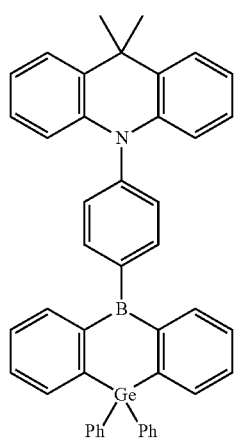
30
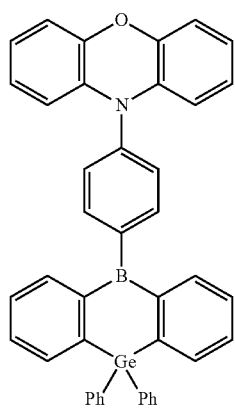
31
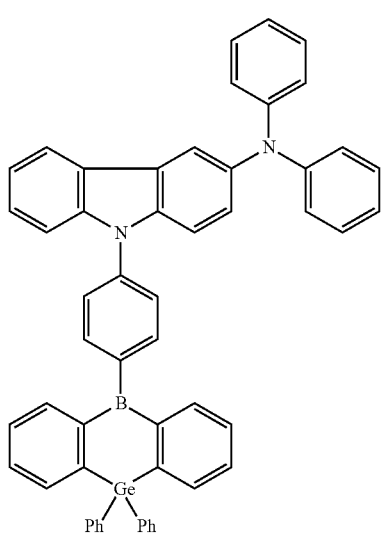
32
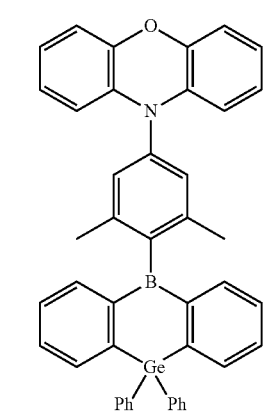
33
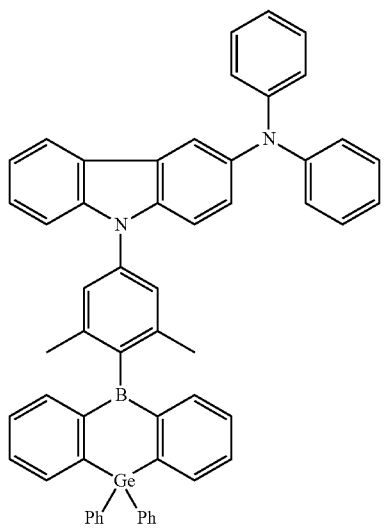

34
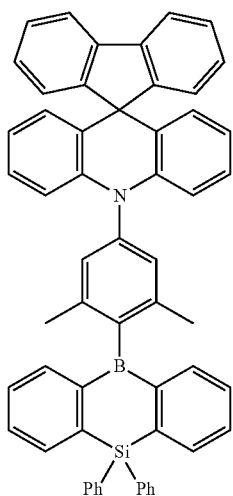
35
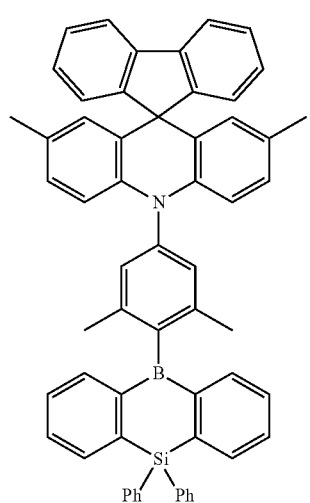
36
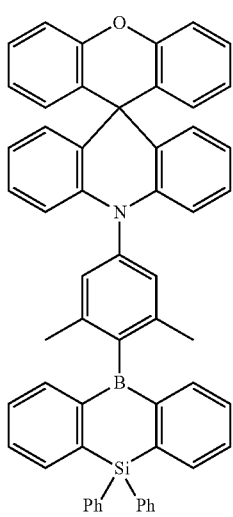
37
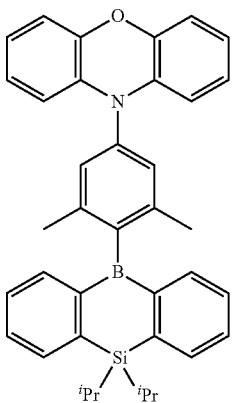
38
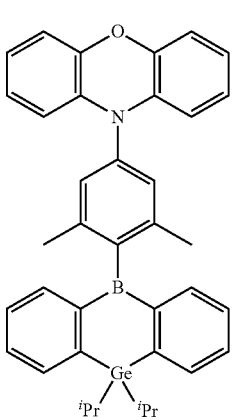
39
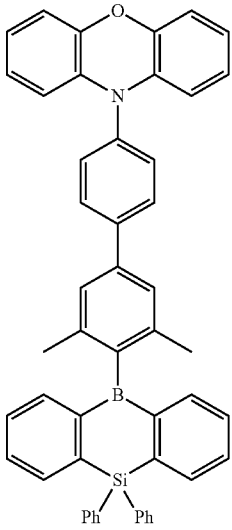

33
-continued
40
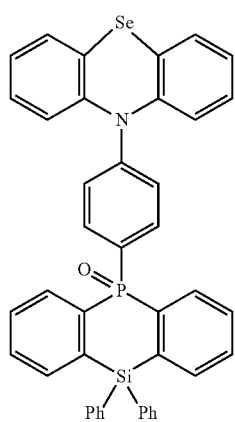
41
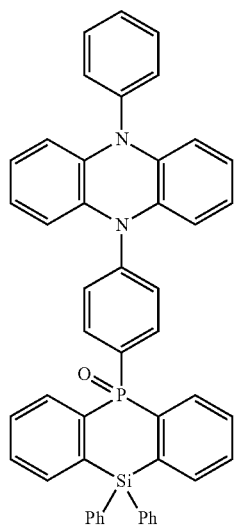
42
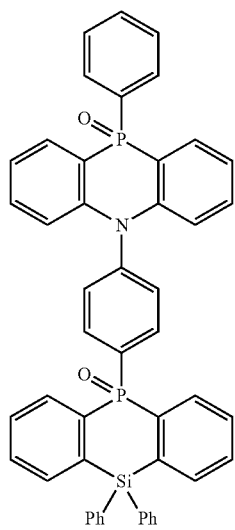
34
-continued
43
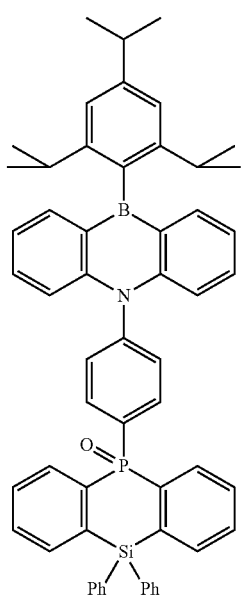
44
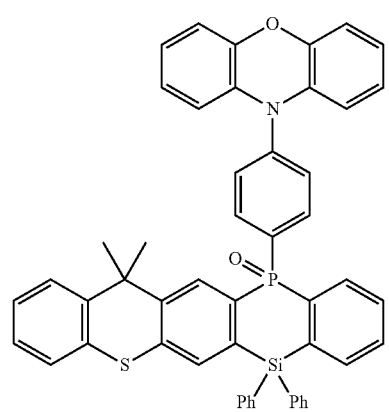
45
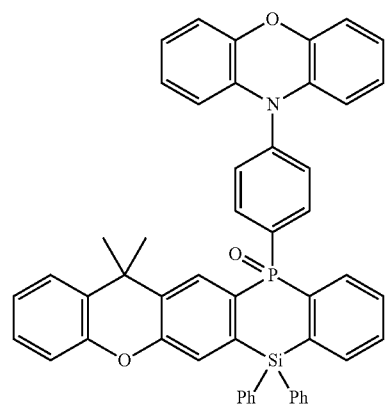

46 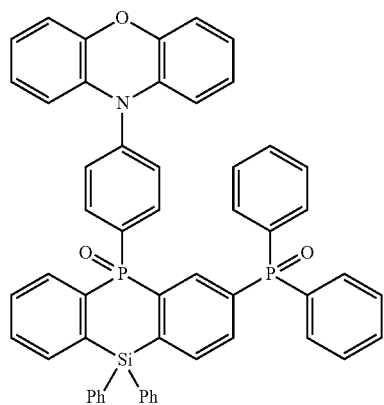
47 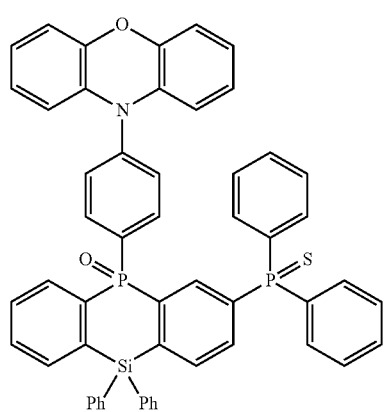
48 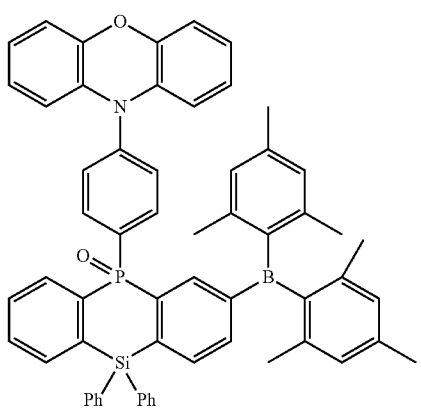
[Compound Group 2]
49 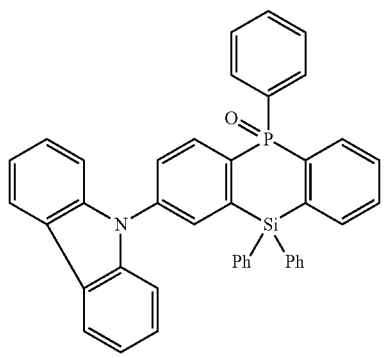
50 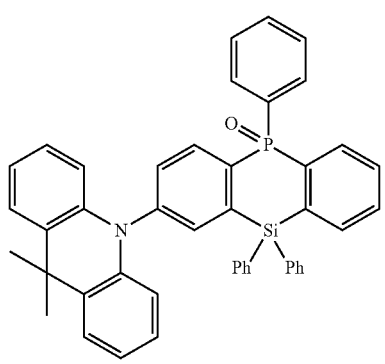
51 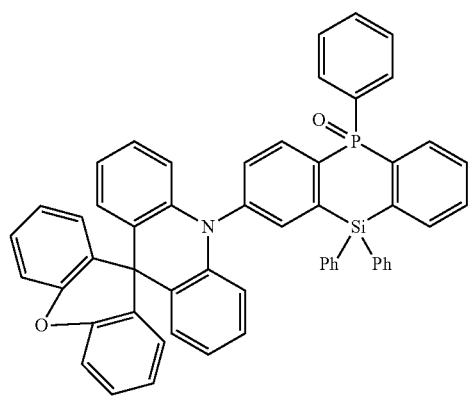
52 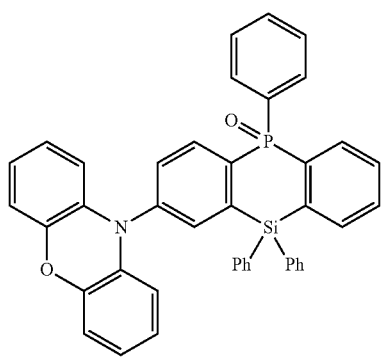
The polycyclic compound represented by Formula 1 or the polycyclic compound represented by Formula 5 may be one selected from the compounds represented in Compound Group 2. However, an embodiment of the inventive concept is not limited thereto.

53
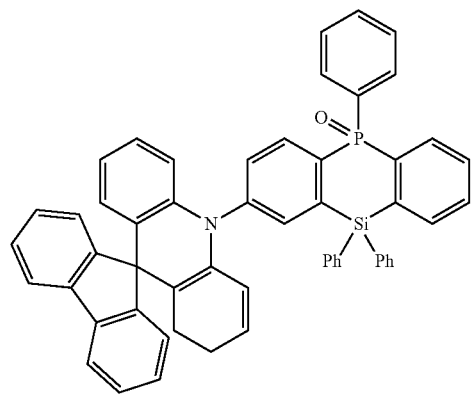
54
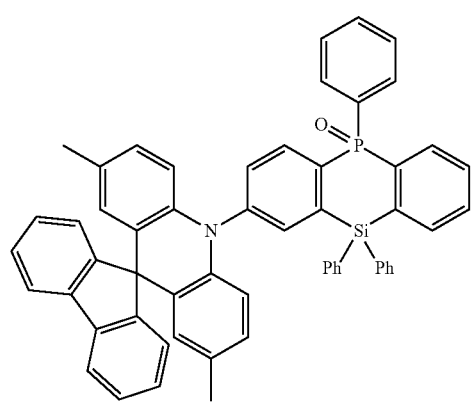
55
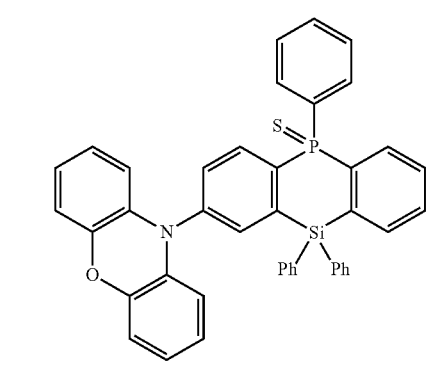
56
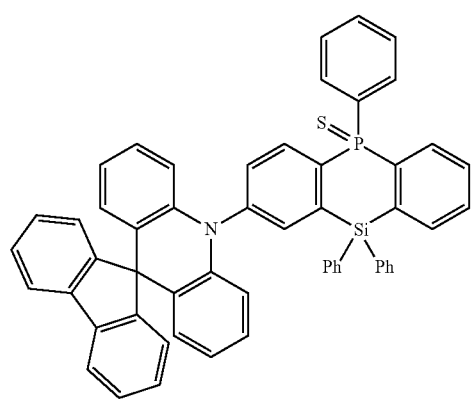
57
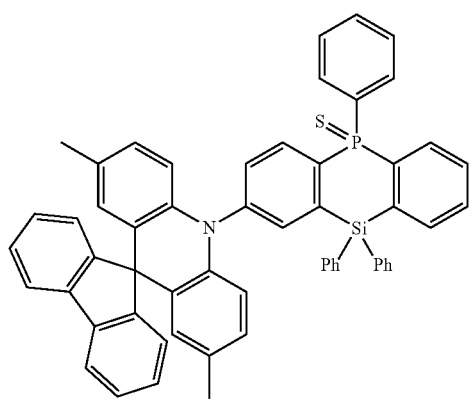
58
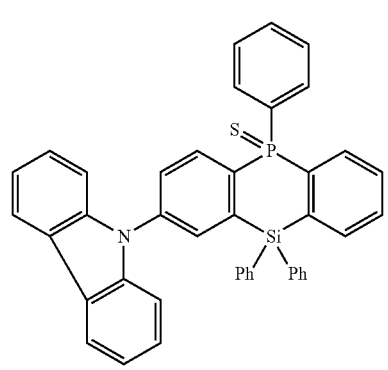
59
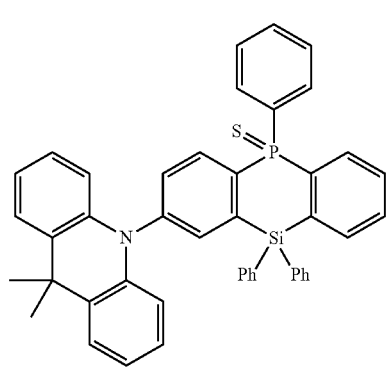
60
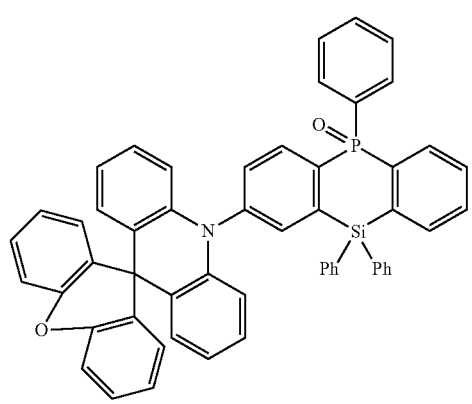

-continued
61
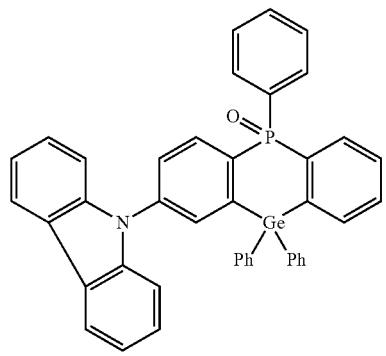
62
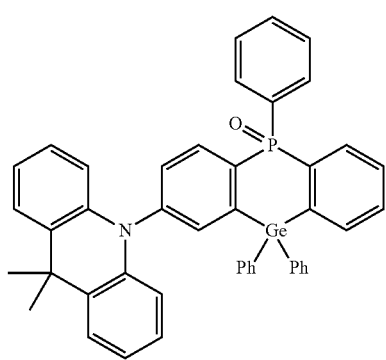
63
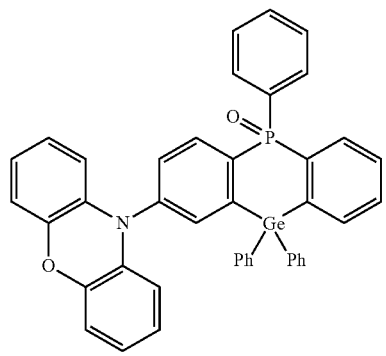
64
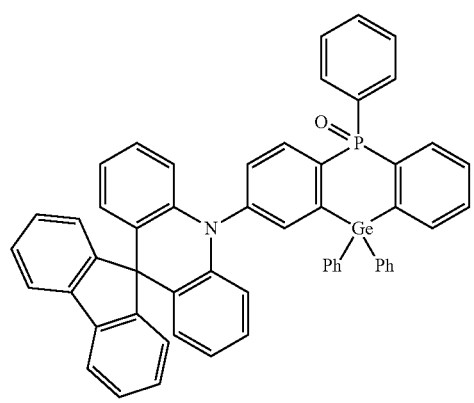
-continued
65
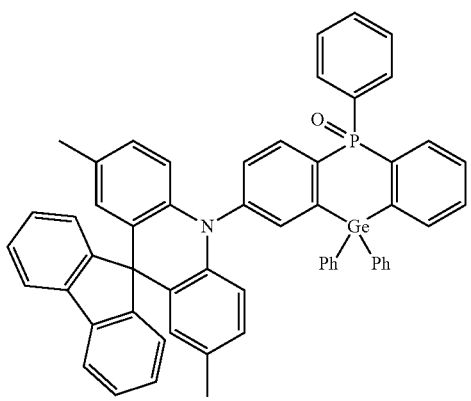
66
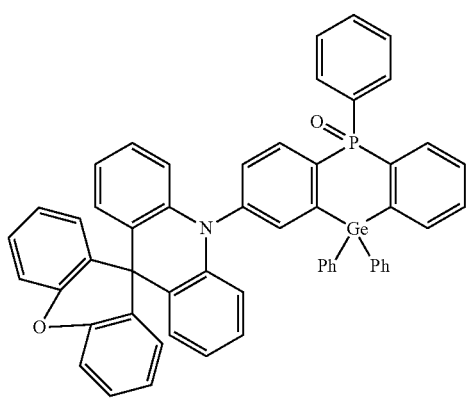
67
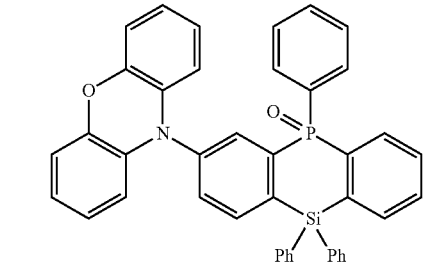
68
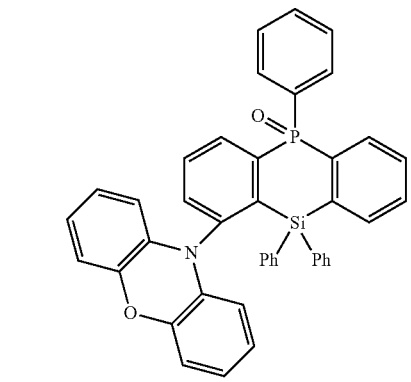

-continued
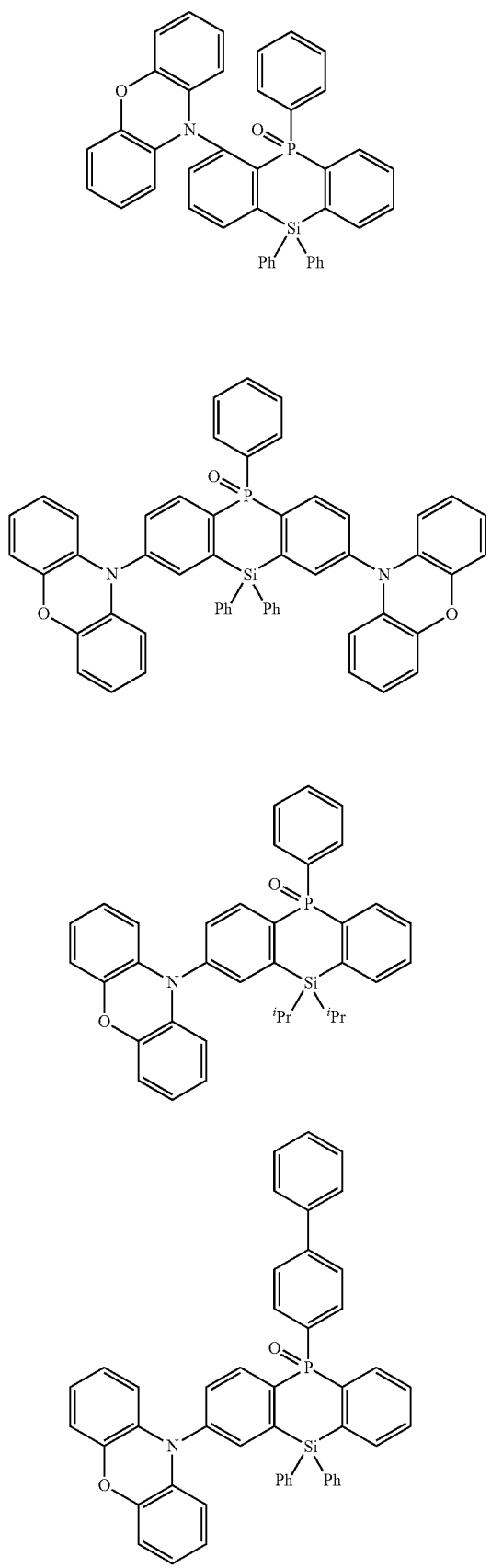
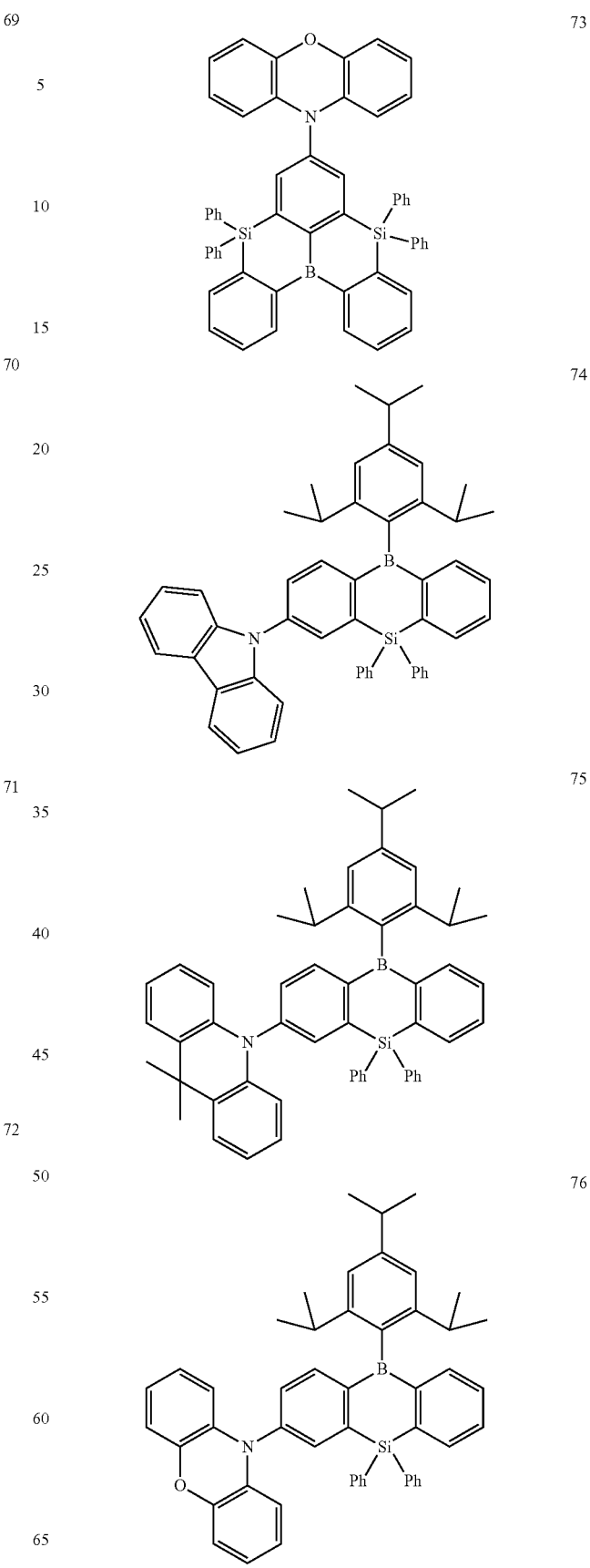

77
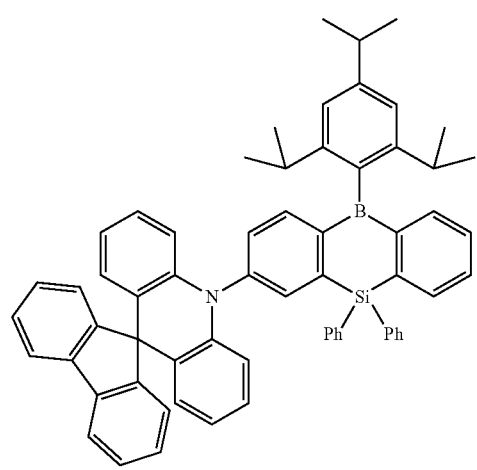
78
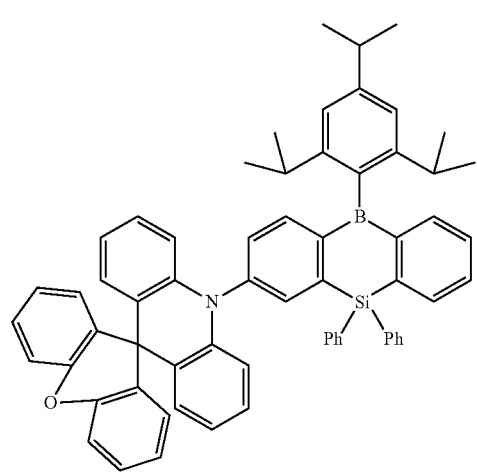
79
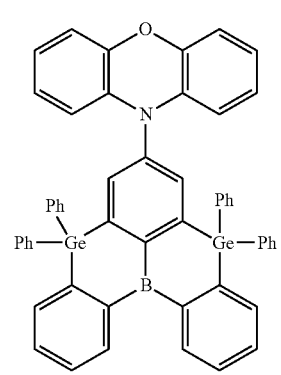
80
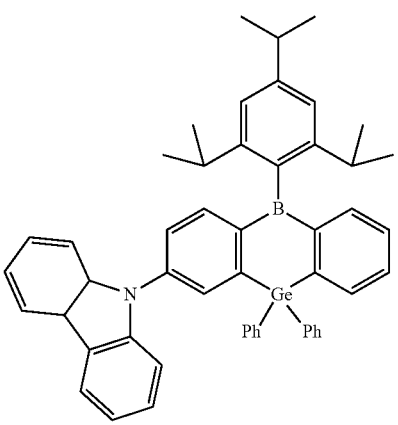
81
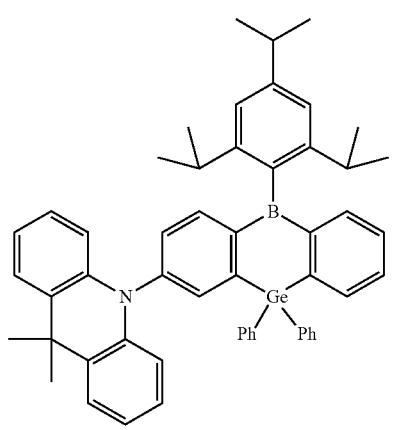
82
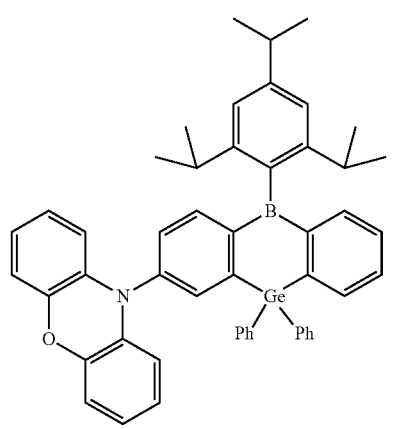

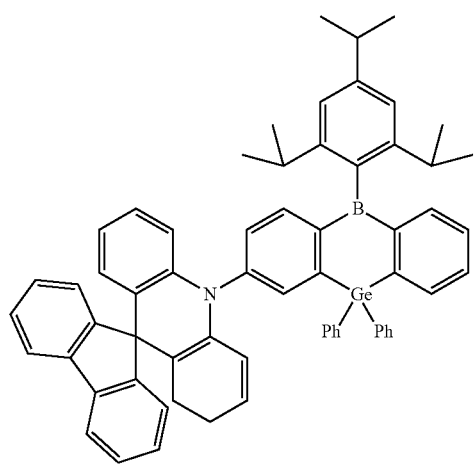
83
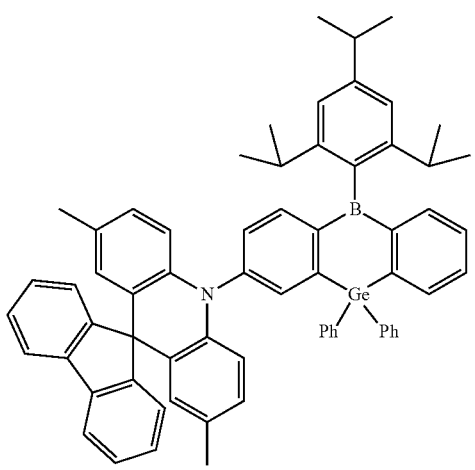
86
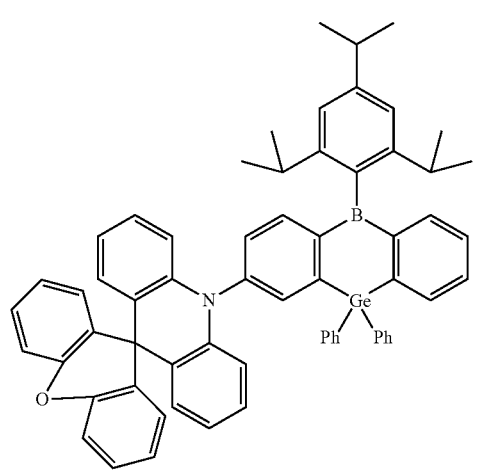
84
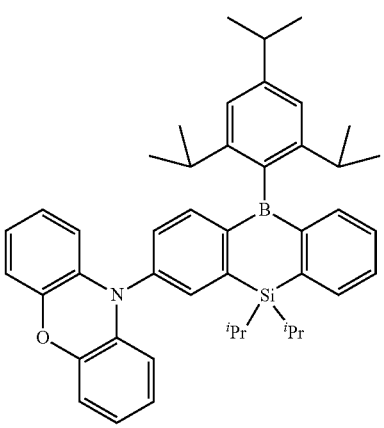
87
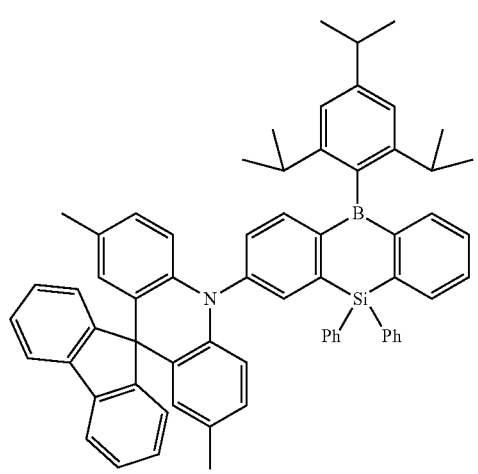
85
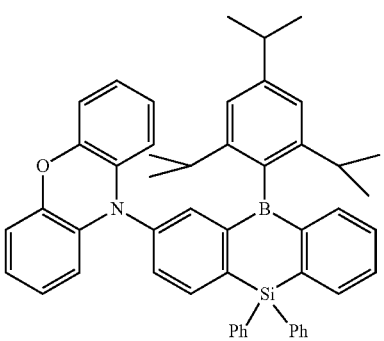
88

89
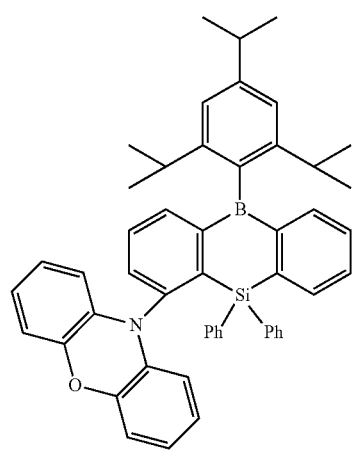
90
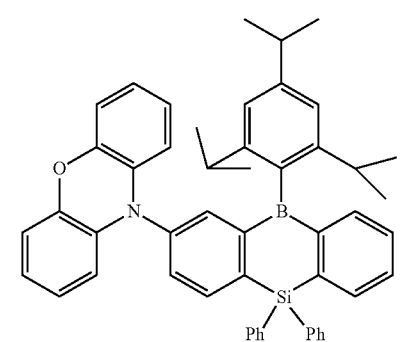
91
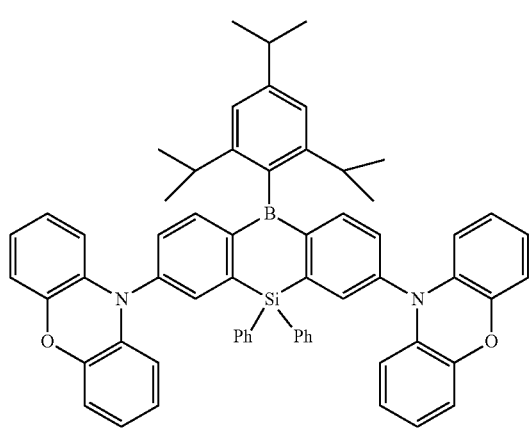
92
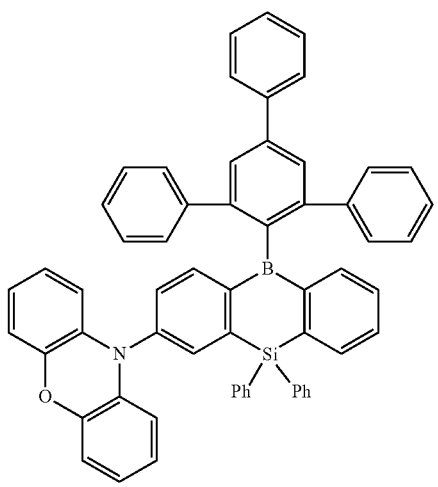
93
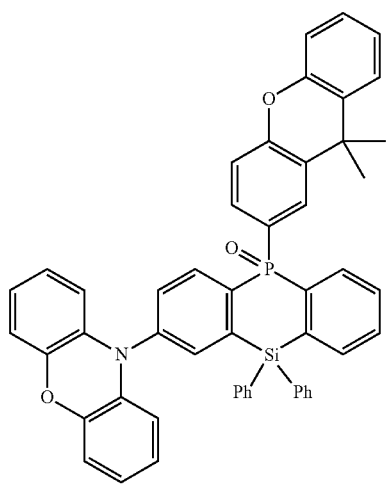
94
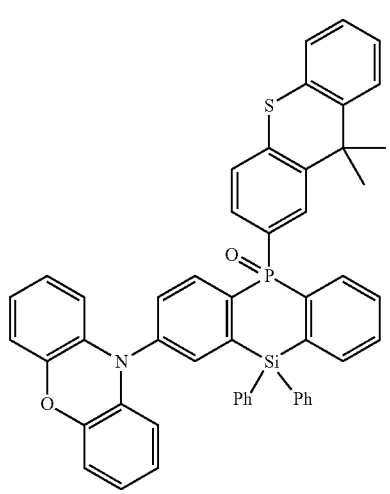

95
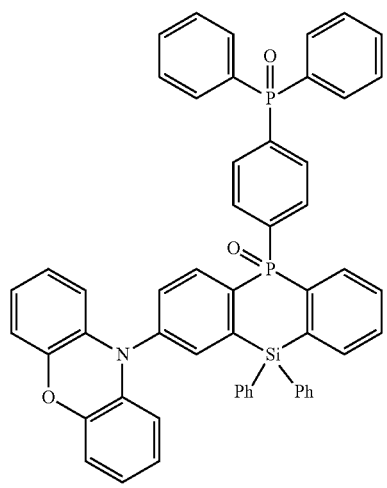
96
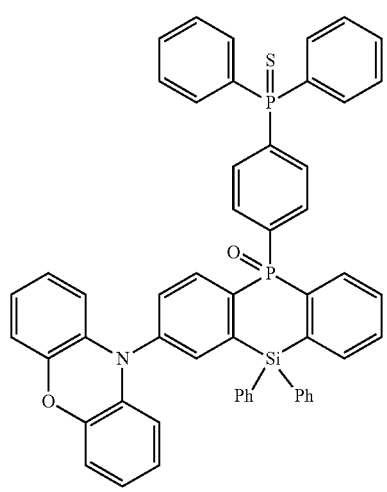
97
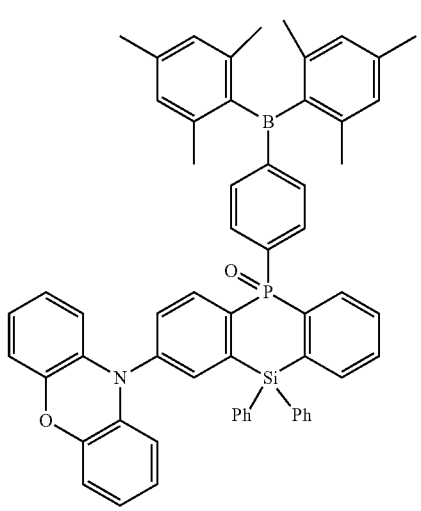
98
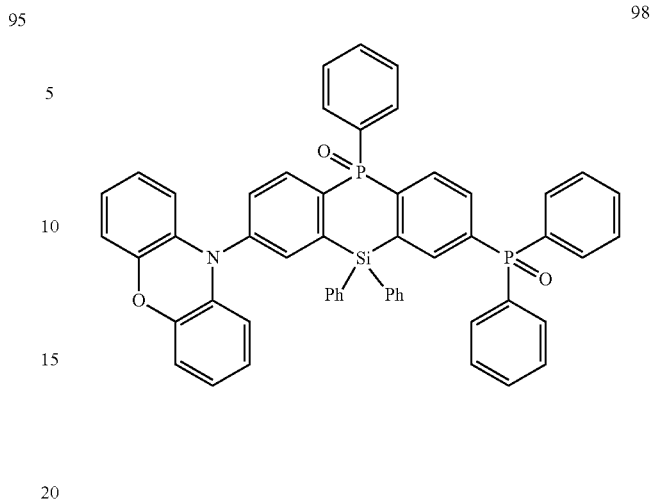
99
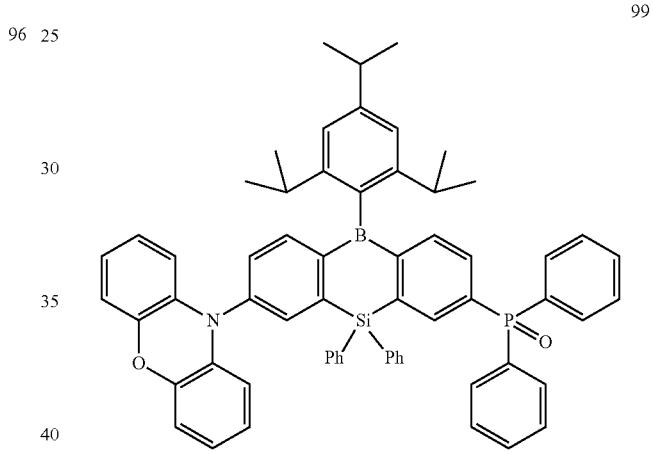
100
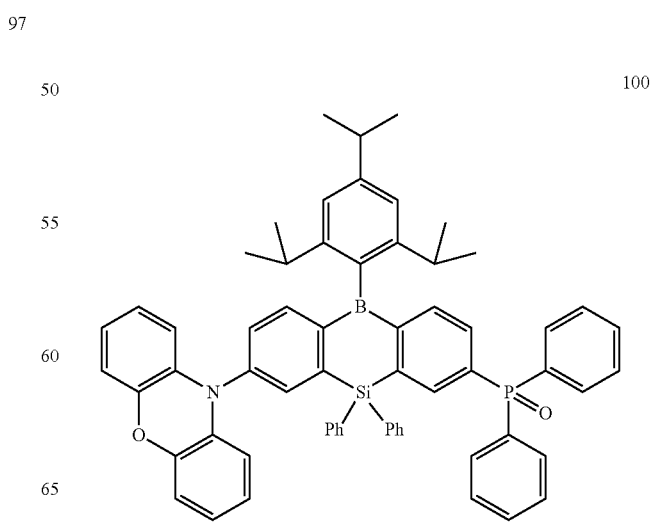

-continued

101

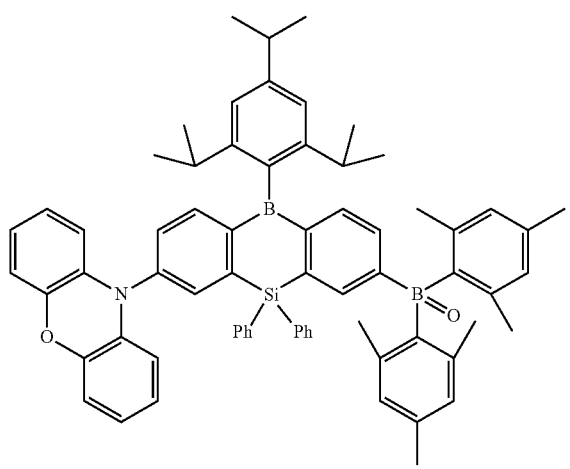

Referring to Formula 1, the polycyclic compound according to an embodiment of the inventive concept includes an electron acceptor and an electron donor. The polycyclic compound according to an embodiment of the inventive concept may include an electron acceptor which is a polycycle containing Si or Ge and an electron donor which is a polycycle containing nitrogen (or an aryl amine group). That is, the core structure of Formula 1 may be an electron acceptor, and a substituent structure represented by Formula 2 may be an electron donor.

The polycyclic compound represented by Formula 1 has a condensed structure obtained by crosslinking a polycycle which is an electron acceptor via Si or Ge. Due to such a structure, the difference of the lowest triplet energy level value and the lowest singlet energy level value of the polycyclic compound represented by Formula 1 decreases, and intersystem crossing of singlet-triplet may be promoted. Accordingly, the polycyclic compound according to an embodiment of the inventive concept may be used as the dopant material of an emission layer of an organic electroluminescence device and may efficiently emit thermally activated delayed fluorescence (TADF) without loss of the energy of triplet excitons. Accordingly, when the polycyclic compound represented by Formula 1 is applied to an organic electroluminescence device, high emission efficiency and long life may be secured.

Referring to FIG. 1 to FIG. 3 again, an organic electroluminescence device according to an embodiment of the inventive concept will be explained. An emission layer EML includes the polycyclic compound according to an embodiment of the inventive concept. For example, the emission layer includes a polycyclic compound represented by Formula 1. In another embodiment, the emission layer EML includes the polycyclic compound represented by Formula 5.

Hereinafter, different features from the above-described polycyclic compound according to an embodiment of the inventive concept will be explained. In particular, explanation of new parts will follow the above explanation on the polycyclic compound according to an embodiment of the inventive concept.

A first electrode EL1 has conductivity. The first electrode EL1 may be a pixel electrode or an anode. The first electrode EL1 may be a transmissive electrode, a transflective electrode, or a reflective electrode. If the first electrode EL1 is the transmissive electrode, the first electrode EL1 may be formed using a transparent metal oxide such as indium tin oxide (ITO), indium zinc oxide (IZO), zinc oxide (ZnO), and indium tin zinc oxide (ITZO). If the first electrode EL1 is the transflective electrode or the reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). Also, the first electrode EL1 may include a plurality of layers including the reflective layer or transflective layer formed using the above materials, or a transparent layer formed using ITO, IZO, ZnO, or ITZO.

A hole transport region HTR is provided on the first electrode EL1. The hole transport region HTR may include at least one of a hole injection layer HIL, a hole transport layer HTL, a hole buffer layer, or an electron blocking layer.

The hole transport region HTR may have a single layer formed using a single material, a single layer formed using a plurality of different materials, or a multilayer structure including a plurality of layers formed using a plurality of different materials.

For example, as shown in FIG. 2, the hole transport region HTR may have a laminated structure of a hole injection layer HIL and a hole transport layer HTL, and may have a single layer structure formed using a hole injection material and a hole transport material. Alternatively, the hole transport region HTR may have a single layer structure formed using a plurality of different materials, or a structure laminated from the first electrode EL1 of hole injection layer HIL/hole transport layer HTL, hole injection layer HIL/hole transport layer HTL/hole buffer layer, hole injection layer HIL/hole buffer layer, hole transport layer HTL/hole buffer layer, or hole injection layer HIL/hole transport layer HTL/electron blocking layer, without limitation.

As shown in FIG. 3, the hole transport region HTR may have a plurality of hole transport layers. The hole transport region HTR may include a first hole injection layer HTL1 and a second hole transport layer HTL2 disposed on the first hole transport layer HTL1. The second hole transport layer HTL2 may be a hole transport layer which is adjacent to the emission layer EML among the plurality of the hole transport layers.

The hole transport region HTR may be formed using one or more of various methods such as vacuum deposition method, spin coating method, cast method, Langmuir-Blodgett (LB) method, inkjet printing method, laser printing method, and laser induced thermal imaging (LITI) method.

The hole injection layer HIL may include, for example, a phthalocyanine compound such as copper phthalocyanine; N,N'-diphenyl-N,N'-bis-[4-(phenyl-m-tolyl-amino)-phenyl]-biphenyl-4,4'-diamine (DNTPD), 4,4',4"-tris(3-methylphenylphenylamino)triphenylamine (m-MTDATA), 4,4',4"-tris(N,N-diphenylamino)triphenylamine (TDATA), 4,4',4"-tris {N-(1-naphthyl)-N-phenylamino}-triphenylamine (1-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(naphthyl)-N,N'-diphenyl-(1,1'-biphenyl)-4,4'-diamine (NPD), triphenylamine-containing polyetherketone (TPAPEK), 4-isopropyl-4'-methyldiphenyliodonium tetrakis(pentafluorophenyl)borate, 1,4,5,8,9,11-hexaazatriphenylenehexacarbonitrile (HAT-CN), etc.

The hole transport layer HTL may include, for example, carbazole derivatives such as N-phenylcarbazole, polyvinylcarbazole, and 1,3-bis(N-carbazolyl)benzene (mCP), fluorene-based derivatives, N,N'-bis(3-methylphenyl)-N,N'-diphenyl-[1,1-biphenyl]-4,4'-diamine (TPD), triphenylamine-based derivatives such as 4,4',4"-tris(N-carbazolyl) triphenylamine (TCTA), N,N'-di(1-naphthyl)-N,N'-diphenyl-(1,1'-biphenyl)-4,4'-diamine (NPD), 4,4'-cyclohexylidenebis[N,N-bis(4-methylphenyl)benzenamine] (TAPC), 4,4'-bis[N,N'-(3-tolyl)amino]-3,3'-dimethylbiphenyl (HMTPD), etc.

The thickness of the hole transport region HTR may be from about 150 Å to about 12,000 Å, for example, from about 150 Å to about 1,500 Å. If the hole transport region HTR includes both hole injection layer HIL and hole transport layer HTL, the thickness of the hole injection layer HIL may be from about 100 Å to about 10,000 Å, for example, from about 100 Å to about 1,000 Å, and the thickness of the hole transport layer HTL may be from about 50 Å to about 1,000 Å. If the thicknesses of the hole transport region HTR, the hole injection layer HIL, and the hole transport layer HTL satisfy the above-described ranges, satisfactory hole transport properties may be obtained without substantial increase of a driving voltage.

The hole transport region HTR may further include a charge generating material in addition to the above-described materials to increase conductivity. The charge generating material may be dispersed uniformly or non-uniformly in the hole transport region HTR. The charge generating material may be, for example, a p-dopant. The p-dopant may be one of quinone derivatives, metal oxides, or cyano group-containing compounds, without limitation. For example, non-limiting examples of the p-dopant may include quinone derivatives such as tetracyanoquinodimethane (TCNQ) and 2,3,5,6-tetrafluoro-tetracyanoquinodimethane (F4-TCNQ), metal oxides such as tungsten oxide, and molybdenum oxide, without limitation.

As described above, the hole transport region HTR may further include at least one of a hole buffer layer or an electron blocking layer EBL in addition to the hole injection layer HIL and the hole transport layer HTL. The hole buffer layer may compensate a resonance distance according to the wavelength of light emitted from the emission layer EML and increase light emission efficiency. Materials included in the hole transport region HTR may be used as materials included in the hole buffer layer. The electron blocking layer is a layer preventing electron injection from the electron transport region ETR to the hole transport region HTR.

An emission layer EML is provided on the hole transport region HTR. The emission layer EML is disposed on the hole transport layer HTL and may make contact with the hole transport layer HTL. The emission layer EML may have a thickness of, for example, from about 100 Å to about 600 Å. The emission layer EML may have a single layer formed using a single material, a single layer formed using a plurality of different materials, or a multilayer structure having a plurality of layers formed using a plurality of different materials.

The emission layer EML may include one, two or more kinds of the polycyclic compound according to an embodiment of the inventive concept.

The emission layer EML may emit one of red light, green light, blue light, white light, yellow light, or cyan light. The emission layer EML may include a fluorescence material or a phosphorescence material. The polycyclic compound according to an embodiment of the inventive concept may be a material emitting blue light. The polycyclic compound according to an embodiment of the inventive concept is a material emitting light of about 510 nm or less, and the maximum light-emitting wavelength of the emission layer EML may be about 510 nm or less. The emission layer EML may be a blue emission layer. The emission layer EML may emit light of which maximum light-emitting wavelength is about 510 nm or less. The emission layer EML may, for example, emit blue light in a wavelength region of about 430 nm to about 480 nm. The emission layer EML may emit deep blue light in a wavelength region of about 430 nm to about 450 nm.

The emission layer EML may include a thermally activated delayed fluorescence (TADF) material. The polycyclic compound according to an embodiment of the inventive concept may be a material for thermally activated delayed fluorescence (TADF). The polycyclic compound according to an embodiment of the inventive concept may have an energy difference ($\Delta E_{ST}$) between the lowest singlet energy level ($S_1$) and the lowest triplet energy level ($T_1$) of about 0.2 eV or less.

In addition, the emission layer EML may include a host and a dopant.

The host material of the emission layer EML may be selected from anthracene derivatives, fluoranthene derivatives, pyrene derivatives, arylacetylene derivatives, fluorene derivatives, perylene derivatives, chrysene derivatives, phenanthrene derivatives, etc. Preferably, pyrene derivatives, perylene derivatives, chrysene derivatives, phenanthrene derivatives, and anthracene derivatives may be used. For example, as the host material of the emission layer EML, an anthracene derivatives represented by Formula 6 below may be used.

[Formula 6]

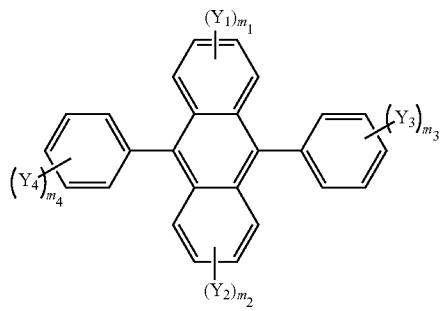

In Formula 6, each of $Y_1$, $Y_2$, $Y_3$, and $Y_4$ is independently a hydrogen atom, a deuterium atom, a halogen atom, a substituted or unsubstituted silyl group, a substituted or unsubstituted alkyl group having 1 to 15 carbon atoms, a substituted or unsubstituted aryl group having 6 to 30 carbon atoms for forming a ring, or a substituted or unsubstituted heteroaryl group having 2 to 30 carbon atoms for forming a ring; each of $m_1$ and $m_2$ is independently an integer between 0 and 4, inclusive; and each of $m_3$ and $m_4$ is independently an integer between 0 and 5, inclusive. In Formula 6, each of $Y_3$ and $Y_4$ may be independently combined with an adjacent group to form a ring.

The compound represented by Formula 6 may include, for example, the compounds represented by the structures below. However, the compounds below are not an exhaustive list of possible compounds represented by Formula 6.

a-1
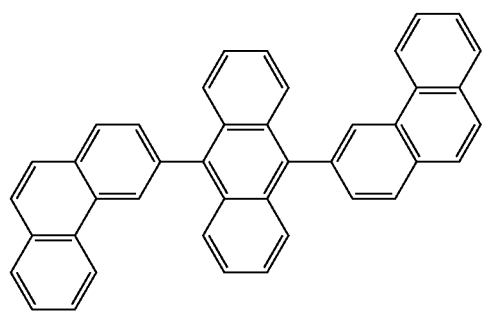
a-2
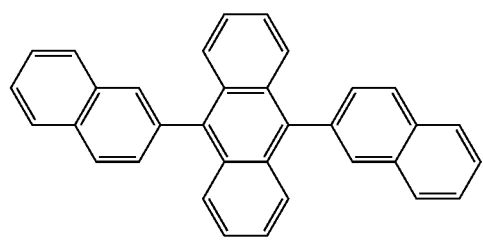
a-3
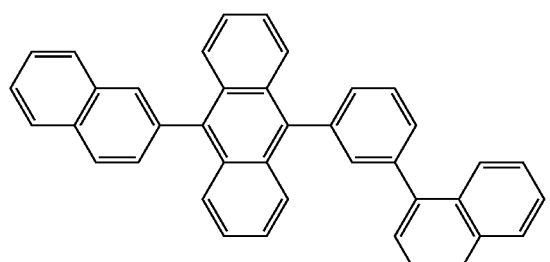
a-4
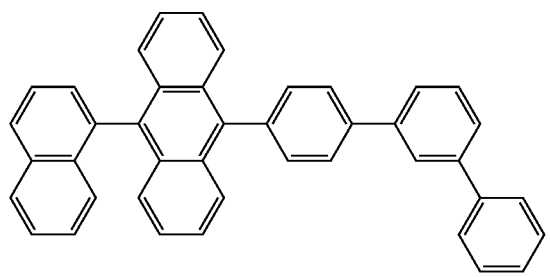
a-5
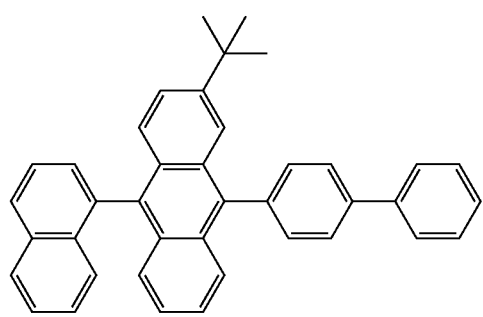
a-6
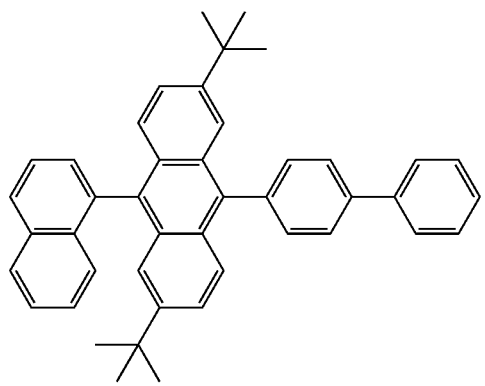
a-7
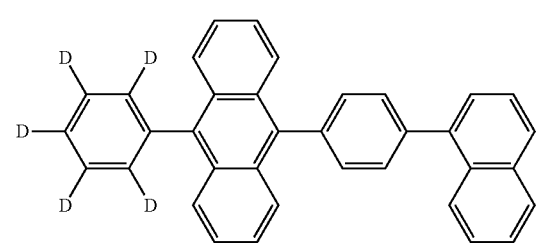
a-8
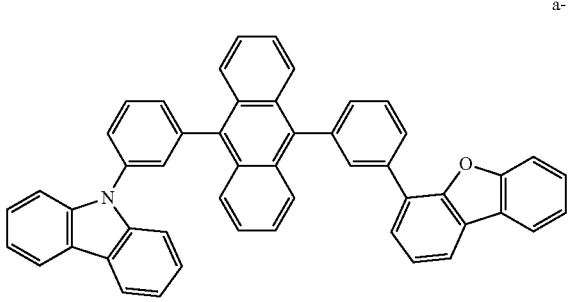
a-9
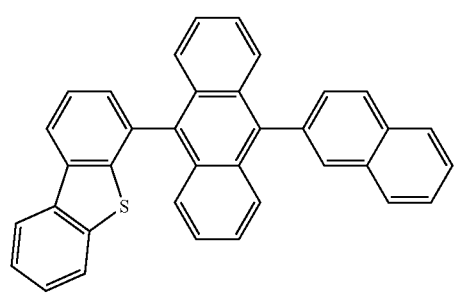
a-10
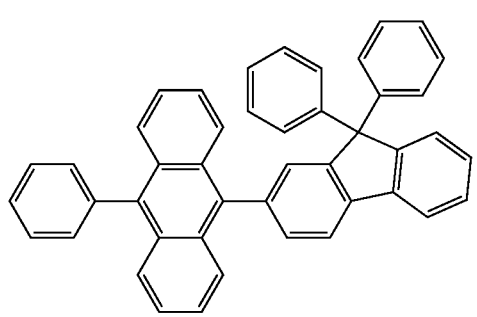

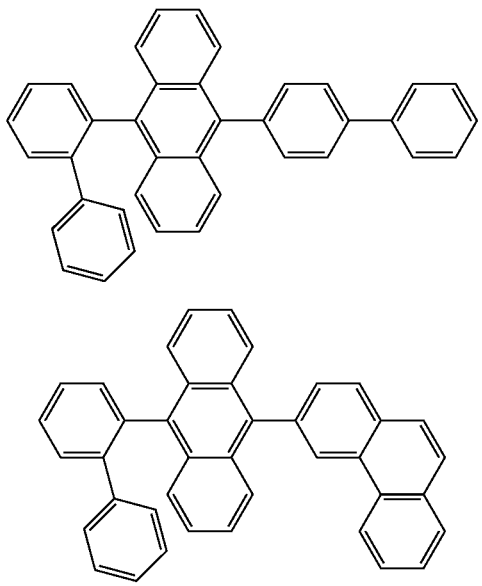

a-11 a-12

The host may be any material commonly used, without specific limitation, and may include, for example, tris(8-hydroxyquinolino)aluminum ($Alq_3$), 4,4'-bis(N-carbazolyl)-1,1'-biphenyl (CBP), poly(N-vinylcarbazole) (PVK), 9,10-di(naphthalene-2-yl)anthracene (ADN), 4,4',4"-tris(carbazol-9-yl)-triphenylamine (TCTA), 1,3,5-tris(N-phenylbenzimidazole-2-yl)benzene (TPBi), 3-tert-butyl-9,10-di(naphth-2-yl)anthracene (TBADN), distyrylarylene (DSA), 4,4'-bis(9-carbazolyl)-2,2'-dimethyl-biphenyl (CDBP), and 2-methyl-9,10-bis(naphthalen-2-yl)anthracene (MADN).

The polycyclic compound represented by Formula 1 may be included as a dopant material of an emission layer EML. The polycyclic compound represented by Formula 1 may be used as a dopant material for thermally activated delayed fluorescence (TADF).

In the organic electroluminescence device according to an embodiment of the inventive concept, the dopant may further include a known material in addition to the polycyclic compound represented by Formula 1. The dopant may include, for example, styryl derivatives (for example, 1,4-bis[2-(3-N-ethylcarbazoryl)vinyl]benzene (BCzVB), 4-(di-p-tolylamino)-4'-[(di-p-tolylamino)styryl]stilbene (DPAVB), and N-(4-((E)-2-(6-((E)-4-(diphenylamino) styryl)naphthalen-2-yl)vinyl)phenyl)-N-phenylbenzenamine (N-BDAVBi)), perylene and the derivatives thereof (for example, 2,5,8,11-tetra-t-butylperylene (TBP)), pyrene and the derivatives thereof (for example, 1,1-dipyrene, 1,4-dipyrenylbenzene, and 1,4-bis(N,N-diphenylamino)pyrene). The dopant may be 10-phenyl-10H, 10'H-spiro[acridine-9,9'-anthracen]-10'-one (ACRSA).

If the emission layer EML emits red light, the emission layer may further include a fluorescence material including, for example, tris(dibenzoylmethanato)phenanthroline europium (PBD:Eu(DBM)$_3$(Phen)) or perylene. If the emission layer EML emits red light, the dopant included in the emission layer EML may be selected from a metal complex or an organometallic complex such as bis(1-phenylisoquinoline)acetylacetonate iridium (PIQIr(acac)), bis(1-phenylquinoline)acetylacetonate iridium (PQIr(acac)), tris(1-phenylquinoline)iridium (PQIr), and octaethylporphyrin platinum (PtOEP), rubrene and the derivatives thereof, and 4-dicyanomethylene-2-(p-dimethylaminostyryl)-6-methyl-4H-pyrane (DCM) and the derivatives thereof.

If the emission layer EML emits green color, the emission layer EML may further include a fluorescence material including tris(8-hydroxyquinolino)aluminum ($Alq_3$). If the emission layer EML emits green light, the dopant included in the emission layer EML may be selected from a metal complex or an organometallic complex such as fac-tris(2-phenylpyridine)iridium (Ir(ppy)$_3$), and coumarin and the derivatives thereof.

If the emission layer EML emits blue light, the emission layer EML may further include a fluorescence material including any one selected from the group consisting of spiro-DPVBi, spiro-6P, distyryl-benzene (DSB), distyryl-arylene (DSA), a polyfluorene (PFO)-based polymer, and a poly(p-phenylene vinylene) (PPV)-based polymer. If the emission layer EML emits blue light, the dopant included in the emission layer EML may be selected from a metal complex or an organometallic complex such as (4,6-F2ppy)$_2$Irpic, and perylene and the derivatives thereof.

An electron transport region ETR is provided on the emission layer EML. The electron transport region ETR may include at least one of a hole blocking layer, an electron transport layer ETL, or an electron injection layer EIL, without limitation.

The electron transport region ETR may have a single layer formed using a single material, a single layer formed using a plurality of different materials, or a multilayer structure having a plurality of layers formed using a plurality of different materials.

For example, as shown in FIG. 2, the electron transport region ETR may have a laminated structure of an electron injection layer EIL and an electron transport layer ETL, or a single layer structure formed using an electron injection material and an electron transport material. Further, the electron transport region ETR may have a single layer structure having a plurality of different materials, or a structure laminated from the first electrode EL1 of electron transport layer ETL/electron injection layer EIL, or hole blocking layer/electron transport layer ETL/electron injection layer EIL, without limitation.

As shown in FIG. 3, the electron transport region ETR may have a plurality of electron transport layers. The electron transport region ETR may include a first electron transport layer ETL1 and a second electron transport layer ETL2 disposed on the first electron transport layer ETL1. The first electron transport layer ETL1 may be a hole transport layer which is adjacent to the emission layer EML among the plurality of electron transport layers.

The electron transport region ETR may be formed using various methods such as a vacuum deposition method, a spin coating method, a cast method, a Langmuir-Blodgett (LB) method, an inkjet printing method, a laser printing method, and a laser induced thermal imaging (LITI) method.

The electron transport region ETR may include, for example, tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-

(1,1'-biphenyl-4-olato)aluminum (BAlq), berylliumbis(benzoquinolin-10-olate (Bebq2), 9,10-di(naphthalene-2-yl) anthracene (ADN), bis[2-(diphenylphosphino)phenyl]ether oxide (DPEPO), and a mixture thereof. However, an embodiment of the inventive concept is not limited thereto. The thickness of the electron transport layers ETL may be from about 100 Å to about 1,000 Å, for example, from about 150 Å to about 500 Å. If the thickness of the electron transport layers ETL satisfies the above-described range, satisfactory electron transport properties may be obtained without substantial increase of a driving voltage.

If the electron transport region ETR includes an electron injection layer EIL, a metal such as Al, Ag, Li, Mg and Ca, or a mixture thereof may be included. However, an embodiment of the inventive concept is not limited thereto. For example, the electron injection layer EIL may use LiF, lithium quinolate (LiQ), $Li_2O$, BaO, NaCl, CsF, a metal in lanthanoides such as Yb, or a metal halide such as RbCl, and RbI. However, an embodiment of the inventive concept is not limited thereto. The electron injection layer EIL may also be formed using a mixture material of an electron transport material and an insulating organo metal salt. The organo metal salt may be a material having an energy band gap of about 4 eV or more. Particularly, the organo metal salt may include, for example, metal acetates, metal benzoates, metal acetoacetates, metal acetylacetonates, or metal stearates. The thickness of the electron injection layer EIL may be from about 10 Å to about 100 Å. If the thickness of the electron injection layer EIL satisfies the above-described range, satisfactory electron injection properties may be obtained without substantial increase of a driving voltage.

The electron transport region ETR may include a hole blocking layer as described above. The hole blocking layer may include, for example, 2,9-dimethyl-4,7-diphenyl-1,10-phenanthroline (BCP), or 4,7-diphenyl-1,10-phenanthroline (Bphen). However, an embodiment of the inventive concept is not limited thereto.

A second electrode EL2 is provided on the electron transport region ETR. The second electrode EL2 may be a common electrode or a cathode. The second electrode EL2 may be a transmissive electrode, a transflective electrode or a reflective electrode. If the second electrode EL2 is the transmissive electrode, the second electrode EL2 may include a transparent metal oxide, for example, ITO, IZO, ZnO, ITZO, etc.

If the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, a compound including thereof, or a mixture thereof (for example, a mixture of Ag and Mg). The second electrode EL2 may have a multilayered structure including a reflective layer or a transflective layer formed using the above-described materials and a transparent conductive layer formed using ITO, IZO, ZnO, ITZO, etc.

Although not shown, the second electrode EL2 may be coupled to an auxiliary electrode. If the second electrode EL2 is coupled to the auxiliary electrode, the resistance of the second electrode EL2 may decrease.

In the organic electroluminescence device 10, according to the application of a voltage to each of the first electrode EL1 and second electrode EL2, holes injected from the first electrode EL1 may move via the hole transport region HTR to the emission layer EML, and electrons injected from the second electrode EL2 may move via the electron transport region ETR to the emission layer EML. The electrons and the holes recombine in the emission layer EML to produce excitons, and the excitons may emit light via transition from an excited state to a ground state.

If the organic electroluminescence device 10 is a top emission type, the first electrode EL1 may be a reflective electrode and the second electrode EL2 may be a transmissive electrode or a transflective electrode. If the organic electroluminescence device 10 is a bottom emission type, the first electrode EL1 may be a transmissive electrode or a transflective electrode and the second electrode EL2 may be a reflective electrode.

The organic electroluminescence device according to an embodiment of the inventive concept includes the polycyclic compound represented by Formula 1, and thus, high emission efficiency and long life may be achieved. The organic electroluminescence device according to an embodiment of the inventive concept is used as the dopant material of an emission layer, and the high emission efficiency of an organic electroluminescence device may be achieved. Particularly, since the polycyclic compound represented by Formula 1 has a condensed structure by crosslinking a polycycle which is an electron acceptor via Si or Ge, and the difference between the lowest triplet energy level value and the lowest singlet energy level value may decrease, promoting the intersystem crosslinking of singlet-triplet. Accordingly, an organic electroluminescence device using the polycyclic compound as a dopant material may efficiently achieve thermally activated delayed fluorescence emission (TADF) without loss of the energy of triplet excitons, and may secure high emission efficiency and long life.

Hereinafter, the inventive concept will be explained in more detail with reference to particular preparation methods, embodiments and comparative embodiments. However, the following embodiments are only illustrations to assist the understanding of the inventive concept, and the scope of the inventive concept is not limited thereto.

The polycyclic compound according to an embodiment of the inventive concept may be synthesized, for example, as follows. However, an embodiment of the inventive concept is not limited thereto.

Synthetic Examples

1. Synthesis of Compound 3
(Synthesis of Compound A)

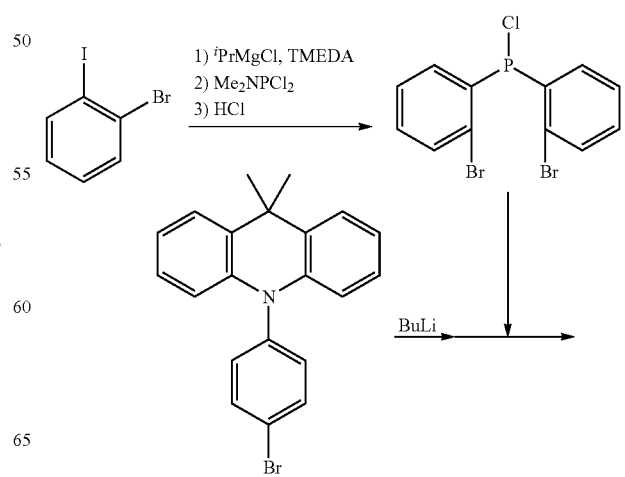

(Synthesis of Compound 3)

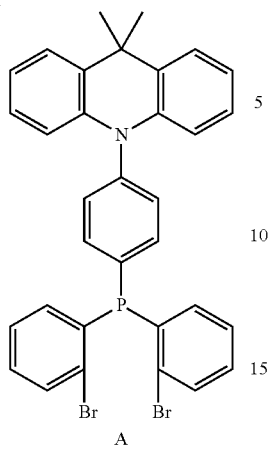

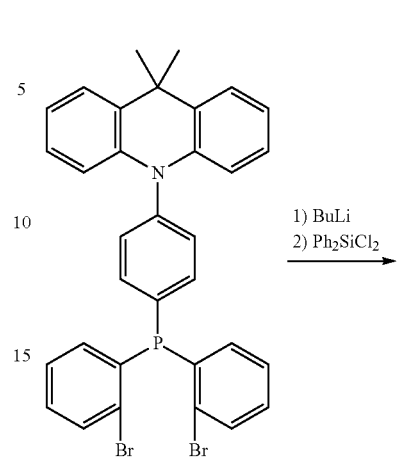

Under an argon (Ar) atmosphere, to a 500 ml three-neck flask, 15.0 ml (120 mmol) of 1-bromo-2-iodobenzene and 150 ml of an anhydrous THF solution were added and stirred at about −20° C. 120 ml (120 mmol) of a 1.0 M isopropylmagnesium chloride THF solution was added thereto dropwise, followed by stirring for about 1 hour. Then, 7.0 ml (60 mmol) of dichloro(dimethylamino)phosphine was added thereto dropwise, followed by stirring at about −78° C. for about 1 hour, and then, at room temperature for about 3 hours. After finishing the reaction, 120 ml (120 mmol) of a 1.0 M hydrogen chloride diethyl ether solution was added thereto, followed by stirring at room temperature for about 3 hours. The precipitate thus obtained was filtered to obtain an off-white solid compound. The compound was transported to a 500 ml three-neck flask, and the inside of the flask was substituted with an argon atmosphere. 120 ml of an anhydrous THF solution was added thereto and stirred at about −78° C. Under an argon atmosphere, 120 ml of an anhydrous THF solution of 21.9 g (60 mmol) of 10-(4-bromophenyl)-9,9-dimethyl-9,10-dihydroacridine was added to a 300 ml three-neck flask, followed by stirring at about −78° C. 37.5 ml (60 mmol) of a 1.6 M n-butyllithium hexane solution was added thereto, followed by stirring for about 1 hour. The solution thus obtained was added dropwise to a THF solution of the off-white solid compound obtained by the first reaction, followed by stirring at about −78° C. for about 1 hour, and then, at room temperature for about 3 hours. After finishing the reaction, the reaction mixture was washed with water, and the organic phase thus obtained was concentrated to obtain a viscous material. The crude product thus obtained was separated by silica gel column chromatography to obtain 7.15 g (yield 19%) of Compound A as a white solid. The molecular weight of Compound A measured by FAB-MS was 625.

Under an argon (Ar) atmosphere, to a 200 ml three-neck flask, 7.14 g (11.4 mmol) of the intermediate of Compound A and 45 ml of an anhydrous THF solution were added, followed by stirring at about −78° C. 14.3 ml (22.8 mmol) of a 1.6 M n-BuLi hexane solution was added thereto dropwise, followed by stirring for about 2 hours. 12 ml of an anhydrous THF solution of 2.89 g (11.4 mmol) of diphenyldichlorosilane was added thereto dropwise, followed by stirring at about −78° C. for about 2 hours, and then, at room temperature for about 3 hours. After finishing the reaction, the reaction mixture was washed with water, and the organic phase thus obtained was concentrated to obtain a viscous material. The crude product thus obtained was separated by silica gel column chromatography to obtain a white solid compound. To a 300 ml round-bottom flask, the white solid, 114 ml of dichloromethane, and 3 ml of a 35% hydrogen peroxide solution were added, followed by stirring at room temperature for about 1 hour for performing reaction. After finishing the reaction, water was added, an organic layer was separately taken, and solvents were removed by distillation. The crude product thus obtained was separated by silica gel column chromatography to obtain 3.04 g (yield 40%) of Compound 3 as a yellow solid. The molecular weight of Compound 3 measured by FAB-MS was 665. In addition, the chemical shift values of the compound measured by $^1$H-NMR were 7.87 (2H), 7.75-7.59 (8H), 7.48-7.36 (12H), 7.21-7.12 (6H), 6.95 (2H), 1.69 (6H). From the results, the yellow solid compound was identified as Compound 3.

2. Synthesis of Compound 1
(Synthesis of Compound B)

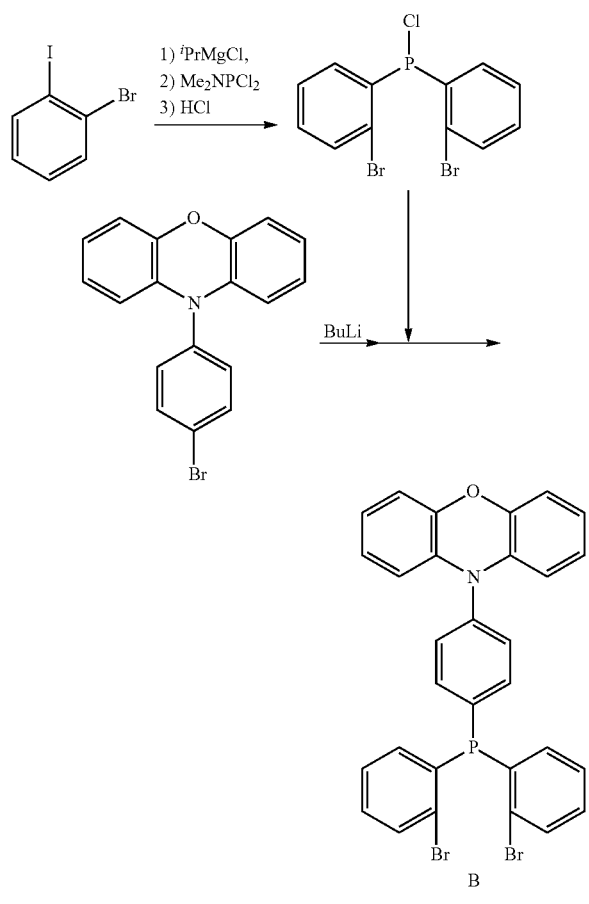

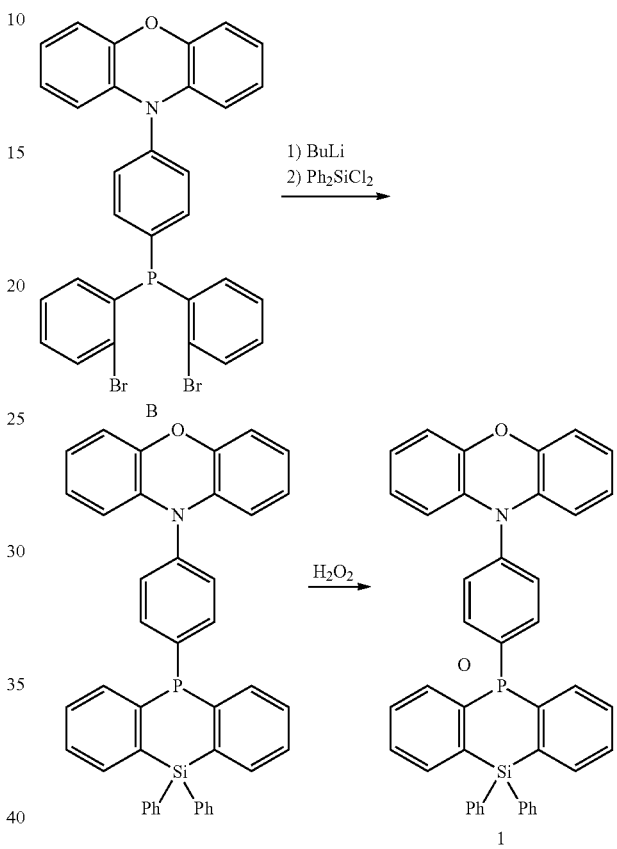

Under an argon (Ar) atmosphere, to a 1,000 ml three-neck flask, 30.0 ml (240 mmol) of 1-bromo-2-iodobenzene and 300 ml of an anhydrous THF solution were added and stirred at about −20° C. 240 ml (240 mmol) of a 1.0 M isopropylmagnesium chloride THF solution was added thereto dropwise, followed by stirring for about 1 hour. Then, 13.9 ml (120 mmol) of dichloro(dimethylamino)phosphine was added thereto dropwise, followed by stirring at about −78° C. for about 1 hour, and then, at room temperature for about 3 hours. After finishing the reaction, 240 ml (240 mmol) of a 1.0 M hydrogen chloride diethyl ether solution was added thereto, followed by stirring at room temperature for about 3 hours. The precipitate thus obtained was filtered to obtain an off-white solid compound. The compound was transported to a 1,000 ml three-neck flask, and the inside of the flask was substituted with an argon atmosphere. 240 ml of an anhydrous THF solution was added thereto and stirred at about −78° C. Under an argon atmosphere, 240 ml of an anhydrous THF solution of 40.6 g (120 mmol) of 10-(4-bromophenyl)-10H-phenoxazine was added to a 500 ml three-neck flask, followed by stirring at about −78° C. 75 ml (120 mmol) of a 1.6 M n-butyllithium hexane solution was added thereto, followed by stirring for about 1 hour. The solution thus obtained was added dropwise to a THF solution of the off-white solid compound obtained by the first reaction, followed by stirring at about −78° C. for about 1 hour, and then, at room temperature for about 3 hours. After finishing the reaction, the reaction mixture was washed with water, and the organic phase thus obtained was concentrated to obtain a viscous material. The crude product thus obtained was separated by silica gel column chromatography to obtain 18.76 g (yield 26%) of Compound B as a white solid. The molecular weight of Compound B measured by FAB-MS was 601.

(Synthesis of Compound 1)

Under an argon (Ar) atmosphere, to a 200 ml three-neck flask, 6.01 g (10.0 mmol) of the intermediate of Compound B and 40 ml of an anhydrous THF solution were added, followed by stirring at about −78° C. 12.5 ml (20.0 mmol) of a 1.6 M n-BuLi hexane solution was added thereto dropwise, followed by stirring for about 2 hours. 10 ml of an anhydrous THF solution of 2.54 g (10.0 mmol) of diphenyldichlorosilane was added thereto dropwise, followed by stirring at about −78° C. for about 2 hours, and then, at room temperature for about 3 hours. After finishing the reaction, the reaction mixture was washed with water, and the organic phase thus obtained was concentrated to obtain a viscous material. The crude product thus obtained was separated by silica gel column chromatography to obtain a white solid compound. To a 200 ml round-bottom flask, the white solid, 100 ml of dichloromethane, and 3 ml of a 35% hydrogen peroxide solution were added, followed by stirring at room temperature for about 1 hour for performing reaction. After finishing the reaction, water was added, an organic layer was separately taken, and solvents were removed by distillation. The crude product thus obtained was separated by silica gel column chromatography to obtain 3.07 g (yield 48%) of Compound 1 as a yellow solid. The molecular weight of Compound 1 measured by FAB-MS was 639. In addition, the chemical shift values of the compound measured by $^1$H-NMR were 7.87 (2H), 7.74-7.60 (8H), 7.47-7.37 (12H), 7.14 (2H), 7.02-6.95 (6H). From the results, the yellow solid compound was identified as Compound 1.

3. Synthesis of Compound 17

(Synthesis of Compound C)

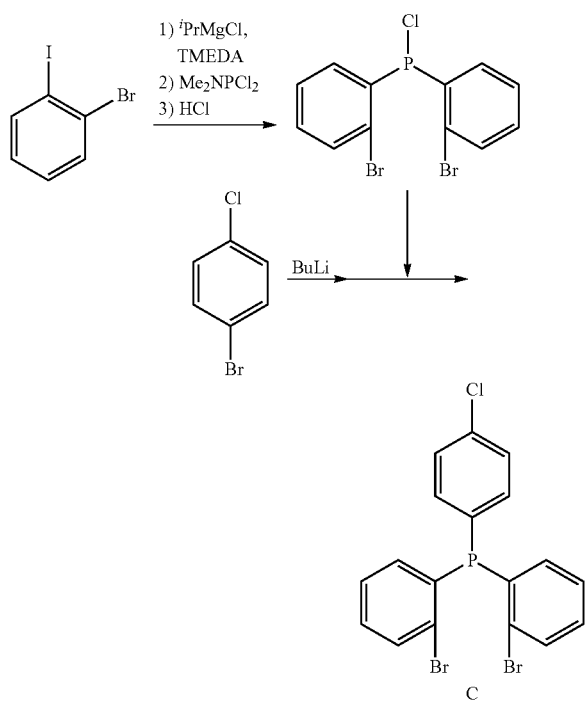

Under an argon (Ar) atmosphere, to a 1,000 ml three-neck flask, 30.0 ml (240 mmol) of 1-bromo-2-iodobenzene and 300 ml of an anhydrous THF solution were added and stirred at about −20° C. 240 ml (240 mmol) of a 1.0 M isopropylmagnesium chloride THF solution was added thereto dropwise, followed by stirring for about 1 hour. Then, 13.9 ml (120 mmol) of dichloro(dimethylamino)phosphine was added thereto dropwise, followed by stirring at about −78° C. for about 1 hour, and then, at room temperature for about 3 hours. After finishing the reaction, 240 ml (240 mmol) of a 1.0 M hydrogen chloride diethyl ether solution was added thereto, followed by stirring at room temperature for about 3 hours. The precipitate thus obtained was filtered to obtain an off-white solid compound. The compound was transported to a 1,000 ml three-neck flask, and the inside of the flask was substituted with an argon atmosphere. 240 ml of an anhydrous THF solution was added thereto and stirred at about −78° C. Under an argon atmosphere, 240 ml of an anhydrous THF solution of 23.0 g (120 mmol) of 1-bromo-4-chlorobenzene was added to a 500 ml three-neck flask, followed by stirring at about −78° C. 75 ml (120 mmol) of a 1.6 M n-butyllithium hexane solution was added thereto, followed by stirring for about 1 hour. The solution thus obtained was added dropwise to a THF solution of the off-white solid compound obtained by the first reaction, followed by stirring at about −78° C. for about 1 hour, and then, at room temperature for about 3 hours. After finishing the reaction, the reaction mixture was washed with water, and the organic phase thus obtained was concentrated to obtain a viscous material. The crude product thus obtained was separated by silica gel column chromatography to obtain 12.00 g (yield 22%) of Compound C as a white solid. The molecular weight of Compound C measured by FAB-MS was 451.

(Synthesis of Compound D)

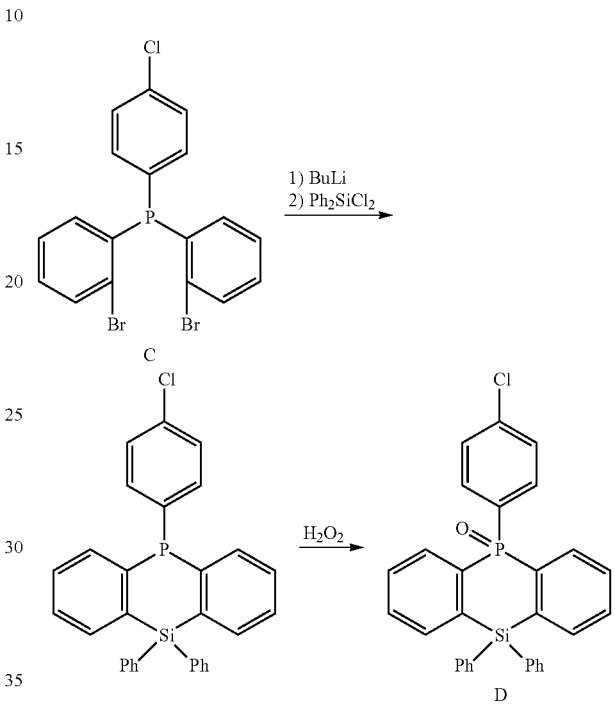

Under an argon (Ar) atmosphere, to a 500 ml three-neck flask, 12.00 g (26.4 mmol) of the intermediate of Compound C and 105 ml of an anhydrous THF solution were added, followed by stirring at about −78° C. 33.0 ml (52.8 mmol) of a 1.6 M n-BuLi hexane solution was added thereto dropwise, followed by stirring for about 2 hours. 27 ml of an anhydrous THF solution of 6.71 g (26.4 mmol) of diphenyldichlorosilane was added thereto dropwise, followed by stirring at about −78° C. for about 2 hours, and then, at room temperature for about 3 hours. After finishing the reaction, the reaction mixture was washed with water, and the organic phase thus obtained was concentrated to obtain a viscous material. The crude product thus obtained was separated by silica gel column chromatography to obtain a white solid compound. To a 500 ml round-bottom flask, the white solid, 270 ml of dichloromethane, and 5 ml of a 35% hydrogen peroxide solution were added, followed by stirring at room temperature for about 1 hour for performing reaction. After finishing the reaction, water was added, an organic layer was separately taken, and solvents were removed by distillation. The crude product thus obtained was separated by silica gel column chromatography to obtain 7.29 g (yield 56%) of Compound D as a yellow solid. The molecular weight of Compound D measured by FAB-MS was 492.

(Synthesis of Compound 17)

4. Synthesis of Compound 18

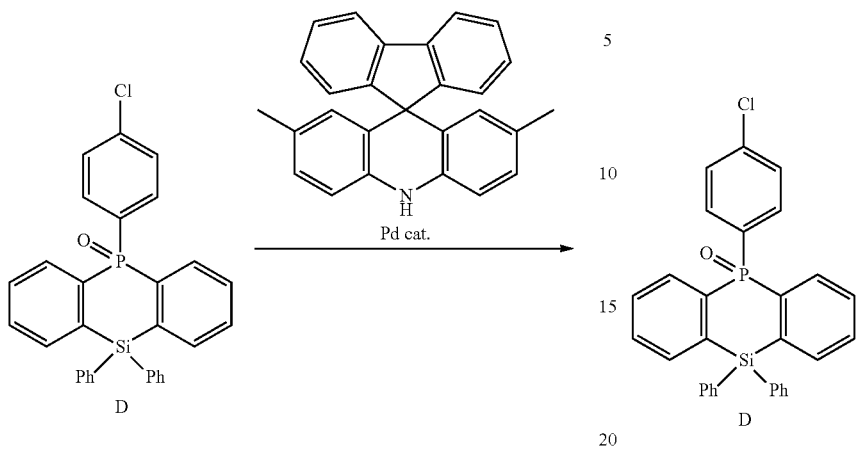

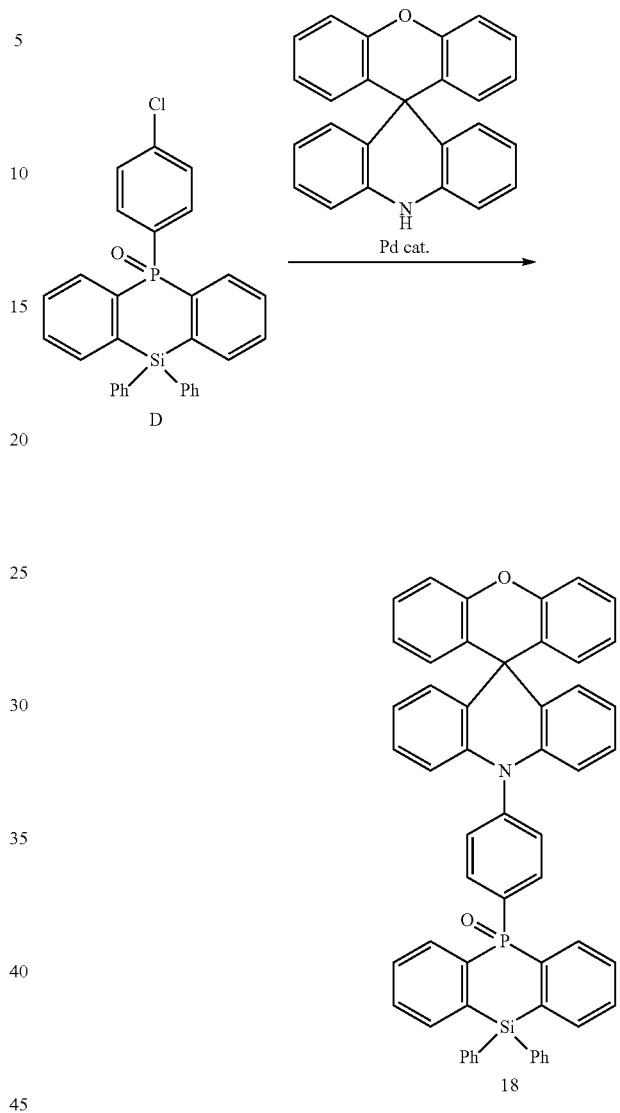

Under an argon atmosphere, to a 100 ml three-neck flask, 3.64 g (7.4 mmol) of the intermediate of Compound D, 2.66 g (7.4 mmol) of 2,7-dimethyl-10H-spiro[acridine-9,9'-fluorene], 0.169 g (0.19 mmol) of $Pd_2(dba)_3$, 0.150 g (0.74 mmol) of $(t-Bu)_3P$, and 0.711 g (7.4 mmol) of $NaO^tBu$ were added, followed by stirring in 37 ml of a toluene solvent at about 120° C. for about 12 hours. After cooling in the air, water was added, an organic layer was separately taken, and solvents were evaporated under a reduced pressure. The crude product thus obtained was separated by silica gel column chromatography to obtain 4.34 g (yield 72%) of Compound 17 as a white solid. The molecular weight of Compound 17 measured by FAB-MS was 815. In addition, the chemical shift values of the compound measured by $^1$H-NMR were 7.92-7.85 (4H), 7.75-7.53 (10H), 7.48-7.36 (12H), 7.28 (2H), 7.14-7.03 (6H), 2.31 (6H). From the results, the white solid compound was identified as Compound 17.

Under an argon atmosphere, to a 100 ml three-neck flask, 3.64 g (7.4 mmol) of the intermediate of Compound D, 2.57 g (7.4 mmol) of spiro[acridine-9(10H),9'-[9H]xanthene], 0.169 g (0.19 mmol) of $Pd_2(dba)_3$, 0.150 g (0.74 mmol) of $(t-Bu)_3P$, and 0.711 g (7.4 mmol) of $NaO^tBu$ were added, followed by stirring in 37 ml of a toluene solvent at about 120° C. for about 12 hours. After cooling in the air, water was added, an organic layer was separately taken, and solvents were evaporated under a reduced pressure. The crude product thus obtained was separated by silica gel column chromatography to obtain 4.09 g (yield 69%) of Compound 18 as a white solid. The molecular weight of Compound 18 measured by FAB-MS was 803. In addition, the chemical shift values of the compound measured by $^1$H-NMR were 7.87 (2H), 7.75-7.59 (8H), 7.48-7.29 (12H), 7.21-7.12 (10H), 7.03-6.93 (4H). From the results, the white solid compound was identified as Compound 18.

5. Synthesis of Compound 12

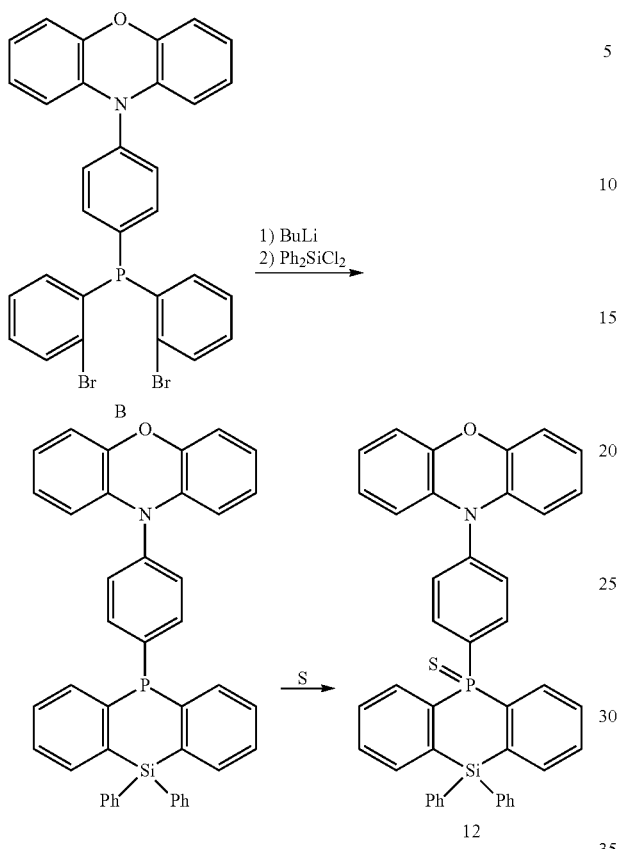

6. Synthesis of Compound 14
(Synthesis of Compound E)

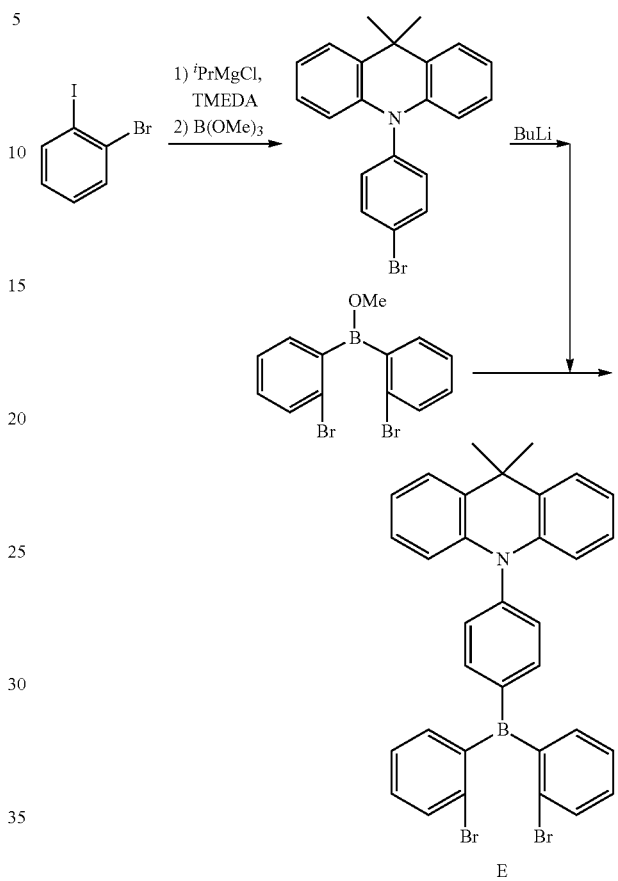

Under an argon (Ar) atmosphere, to a 200 ml three-neck flask, 6.01 g (10.0 mmol) of the intermediate of Compound B and 40 ml of an anhydrous THF solution were added, followed by stirring at about −78° C. 12.5 ml (20.0 mmol) of a 1.6 M n-BuLi hexane solution was added thereto dropwise, followed by stirring for about 2 hours. 10 ml of an anhydrous THF solution of 2.54 g (10.0 mmol) of diphenyldichlorosilane was added thereto dropwise, followed by stirring at about −78° C. for about 2 hours, and then, at room temperature for about 3 hours. After finishing the reaction, the reaction mixture was washed with water, and the organic phase thus obtained was concentrated to obtain a viscous material. The crude product thus obtained was separated by silica gel column chromatography to obtain a white solid compound. To a 500 ml round-bottom flask, the white solid, 100 ml of dichloromethane, and 0.385 g (12.0 ml) of a sulfur powder were added, followed by stirring at room temperature for about 2 hours for performing reaction. After finishing the reaction, water was added, an organic layer was separately taken, and solvents were removed by distillation. The crude product thus obtained was separated by silica gel column chromatography to obtain 2.56 g (yield 39%) of Compound 12 as a yellow solid.

The molecular weight of Compound 12 measured by FAB-MS was 655. In addition, the chemical shift values of the compound measured by $^1$H-NMR were 7.48-7.32 (18H), 7.22-7.12 (6H), 7.03-6.94 (6H). From the results, the yellow solid compound was identified as Compound 12.

Under an argon (Ar) atmosphere, to a 500 ml three-neck flask, 6.0 ml (48.0 mmol) of 1-bromo-2-iodobenzene and 96 ml of an anhydrous THF solution were added and stirred at about −20° C. 48.0 ml (48.0 mmol) of a 1.0 M isopropylmagnesium chloride THF solution was added thereto dropwise, followed by stirring for about 1 hour. Then, 2.6 ml (24.0 mmol) of trimethoxyborane was added thereto dropwise, followed by stirring at about −78° C. for about 1 hour, and then, at room temperature for about 3 hours.

Under an argon atmosphere, 48 ml of an anhydrous THF solution of 8.74 g (24.0 mmol) of 10-(4-bromophenyl)-9,9-dimethyl-9,10-dihydroacridine was added to a 100 ml three-neck flask, followed by stirring at about −78° C. 15.0 ml (24.0 mmol) of a 1.6 M n-butyllithium hexane solution was added thereto dropwise, followed by stirring for about 1 hour. The solution thus obtained was added to a solution obtained by the first reaction dropwise, followed by stirring at about 80° C. for about 2 hours for performing reaction. After cooling in the air, water was added, an organic layer was separately taken, and solvents were evaporated under a reduced pressure. The crude product thus obtained was separated by silica gel column chromatography to obtain 2.62 g (yield 18%) of Compound E as a white solid. The molecular weight of Compound E measured by FAB-MS was 605.

(Synthesis of Compound 14)

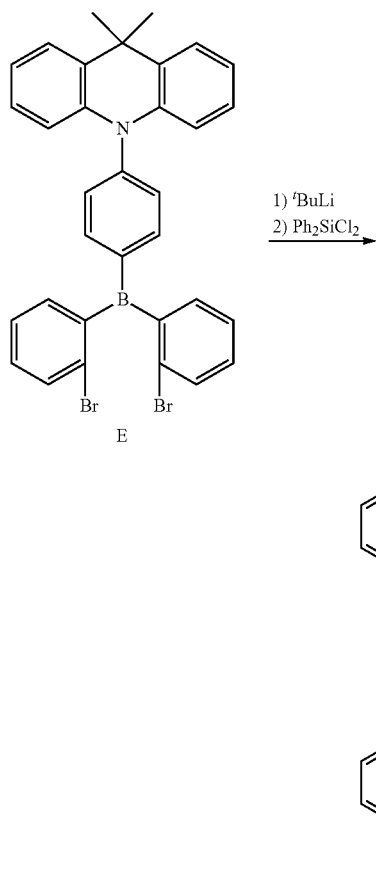

7. Synthesis of Compound 15
(Synthesis of Compound F)

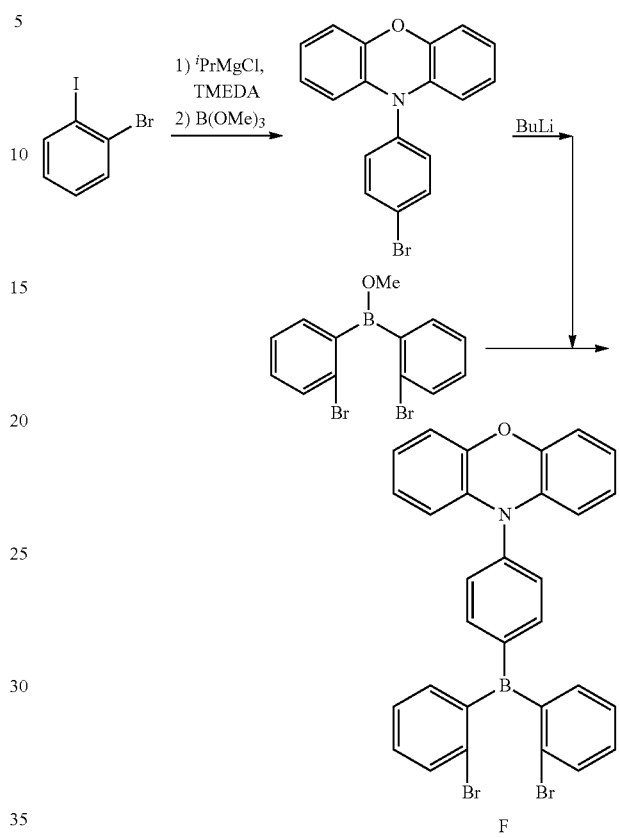

Under an argon (Ar) atmosphere, to a 300 ml three-neck flask, 2.62 g (4.32 mmol) of the intermediate of Compound E and 35 ml of an anhydrous THF solution were added, followed by stirring at about −78° C. 9.1 ml (17.3 mmol) of a 1.9 M t-BuLi hexane solution was added thereto dropwise, followed by stirring for about 2 hours and then stirring while elevating the temperature to about −10° C. for about 3 hours. After decreasing the temperature to about −78° C. again, 5 ml of an anhydrous THF solution of 1.10 g (4.32 mmol) of diphenyldichlorosilane was added thereto dropwise, followed by stirring at about −78° C. for about 2 hours, and then, at room temperature for about 3 hours. After finishing the reaction, the reaction mixture was washed with water. The organic phase thus obtained was concentrated to obtain a viscous material. The crude product thus obtained was separated by silica gel column chromatography to obtain 1.03 g (yield 38%) of Compound 14 as a yellow solid. The molecular weight of Compound 14 measured by FAB-MS was 629. In addition, the chemical shift values of the compound measured by $^1$H-NMR were 7.85 (2H), 7.71 (2H), 7.48-7.35 (16H), 7.21-7.12 (8H), 6.95 (2H), 1.69 (6H). From the results, the yellow solid compound was identified as Compound 14.

Under an argon (Ar) atmosphere, to a 500 ml three-neck flask, 6.0 ml (48.0 mmol) of 1-bromo-2-iodobenzene and 96 ml of an anhydrous THF solution were added and stirred at about −20° C. 48.0 ml (48.0 mmol) of a 1.0 M isopropylmagnesium chloride THF solution was added thereto dropwise, followed by stirring for about 1 hour. Then, 2.6 ml (24.0 mmol) of trimethoxyborane was added thereto dropwise, followed by stirring at about −78° C. for about 1 hour, and then, at room temperature for about 3 hours.

Under an argon atmosphere, to a 100 ml three-neck flask, 48 ml of an anhydrous THF solution of 8.12 g (24.0 mmol) of 10-(4-bromophenyl)-10H-phenoxazine was added, and then stirred at about −78° C. 15.0 ml (24.0 mmol) of a 1.6 M n-butyllithium hexane solution was added thereto dropwise, followed by stirring for about 1 hour. The solution thus obtained was added dropwise to a solution obtained by the first reaction, followed by stirring at about 80° C. for about 2 hours for performing reaction. After cooling in the air, water was added, an organic layer was separately taken, and solvents were evaporated under a reduced pressure. The crude product thus obtained was separated by silica gel column chromatography to obtain 3.35 g (yield 24%) of Compound F as a white solid. The molecular weight of Compound F measured by FAB-MS was 581.

(Synthesis of Compound 15)

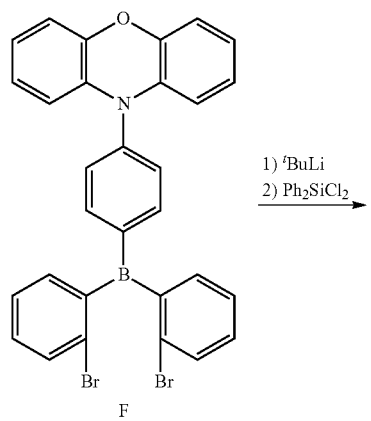

8. Synthesis of Compound 21
(Synthesis of Compound G)

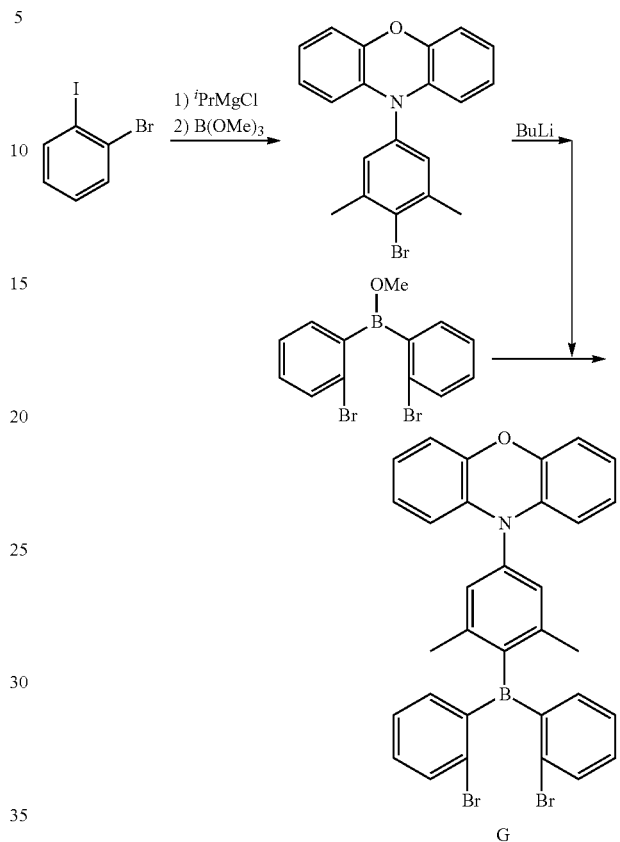

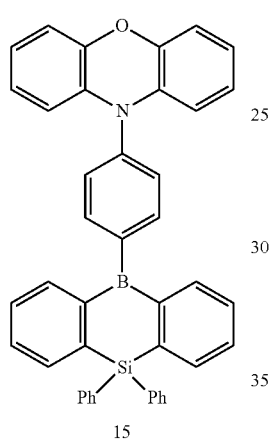

15

Under an argon (Ar) atmosphere, to a 300 ml three-neck flask, 3.35 g (5.76 mmol) of the intermediate of Compound E and 50 ml of an anhydrous THF solution were added, followed by stirring at about −78° C. 12.1 ml (23.0 mmol) of a 1.6 M t-BuLi hexane solution was added thereto dropwise, followed by stirring for about 2 hours and stirring while elevating the temperature to about −10° C. for about 3 hours. The temperature was decreased to about −78° C. again, and 6 ml of an anhydrous THF solution of 1.46 g (5.76 mmol) of diphenyldichlorosilane was added thereto dropwise, followed by stirring at about −78° C. for about 2 hours, and then, at room temperature for about 3 hours. After finishing the reaction, the reaction mixture was washed with water. The organic phase thus obtained was concentrated to obtain a viscous material. The crude product thus obtained was separated by silica gel column chromatography to obtain 1.49 g (yield 43%) of Compound 15 as a yellow solid. The molecular weight of Compound 15 measured by FAB-MS was 603. In addition, the chemical shift values of the compound measured by $^1$H-NMR were 7.85 (2H), 7.71 (2H), 7.48-7.35 (16H), 7.20-7.12 (4H), 7.03-6.94 (6H). From the results, the yellow solid compound was identified as Compound 15.

Under an argon (Ar) atmosphere, to a 500 ml three-neck flask, 6.0 ml (48.0 mmol) of 1-bromo-2-iodobenzene and 96 ml of an anhydrous THF solution were added and stirred at about −20° C. 48.0 ml (48.0 mmol) of a 1.0 M isopropyl-magnesium chloride THF solution was added thereto dropwise, followed by stirring for about 1 hour. Then, 2.6 ml (24.0 mmol) of trimethoxyborane was added thereto dropwise, followed by stirring at about −78° C. for about 1 hour, and then, at room temperature for about 3 hours.

Under an argon atmosphere, 48 ml of an anhydrous THF solution of 8.80 g (24.0 mmol) of 10-(4-bromo-3,5-dimethylphenyl)-10H-phenoxazine was added to a 100 ml three-neck flask, followed by stirring at about −78° C. 15.0 ml (24.0 mmol) of a 1.6 M n-butyllithium hexane solution was added thereto dropwise, followed by stirring for about 1 hour. The solution thus obtained was added to a solution obtained by the first reaction dropwise, followed by heating and stirring at about 80° C. for about 2 hours for performing reaction. After cooling in the air, water was added, an organic layer was separately taken, and solvents were evaporated under a reduced pressure. The crude product thus obtained was separated by silica gel column chromatography to obtain 4.68 g (yield 32%) of Compound G as a white solid. The molecular weight of Compound G measured by FAB-MS was 609.

(Synthesis of Compound 21)

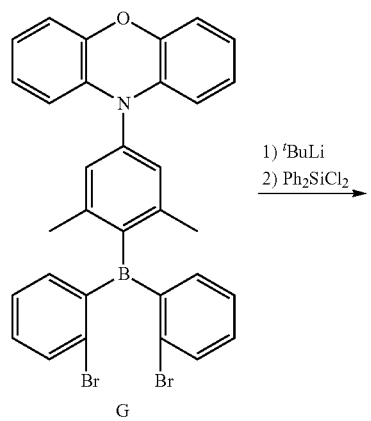

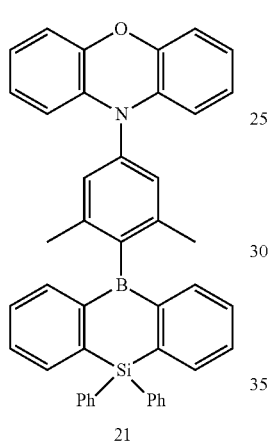

9. Synthesis of Compound 35
(Synthesis of Compound H)

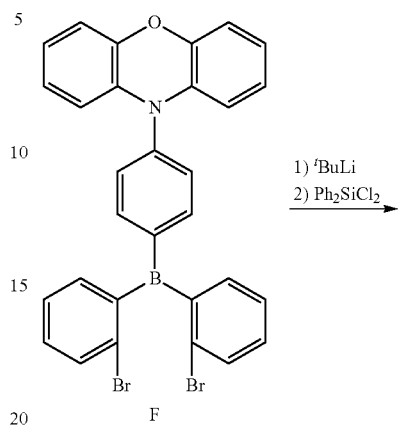

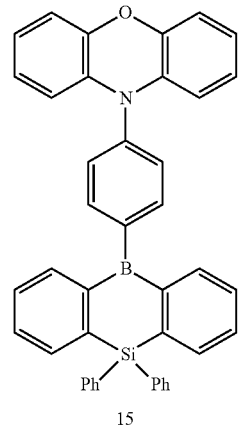

Under an argon (Ar) atmosphere, to a 300 ml three-neck flask, 4.68 g (7.68 mmol) of the intermediate of Compound G and 60 ml of an anhydrous THF solution were added, followed by stirring at about −78° C. 16.2 ml (30.8 mmol) of a 1.9 M t-BuLi hexane solution was added thereto dropwise, followed by stirring for about 2 hours and stirring while elevating the temperature to about −10° C. for about 3 hours. The temperature was decreased to about −78° C. again, and 8 ml of an anhydrous THF solution of 1.94 g (7.68 mmol) of diphenyldichlorosilane was added thereto dropwise, followed by stirring at about −78° C. for about 2 hours, and then, at room temperature for about 3 hours. After finishing the reaction, the reaction mixture was washed with water. The organic phase thus obtained was concentrated to obtain a viscous material. The crude product thus obtained was separated by silica gel column chromatography to obtain 3.14 g (yield 65%) of Compound 21 as a yellow solid. The molecular weight of Compound 21 measured by FAB-MS was 631. In addition, the chemical shift values of the compound measured by $^1$H-NMR were 7.85 (2H), 7.47-7.36 (16H), 7.16-7.13 (4H), 7.02-6.95 (6H), 2.33 (6H). From the results, the yellow solid compound was identified as Compound 21.

Under an argon (Ar) atmosphere, to a 1,000 ml three-neck flask, 12.0 g (96.0 mmol) of 1-bromo-2-iodobenzene and 192 ml of an anhydrous THF solution were added and stirred at about −20° C. 96.0 ml (96.0 mmol) of a 1.0 M isopropylmagnesium chloride THF solution was added thereto dropwise, followed by stirring for about 1 hour. Then, 5.2 ml (48.0 mmol) of trimethoxyborane was added thereto dropwise, followed by stirring at about −78° C. for about 1 hour, and then, at room temperature for about 3 hours.

Under an argon atmosphere, to a 200 ml three-neck flask, 96 ml of an anhydrous THF solution of 10.54 g (48.0 mmol) of 2-bromo-5-chloro-1,3-dimethylbenzene was added and then, stirred at about −78° C. 30.0 ml (48.0 mmol) of a 1.6 M n-butyllithium hexane solution was added thereto dropwise, followed by stirring for about 1 hour. The solution thus obtained was added to a solution obtained by the first reaction dropwise, followed by heating and stirring at about 80° C. for about 2 hours for performing reaction. After cooling in the air, water was added, an organic layer was separately taken, and solvents were evaporated under a reduced pressure. The crude product thus obtained was separated by silica gel column chromatography to obtain 5.99 g (yield 27%) of Compound H as a white solid. The molecular weight of Compound H measured by FAB-MS was 459.

(Synthesis of Compound I)

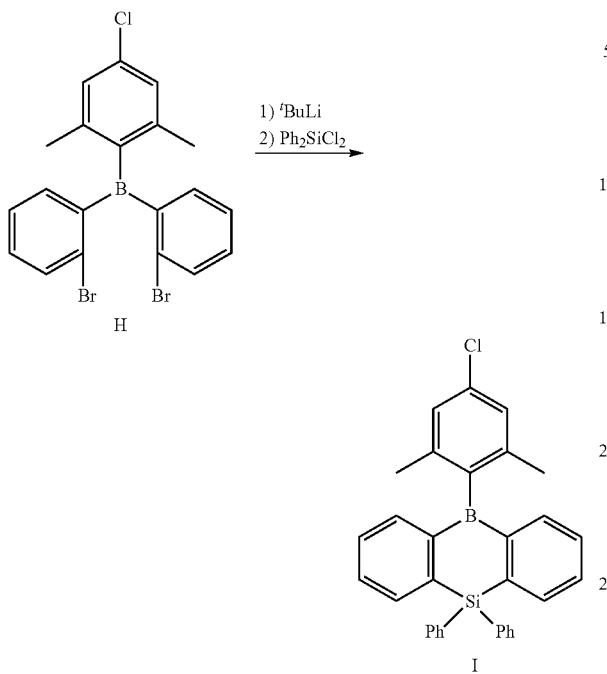

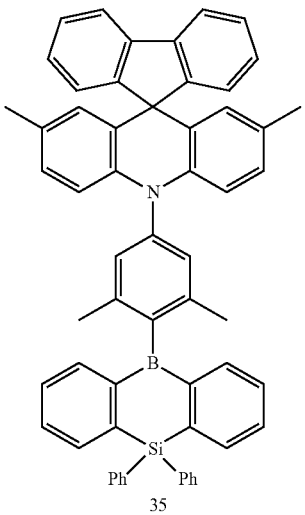

Under an argon (Ar) atmosphere, to a 500 ml three-neck flask, 5.99 g (13.0 mmol) of the intermediate of Compound H and 105 ml of an anhydrous THF solution were added, followed by stirring at about −78° C. 27.4 ml (52.0 mmol) of a 1.9 M n-BuLi hexane solution was added thereto dropwise, followed by stirring for about 2 hours and stirring while elevating the temperature to about −10° C. for about 3 hours. The temperature was decreased to about −78° C. again, and 13 ml of an anhydrous THF solution of 3.30 g (13.0 mmol) of diphenyldichlorosilane was added thereto dropwise, followed by stirring at about −78° C. for about 2 hours, and then, at room temperature for about 3 hours. After finishing the reaction, the reaction mixture was washed with water. The organic phase thus obtained was concentrated to obtain a viscous material. The crude product thus obtained was separated by silica gel column chromatography to obtain 3.02 g (yield 48%) of Compound I as a yellow solid. The molecular weight of Compound I measured by FAB-MS was 484.

(Synthesis of Compound 35)

Under an argon atmosphere, to a 50 ml three-neck flask, 1.50 g (3.1 mmol) of the intermediate of Compound I, 1.11 g (3.1 mmol) of 2,7-dimethyl-10H-spiro[acridine-9,9′-fluorene], 0.710 g (0.08 mmol) of Pd$_2$(dba)$_3$, 0.627 g (0.31 mmol) of (t-Bu)$_3$P, and 0.298 g (3.1 mmol) of NaO$^t$Bu were added, followed by stirring in 16 ml of a toluene solvent at about 120° C. for about 12 hours. After cooling in the air, water was added, an organic layer was separately taken, and solvents were evaporated under a reduced pressure. The crude product thus obtained was separated by silica gel column chromatography to obtain 1.43 g (yield 57%) of Compound 35 as a white solid. The molecular weight of Compound 35 measured by FAB-MS was 807. In addition, the chemical shift values of the compound measured by $^1$H-NMR were 7.92-7.83 (4H), 7.55 (2H), 7.48-7.26 (20H), 7.17-7.10 (4H), 7.05 (4H), 2.33 (6H), 2.31 (6H). From the results, the white solid compound was identified as Compound 35.

10. Synthesis of Compound 36

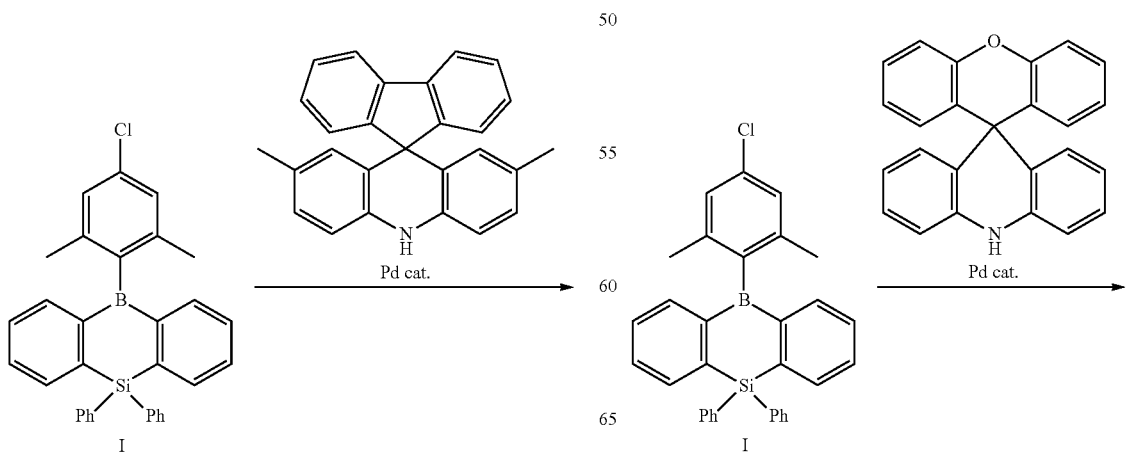

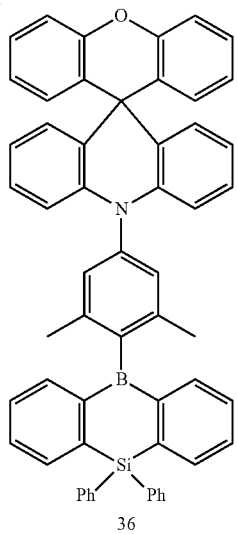

36

Under an argon atmosphere, to a 50 ml three-neck flask, 1.50 g (3.1 mmol) of the intermediate of Compound I, 2.47 g (3.1 mmol) of spiro[acridine-9(10H),9'-[9H]xanthene, 0.710 g (0.08 mmol) of $Pd_2(dba)_3$, 0.627 g (0.31 mmol) of (t-Bu)$_3$P, and 0.298 g (3.1 mmol) of NaO$^t$Bu were added, followed by stirring in 16 ml of a toluene solvent at about 120° C. for about 12 hours. After cooling in the air, water was added, an organic layer was separately taken, and solvents were evaporated under a reduced pressure. The crude product thus obtained was separated by silica gel column chromatography to obtain 1.16 g (yield 47%) of Compound 36 as a white solid. The molecular weight of Compound 36 measured by FAB-MS was 795. In addition, the chemical shift values of the compound measured by $^1$H-NMR were 7.85 (2H), 7.48-7.29 (18H), 7.21-7.12 (12H), 7.03-6.93 (4H), 2.33 (6H). From the results, the white solid compound was identified as Compound 36.

11. Synthesis of Compound 23

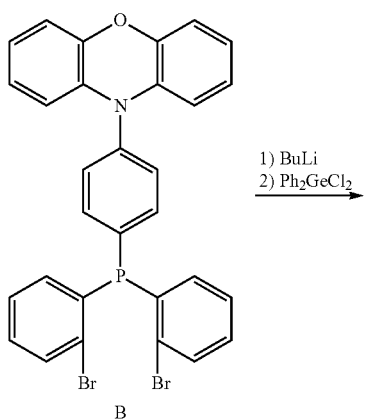

B

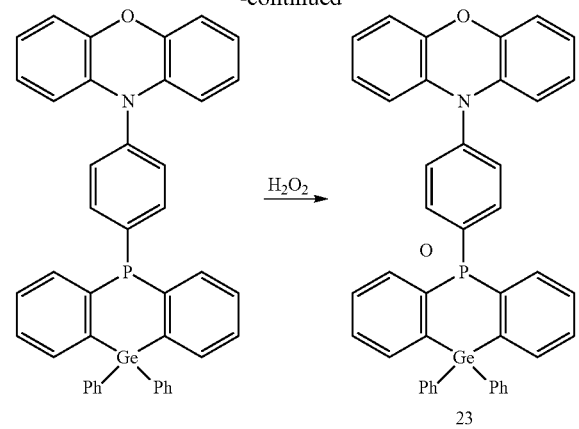

23

An intermediate of Compound B was synthesized by the same method described in the synthetic method of Compound 1. Under an argon (Ar) atmosphere, to a 200 ml three-neck flask, 6.01 g (10.0 mmol) of the intermediate of Compound B and 40 ml of an anhydrous THF solution were added, followed by stirring at about −78° C. 12.5 ml (20.0 mmol) of a 1.6 M n-BuLi hexane solution was added thereto dropwise, followed by stirring for about 2 hours. 10 ml of an anhydrous THF solution of 2.54 g (10.0 mmol) of diphenyldichlorogermane was added thereto dropwise, followed by stirring at about −78° C. for about 2 hours, and then, at room temperature for about 3 hours. After finishing the reaction, the reaction mixture was washed with water, and the organic phase thus obtained was concentrated to obtain a viscous material. The crude product thus obtained was separated by silica gel column chromatography to obtain a white solid compound.

To a 200 ml round-bottom flask, the white solid, 100 ml of dichloromethane, and 3 ml of a 35% hydrogen peroxide solution were added, followed by stirring for about 1 hour for performing reaction. After finishing the reaction, water was added, an organic layer was separately taken, and solvents were removed by distillation. The crude product thus obtained was separated by silica gel column chromatography to obtain 2.33 g (yield 34%) of Compound 23 as a yellow solid. The molecular weight of Compound 23 measured by FAB-MS was 685. In addition, the chemical shift values of the compound measured by $^1$H-NMR were 7.78-7.72 (4H), 7.61-7.50 (6H), 7.39-7.32 (12H), 7.14 (2H), 7.02-6.95 (6H). From the results, the yellow solid compound was identified as Compound 23.

12. Synthesis of Compound 50
(Synthesis of Compound J)

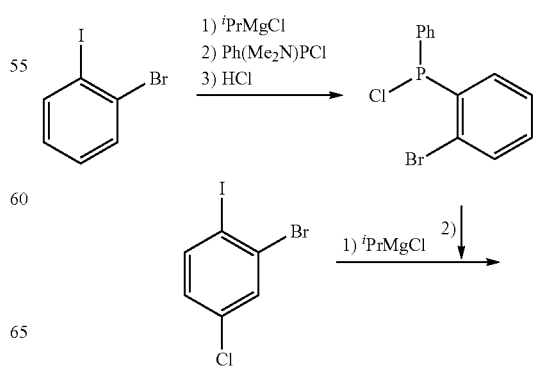

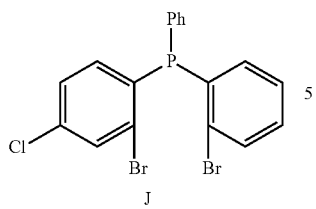

J

Under an argon (Ar) atmosphere, to a 1,000 ml three-neck flask, 22.5 ml (180.0 mmol) of 1-bromo-2-iodobenzene and 360 ml of an anhydrous THF solution were added and stirred at about −20° C. 180.0 ml (180.0 mmol) of a 1.0 M isopropylmagnesium chloride THF solution was added thereto dropwise, followed by stirring for about 1 hour. Then, 30.5 ml (180.0 mmol) of chloro(dimethylamino)phenylphosphine was added thereto dropwise, followed by stirring at about −78° C. for about 1 hour, and then, at room temperature for about 3 hours. After finishing the reaction, 180 ml (180.0 mmol) of a 1.0 M hydrogen chloride diethyl ether solution was added and stirred at room temperature for about 3 hours. The precipitate thus obtained was filtered to obtain an off-white solid compound. The compound was transported to a 1,000 ml three-neck flask, and the inside of the flask was substituted with an argon atmosphere. Then, 360 ml of an anhydrous THF solution was added and stirred at about −78° C.

Under an argon (Ar) atmosphere, to a 1,000 ml three-neck flask, 360 ml of an anhydrous THF solution of 57.2 g (180 mmol) of 2-bromo-4-chloro-1-iodobenzene was added, and then stirred at about −20° C. 180.0 ml (180.0 mmol) of a 1.0 M isopropylmagnesium chloride THF solution was added thereto dropwisely, followed by stirring for about 1 hour. The solution thus obtained was added to a THF solution of the white solid compound obtained by the first reaction dropwisely, followed by stirring at about −78° C. for about 1 hour, and then, at room temperature for about 3 hours. After finishing the reaction, the reaction mixture was washed with water. The organic phase thus obtained was concentrated to obtain a viscous material. The crude product thus obtained was separated by silica gel column chromatography to obtain 15.54 g (yield 19%) of Compound J as a white solid. The molecular weight of Compound J measured by FAB-MS was 452.

(Synthesis of Compound K)

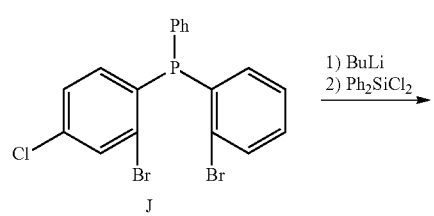

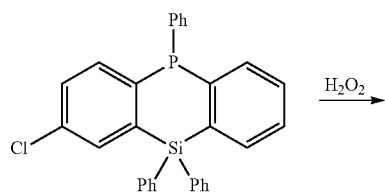

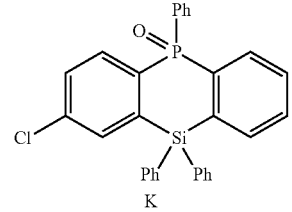

K

Under an argon (Ar) atmosphere, to a 500 ml three-neck flask, 11.9 g (26.3 mmol) of the intermediate of Compound J and 105 ml of an anhydrous THF solution were added, followed by stirring at about −78° C. 32.9 ml (52.6 mmol) of a 1.6 M n-BuLi hexane solution was added thereto dropwise, followed by stirring for about 2 hours. 27 ml of an anhydrous THF solution of 6.68 g (26.3 mmol) of diphenyldichlorosilane was added thereto dropwise, followed by stirring at about −78° C. for about 2 hours, and then, at room temperature for about 3 hours. After finishing the reaction, the reaction mixture was washed with water. The organic phase thus obtained was concentrated to obtain a viscous material. The crude product thus obtained was separated by silica gel column chromatography to obtain a white solid compound. To a 500 ml round-bottom flask, the white solid, 270 ml of dichloromethane, and 5 ml of a 35% hydrogen peroxide solution were added, followed by stirring at room temperature for about 1 hour for performing reaction. After finishing the reaction, water was added, an organic layer was separately taken, and solvents were removed by distillation. The crude product thus obtained was separated by silica gel column chromatography to obtain 6.86 g (yield 53%) of Compound K as a yellow solid. The molecular weight of Compound K measured by FAB-MS was 492.

(Synthesis of Compound 50)

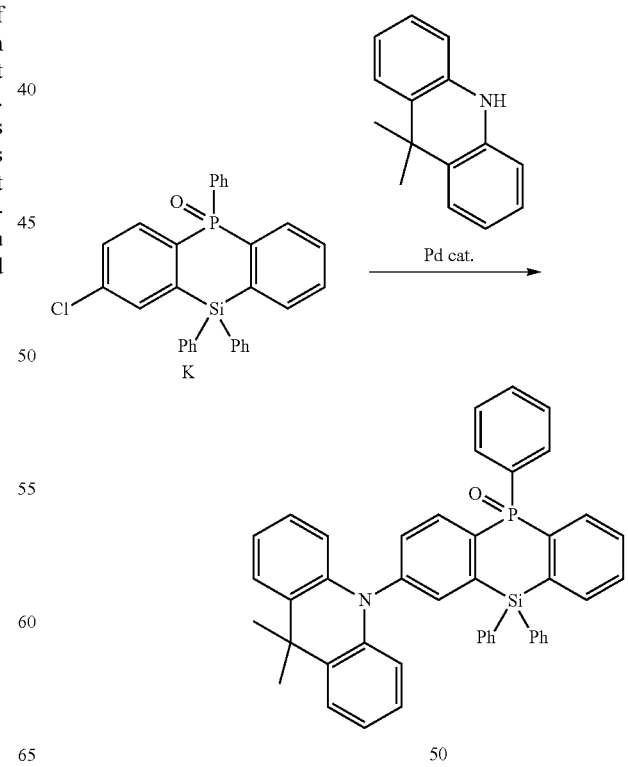

50

Under an argon atmosphere, to a 50 ml three-neck flask, 1.71 g (3.5 mmol) of the intermediate of Compound K, 0.73 g (3.5 mmol) of 9,9-dimethyl-9,10-dihydroacridine, 0.080 g (0.09 mmol) of Pd$_2$(dba)$_3$, 0.071 g (0.35 mmol) of (t-Bu)$_3$P, and 0.336 g (3.5 mmol) of NaO$^t$Bu were added, followed by stirring in 18 ml of a toluene solvent at about 120° C. for about 12 hours. After cooling in the air, water was added, an organic layer was separately taken, and solvents were evaporated under a reduced pressure. The crude product thus obtained was separated by silica gel column chromatography to obtain 1.58 g (yield 68%) of Compound 50 as a white solid. The molecular weight of Compound 50 measured by FAB-MS was 665. In addition, the chemical shift values of the compound measured by $^1$H-NMR were 7.89-7.75 (4H), 7.68-7.59 (3H), 7.54-7.36 (15H), 7.21-7.12 (6H), 6.95 (2H), 1.69 (6H). From the results, the white solid compound was identified as Compound 50.

13. Synthesis of Compound 52

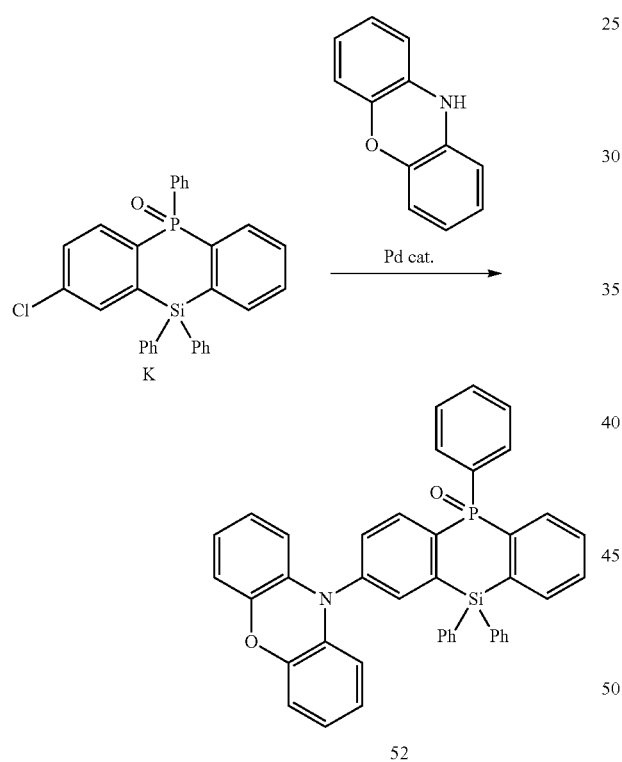

Under an argon atmosphere, to a 50 ml three-neck flask, 1.71 g (3.5 mmol) of the intermediate of Compound K, 0.64 g (3.5 mmol) of 10H-phenoxazine, 0.080 g (0.09 mmol) of Pd$_2$(dba)$_3$, 0.071 g (0.35 mmol) of (t-Bu)$_3$P, and 0.336 g (3.5 mmol) of NaOtBu were added, followed by stirring in 18 ml of a toluene solvent at about 120° C. for about 12 hours. After cooling in the air, water was added, an organic layer was separately taken, and solvents were evaporated under a reduced pressure. The crude product thus obtained was separated by silica gel column chromatography to obtain 1.59 g (yield 71%) of Compound 52 as a white solid. The molecular weight of Compound 52 measured by FAB-MS was 639. In addition, the chemical shift values of the compound measured by $^1$H-NMR were 7.89-7.75 (4H), 7.68-7.59 (3H), 7.54-7.36 (15H), 7.14 (2H), 7.03-6.94 (6H). From the results, the white solid compound was identified as Compound 52.

14. Synthesis of Compound 54

Under an argon atmosphere, to a 50 ml three-neck flask, 1.71 g (3.5 mmol) of the intermediate of Compound K, 1.26 g (3.5 mmol) of 2,7-dimethyl-10H-spiro[acridine-9,9'-fluorene], 0.080 g (0.09 mmol) of Pd$_2$(dba)$_3$, 0.071 g (0.35 mmol) of (t-Bu)$_3$P, and 0.336 g (3.5 mmol) of NaO$^t$Bu were added, followed by stirring in 18 ml of a toluene solvent at about 120° C. for about 12 hours. After cooling in the air, water was added, an organic layer was separately taken, and solvents were evaporated under a reduced pressure. The crude product thus obtained was separated by silica gel column chromatography to obtain 2.17 g (yield 76%) of Compound 54 as a white solid. The molecular weight of Compound 54 measured by FAB-MS was 815. In addition, the chemical shift values of the compound measured by $^1$H-NMR were 7.92-7.75 (6H), 7.57-7.36 (22H), 7.28 (2H), 7.14-7.03 (6H), 2.31 (6H). From the results, the white solid compound was identified as Compound 54.

15. Synthesis of Compound 51

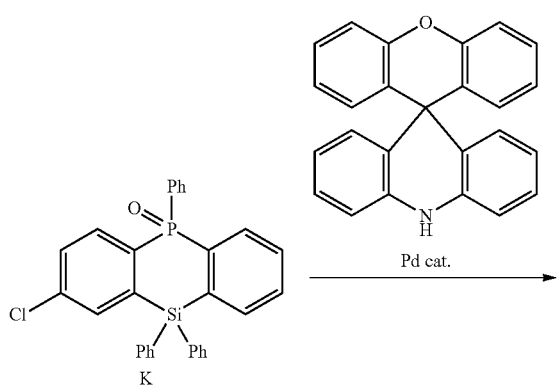

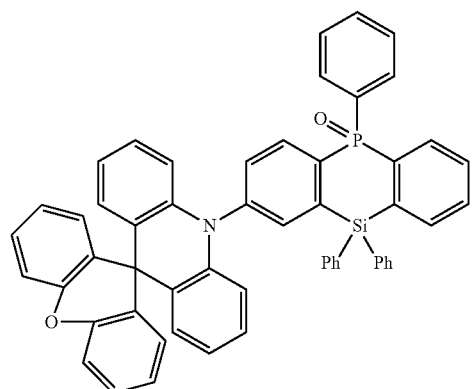

Under an argon atmosphere, to a 50 ml three-neck flask, 1.71 g (3.5 mmol) of the intermediate of Compound K, 1.22 g (3.5 mmol) of spiro[acridine-9(10H),9'-[9H]xanthene], 0.080 g (0.09 mmol) of $Pd_2(dba)_3$, 0.071 g (0.35 mmol) of $(t-Bu)_3P$, and 0.336 g (3.5 mmol) of $NaO^tBu$ were added, followed by stirring in 18 ml of a toluene solvent at about 120° C. for about 12 hours. After cooling in the air, water was added, an organic layer was separately taken, and solvents were evaporated under a reduced pressure. The crude product thus obtained was separated by silica gel column chromatography to obtain 2.25 g (yield 80%) of Compound 51 as a white solid. The molecular weight of Compound 51 measured by FAB-MS was 803. In addition, the chemical shift values of the compound measured by $^1$H-NMR were 7.89-7.75 (4H), 7.68-7.59 (3H), 7.54-7.36 (15H), 7.21-7.12 (10H), 7.03-6.93 (4H). From the results, the white solid compound was identified as Compound 51.

16. Synthesis of Compound 57
(Synthesis of Compound L)

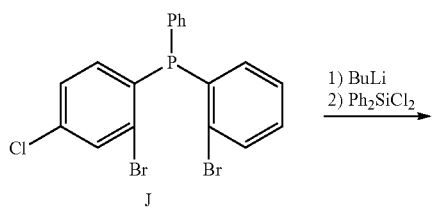

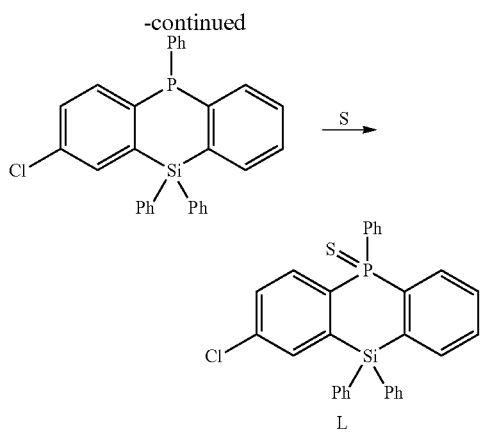

Under an argon (Ar) atmosphere, to a 200 ml three-neck flask, 3.64 g (8.0 mmol) of the intermediate of Compound J and 160 ml of an anhydrous THF solution were added, followed by stirring at about −78° C. 10.0 ml (16.0 mmol) of a 1.6 M n-BuLi hexane solution was added thereto dropwise, followed by stirring for about 2 hours. 8 ml of an anhydrous THF solution of 2.04 g (8.0 mmol) of diphenyldichlorosilane was added thereto dropwise, followed by stirring at about −78° C. for about 2 hours, and then, at room temperature for about 3 hours. After finishing the reaction, the reaction mixture was washed with water. The organic phase thus obtained was concentrated to obtain a viscous material. To a 500 ml round-bottom flask, the white solid, 80 ml of dichloromethane, and 0.257 g (8.0 mmol) of a sulfur powder were added, followed by stirring at room temperature for about 2 hours to perform reaction. After finishing the reaction, water was added, an organic layer was separately taken, and solvents were removed by distillation. The crude product thus obtained was separated by silica gel column chromatography to obtain 1.83 g (yield 45%) of Compound L as a yellow solid. The molecular weight of Compound L measured by FAB-MS was 508.

(Synthesis of Compound 57)

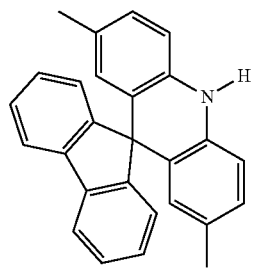

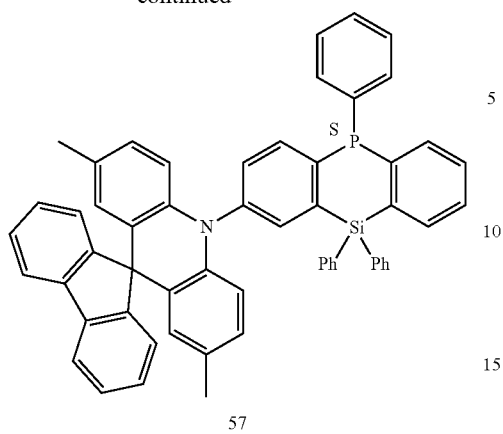

57

Under an argon atmosphere, to a 50 ml three-neck flask, 1.83 g (3.6 mmol) of the intermediate of Compound L, 1.30 g (3.6 mmol) of 2,7-dimethyl-10H-spiro[acridine-9,9'-fluorene], 0.082 g (0.09 mmol) of Pd$_2$(dba)$_3$, 0.073 g (0.36 mmol) of (t-Bu)$_3$P, and 0.346 g (3.6 mmol) of NaO$^t$Bu were added, followed by stirring in 18 ml of a toluene solvent at about 120° C. for about 12 hours. After cooling in the air, water was added, an organic layer was separately taken, and solvents were evaporated under a reduced pressure. The crude product thus obtained was separated by silica gel column chromatography to obtain 2.34 g (yield 78%) of Compound 57 as a white solid. The molecular weight of Compound 57 measured by FAB-MS was 831. In addition, the chemical shift values of the compound measured by $^1$H-NMR were 7.90 (2H), 7.55 (2H), 7.47-7.25 (26H), 7.13-7.04 (6H), 2.31 (6H). From the results, the white solid compound was identified as Compound 57.

17. Synthesis of Compound 75

(Synthesis of Compound M)

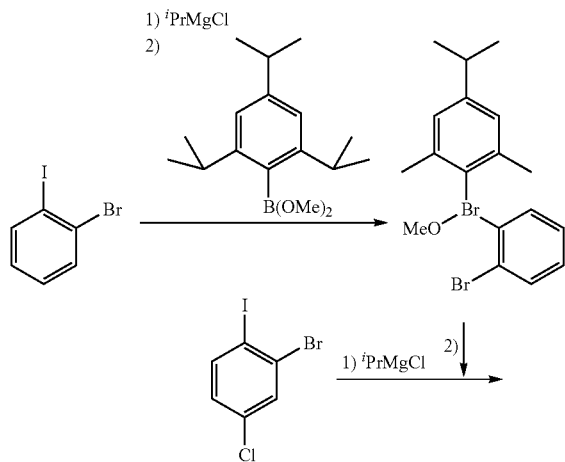

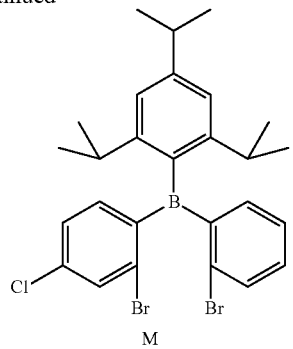

M

Under an argon (Ar) atmosphere, to a 1,000 ml three-neck flask, 20.0 ml (160.0 mmol) of 1-bromo-2-iodobenzene and 320 ml of an anhydrous THF solution were added and stirred at about −20° C. 160.0 ml (160.0 mmol) of a 1.0 M isopropylmagnesium chloride THF solution was added thereto dropwise, followed by stirring for about 1 hour. Then, 10.4 ml (96.0 mmol) of dimethyl (2,4,6-triisopropylphenyl)boronate was added thereto dropwise, followed by stirring at about −78° C. for about 1 hour, and then, at room temperature for about 3 hours.

Under an argon atmosphere, a 2,000 ml three-neck flask, 320 ml of an anhydrous THF solution of 50.8 g (160.0 mmol) of 2-bromo-4-chloro-1-iodobenzene was added and then stirred at about −20° C. 160.0 ml (160.0 mmol) of a 1.0 M isopropylmagnesium chloride THF solution was added thereto dropwise, followed by stirring for about 1 hour. The solution thus obtained was added to a solution obtained by the first reaction dropwise, followed by stirring and heating at about 80° C. for about 2 hours. After cooling in the air, water was added, an organic layer was separately taken, and solvents were evaporated under a reduced pressure. The crude product thus obtained was separated by silica gel column chromatography to obtain 17.1 g (yield 19%) of Compound M as a white solid. The molecular weight of Compound M measured by FAB-MS was 558.

(Synthesis of Compound N)

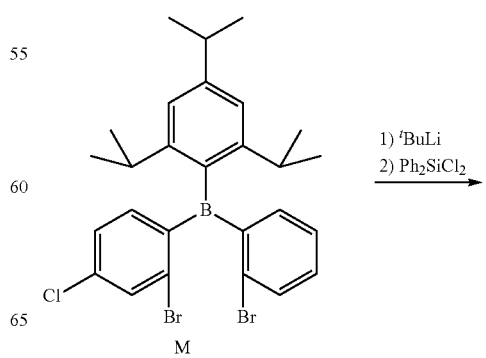

M

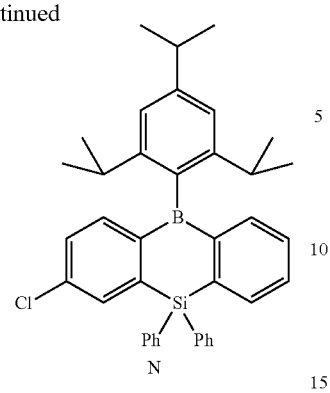

Under an argon (Ar) atmosphere, to a 1,000 ml three-neck flask, 17.1 g (30.4 mmol) of the intermediate of Compound M and 300 ml of an anhydrous THF solution were added, followed by stirring at about −78° C. 64.2 ml (122 mmol) of a 1.9 M t-BuLi pentane solution was added thereto dropwise, followed by stirring for about 2 hours and stirring while elevating the temperature to about −10° C. for about 3 hours. The temperature was decreased to about −78° C. again, and 31 ml of an anhydrous THF solution of 7.72 g (30.4 mmol) of diphenyldichlorosilane was added thereto dropwise, followed by stirring at about −78° C. for about 2 hours, and then, at room temperature for about 3 hours. After finishing the reaction, the reaction mixture was washed with water. The organic phase thus obtained was concentrated to obtain a viscous material. The crude product thus obtained was separated by silica gel column chromatography to obtain 10.32 g (yield 59%) of Compound N as a white solid. The molecular weight of Compound N measured by FAB-MS was 582.

(Synthesis of Compound 75)

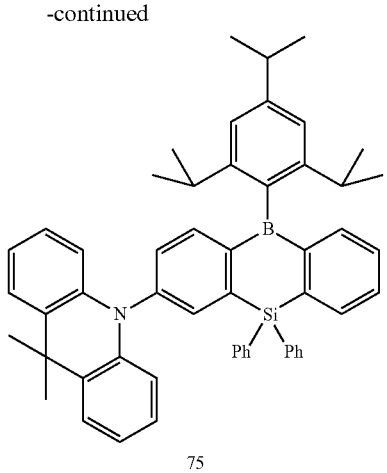

Under an argon atmosphere, to a 100 ml three-neck flask, 2.56 g (4.4 mmol) of the intermediate of Compound N, 0.92 g (4.4 mmol) of 9,9-dimethyl-9,10-dihydroacridine, 0.100 g (0.11 mmol) of $Pd_2(dba)_3$, 0.089 g (0.44 mmol) of $(t-Bu)_3P$, and 0.423 g (4.4 mmol) of NaO$^t$Bu were added, followed by stirring in 22 ml of a toluene solvent at about 120° C. for about 12 hours. After cooling in the air, water was added, an organic layer was separately taken, and solvents were evaporated under a reduced pressure. The crude product thus obtained was separated by silica gel column chromatography to obtain 2.46 g (yield 74%) of Compound 75 as a white solid. The molecular weight of Compound 75 measured by FAB-MS was 755. In addition, the chemical shift values of the compound measured by $^1$H-NMR were 7.87-7.79 (2H), 7.48-7.35 (14H), 7.31-7.26 (3H), 7.21-7.12 (6H), 6.95 (2H), 2.89-2.86 (3H), 1.69 (6H), 1.21-1.17 (18H). From the results, the white solid compound was identified as Compound 75.

18. Synthesis of Compound 76

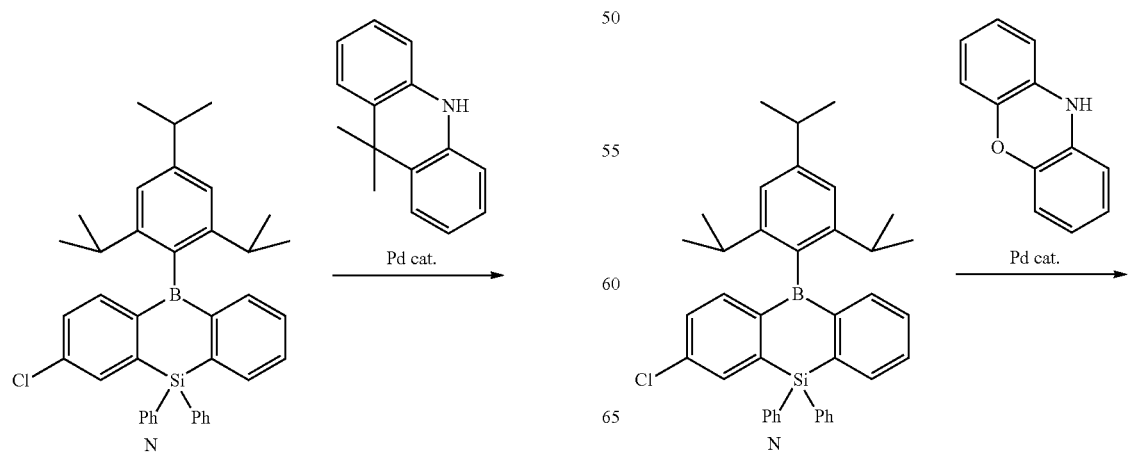

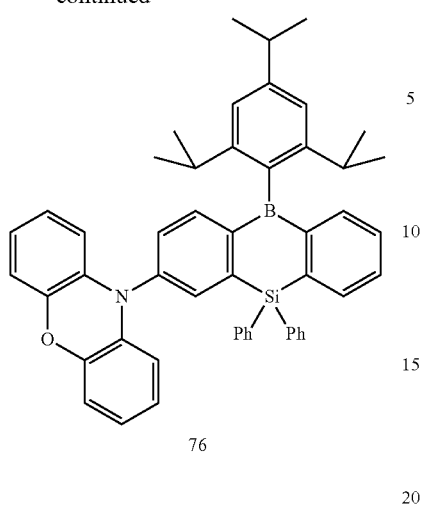

76

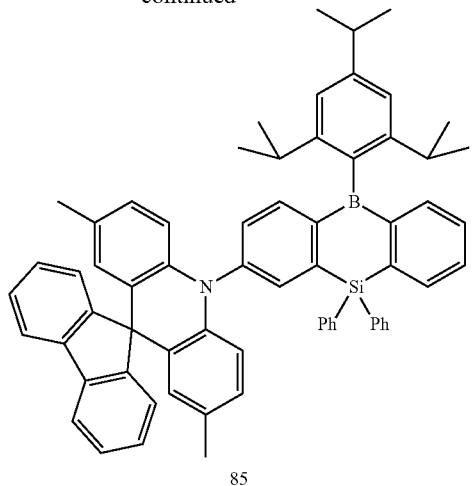

85

Under an argon atmosphere, to a 100 ml three-neck flask, 2.56 g (4.4 mmol) of the intermediate of Compound N, 0.81 g (4.4 mmol) of 10H-phenoxazine, 0.100 g (0.11 mmol) of Pd$_2$(dba)$_3$, 0.089 g (0.44 mmol) of (t-Bu)$_3$P, and 0.423 g (4.4 mmol) of NaOtBu were added, followed by stirring in 22 ml of a toluene solvent at about 120° C. for about 12 hours. After cooling in the air, water was added, an organic layer was separately taken, and solvents were evaporated under a reduced pressure. The crude product thus obtained was separated by silica gel column chromatography to obtain 2.50 g (yield 78%) of Compound 76 as a white solid. The molecular weight of Compound 76 measured by FAB-MS was 729. In addition, the chemical shift values of the compound measured by $^1$H-NMR were 7.87-7.79 (2H), 7.48-7.36 (14H), 7.31-7.26 (3H), 7.14 (2H), 7.03-6.94 (6H), 2.89-2.86 (3H), 1.21-1.17 (18H). From the results, the white solid compound was identified as Compound 76.

19. Synthesis of Compound 85

Under an argon atmosphere, to a 100 ml three-neck flask, 2.56 g (4.4 mmol) of the intermediate of Compound N, 1.58 g (4.4 mmol) of 2,7-dimethyl-10H-spiro[acridine-9,9'-fluorene], 0.100 g (0.11 mmol) of Pd$_2$(dba)$_3$, 0.089 g (0.44 mmol) of (t-Bu)$_3$P, and 0.423 g (4.4 mmol) of NaO$^t$Bu were added, followed by stirring in 22 ml of a toluene solvent at about 120° C. for about 12 hours. After cooling in the air, water was added, an organic layer was separately taken, and solvents were evaporated under a reduced pressure. The crude product thus obtained was separated by silica gel column chromatography to obtain 2.55 g (yield 64%) of Compound 85 as a white solid. The molecular weight of Compound 85 measured by FAB-MS was 905. In addition, the chemical shift values of the compound measured by $^1$H-NMR were 7.92-7.79 (4H), 7.55 (2H), 7.48-7.36 (16H), 7.31-7.25 (5H), 7.12 (2H), 7.05 (4H), 2.89-2.86 (3H), 2.31 (6H), 1.21-1.17 (18H). From the results, the white solid compound was identified as Compound 85.

20. Synthesis of Compound 78

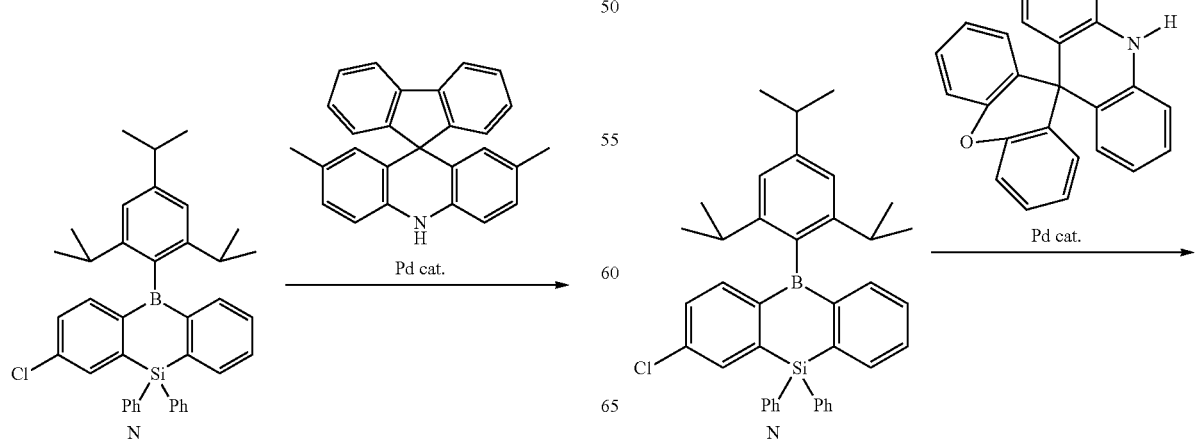

93
-continued

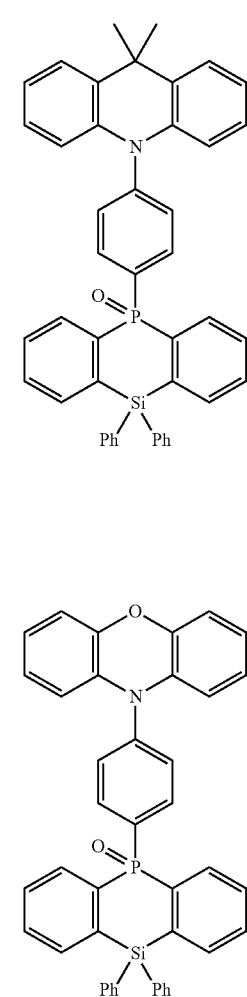

78

Under an argon atmosphere, to a 100 ml three-neck flask, 2.56 g (4.4 mmol) of the intermediate of Compound N, 1.53 g (4.4 mmol) of spiro[acridine-9(10H),9'-[9H]xanthene], 0.100 g (0.11 mmol) of $Pd_2(dba)_3$, 0.089 g (0.44 mmol) of $(t-Bu)_3P$, and 0.423 g (4.4 mmol) of $NaO^tBu$ were added, followed by stirring in 22 ml of a toluene solvent at about 120° C. for about 12 hours. After cooling in the air, water was added, an organic layer was separately taken, and solvents were evaporated under a reduced pressure. The crude product thus obtained was separated by silica gel column chromatography to obtain 3.18 g (yield 81%) of Compound 78 as a white solid. The molecular weight of Compound 78 measured by FAB-MS was 894. In addition, the chemical shift values of the compound measured by $^1$H-NMR were 7.86-7.80 (2H), 7.47-7.27 (19H), 7.20-7.13 (10H), 7.02-6.94 (4H), 2.89-2.86 (3H), 1.21-1.17 (18H). From the results, the white solid compound was identified as Compound 78.

The above-described synthetic examples are illustrations, and reaction conditions may be changed according to need. In addition, the compound according to an embodiment of the inventive concept may be synthesized so as to include various substituents by using methods and materials known in the art. By introducing various substituents into a core structure represented by Formula 1, properties appropriated for applying in an organic electroluminescence device may be attained.

Experimental Examples

Device Manufacturing Examples

Organic electroluminescence devices of Examples 1 to 20 were manufactured using each of Compounds 3, 1, 17, 18, 12, 14, 15, 21, 35, 36, 23, 50, 52, 54, 51, 57, 75, 76, 85 and 78 as a dopant material for an emission layer.

94
Example Compounds

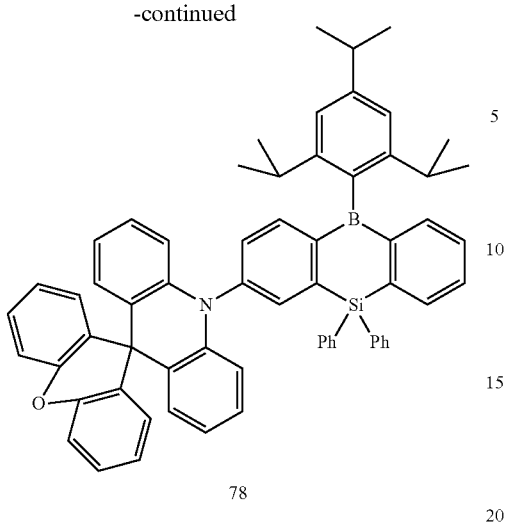

3

1

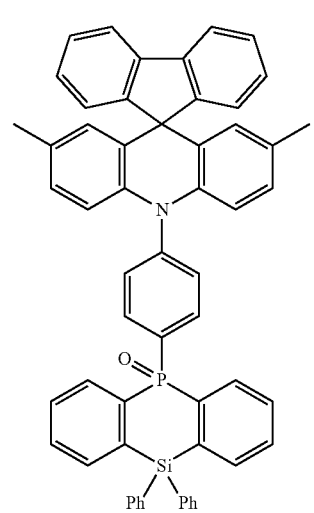

17

95
-continued
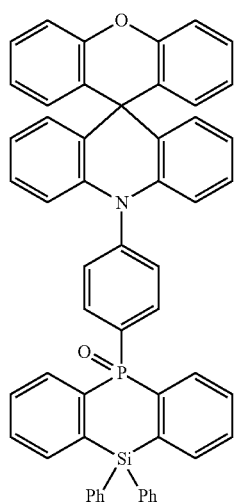
18
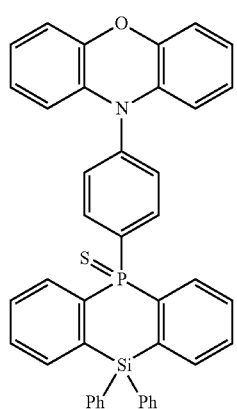
12
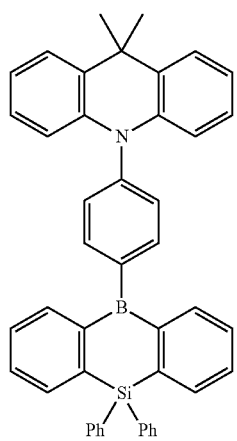
14
96
-continued
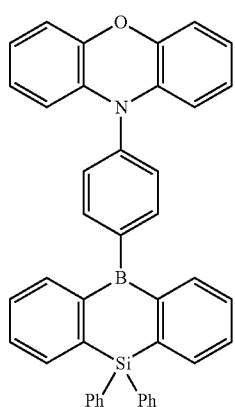
15
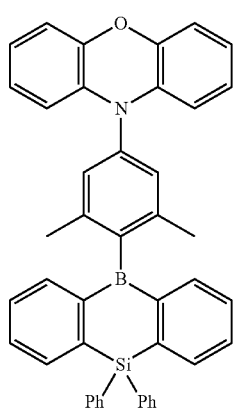
21
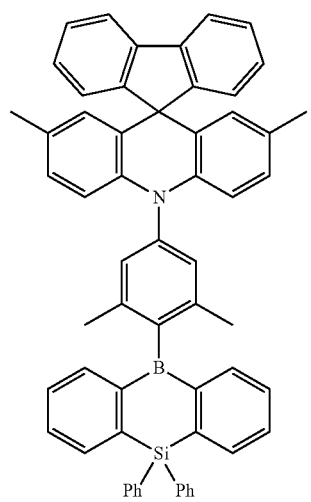
35

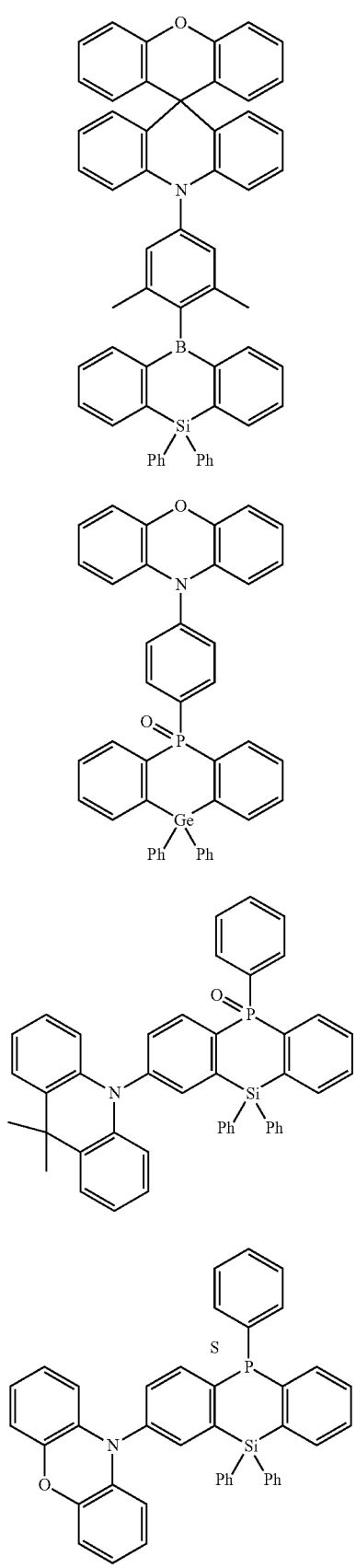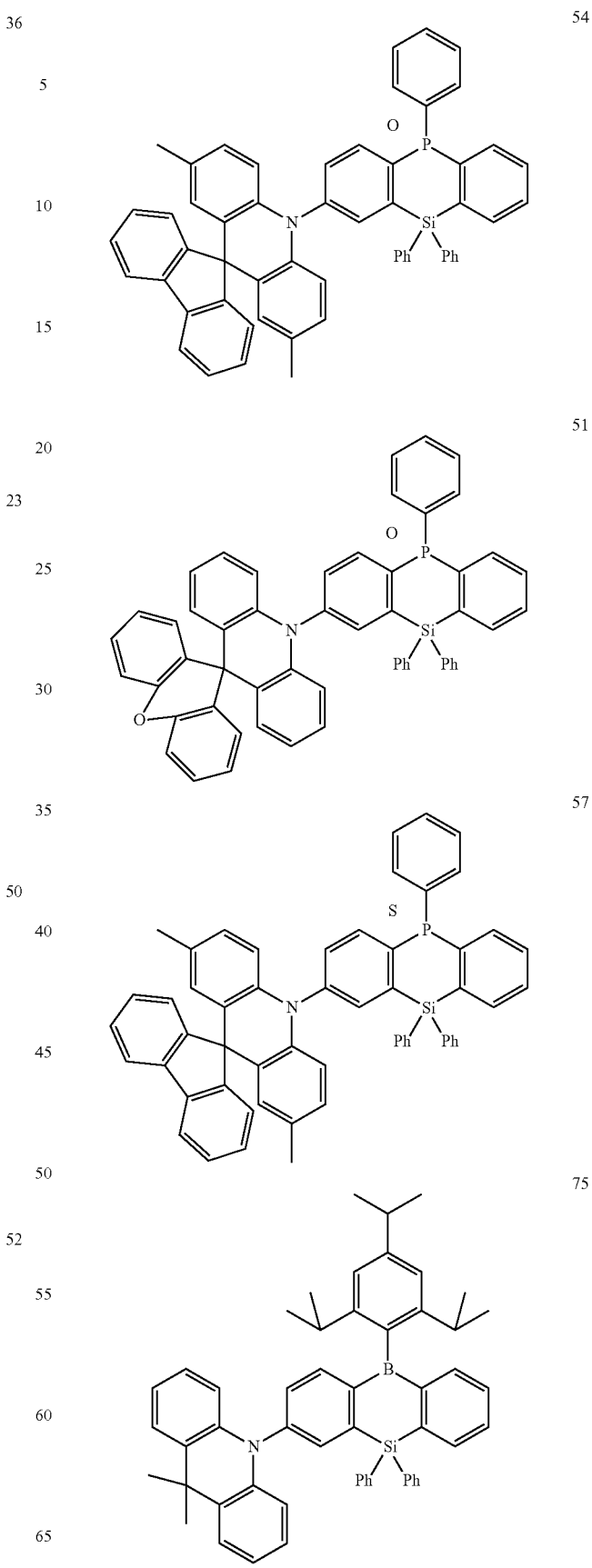

99
-continued
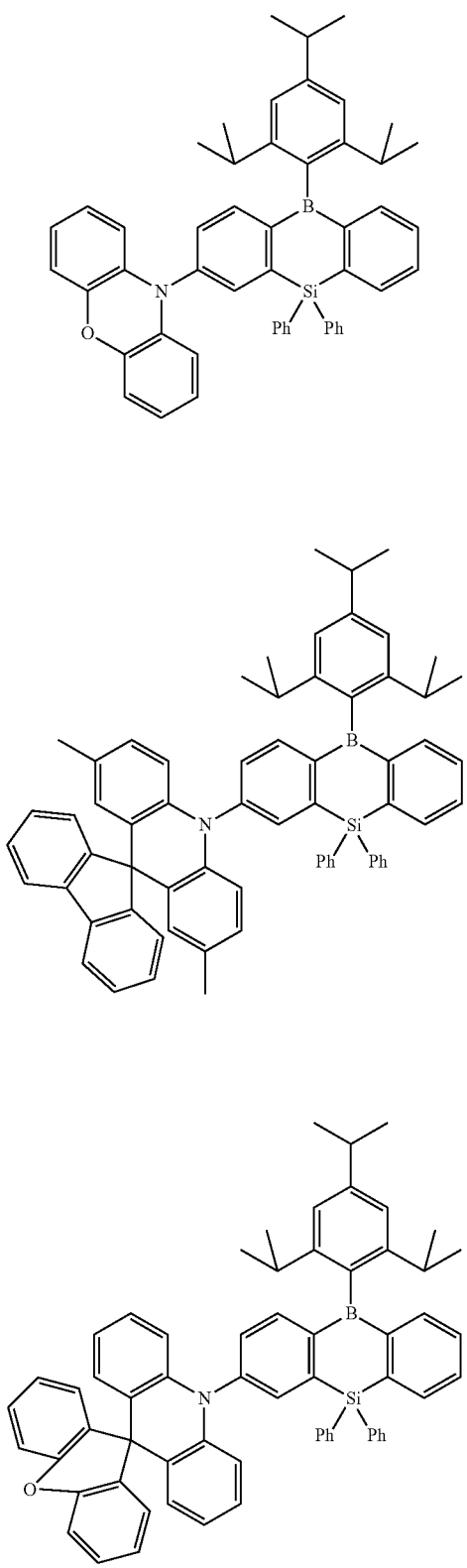
100
Comparative Compounds
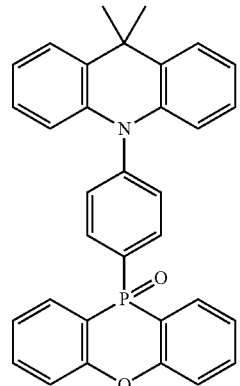
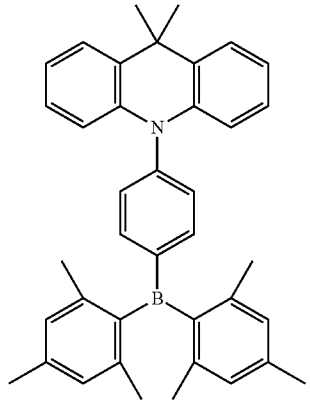
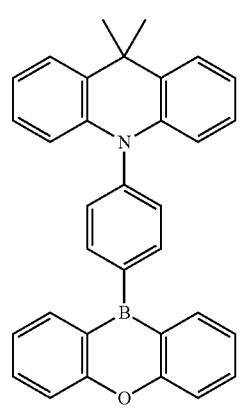
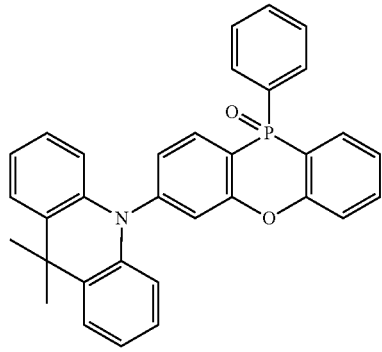
Using Comparative Compounds c1 to c5 as a dopant material for an emission layer, organic electroluminescence devices of Comparative Examples 1 to 5 were manufactured.

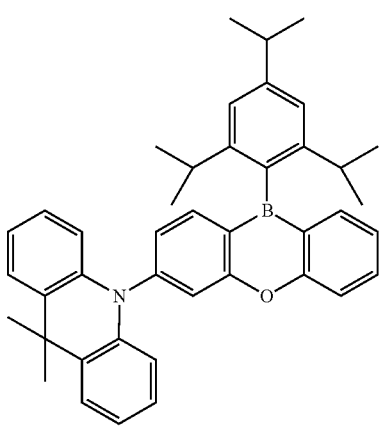

c5

Organic electroluminescence devices of Examples 1 to 20 and Comparative Examples 1 to 5 were manufactured by forming a first electrode using ITO to a thickness of about 120 nm, a hole injection layer using 1,4,5,8,9,11-hexaazatriphenylenehexacarbonitrile (HAT-CN) to a thickness of about 10 nm, a first hole transport layer using N,N'-di(1-naphthyl)-N,N'-diphenyl-(1,1'-biphenyl)-4,4'-diamine (NPD) to a thickness of about 80 nm, a second hole transport layer using 1,3-bis(N-carbazolyl)benzene (mCP) to a thickness of about 5 nm, an emission layer using bis[2-(diphenylphosphino)phenyl]ether oxide (DPEPO) doped with 20% each of the example compounds or the comparative compounds to a thickness of about 20 nm, a first electron transport layer using bis[2-(diphenylphosphino)phenyl]ether (DPEPO) oxide to a thickness of about 10 nm, a second electron transport layer using 1,3,5-tis(N-phenylbenzimidazole-2-yl)benzene (TPBi) to a thickness of about 30 nm, an electron injection layer using LiF to a thickness of about 0.5 nm, and a second electrode using Al to a thickness of about 100 nm. Each layer was formed by a deposition method in vacuum.

Experimental Examples

The emission efficiency and the emission life of each of the organic electroluminescence devices according to Examples 1 to 20 and Comparative Examples 1 to 5 were evaluated. The evaluation results are listed in Table 1 below. The emission efficiency and the emission life were represented by relative emission efficiency ratio and emission life ratio of each of the examples and the comparative examples when the emission efficiency and the emission life of the organic electroluminescence device of Comparative Example 1 were set to 100%.

TABLE 1

| Device manufacturing example | Dopant material of emission layer | Light-emitting wavelength (nm) | External quantum efficiency (%) | Life LT50 (h) |
| --- | --- | --- | --- | --- |
| Example 1 | Example Compound 3 | 450 | 9.2 | 11.4 |
| Example 2 | Example Compound 1 | 455 | 9.8 | 36.4 |
| Example 3 | Example Compound 17 | 452 | 10.5 | 51.4 |
| Example 4 | Example Compound 18 | 453 | 10.8 | 52.1 |
| Example 5 | Example Compound 12 | 463 | 13.2 | 58.4 |
| Example 6 | Example Compound 14 | 482 | 10.9 | 3.7 |
| Example 7 | Example Compound 15 | 490 | 11.4 | 4.8 |
| Example 8 | Example Compound 21 | 487 | 14.4 | 10.9 |
| Example 9 | Example Compound 35 | 482 | 13.8 | 12.8 |
| Example 10 | Example Compound 36 | 484 | 14.6 | 11.9 |
| Example 11 | Example Compound 23 | 454 | 14.9 | 37.9 |
| Example 12 | Example Compound 50 | 460 | 10.9 | 19.8 |
| Example 13 | Example Compound 52 | 466 | 12.8 | 39.0 |
| Example 14 | Example Compound 54 | 464 | 14.7 | 29.4 |
| Example 15 | Example Compound 51 | 465 | 14.2 | 52.0 |
| Example 16 | Example Compound 57 | 468 | 14.4 | 22.6 |
| Example 17 | Example Compound 75 | 478 | 13.8 | 6.7 |
| Example 18 | Example Compound 76 | 487 | 15.2 | 10.8 |
| Example 19 | Example Compound 85 | 482 | 14.7 | 11.9 |
| Example 20 | Example Compound 78 | 484 | 15.9 | 19.1 |
| Comparative Example 1 | Comparative Compound c1 | 448 | 4.6 | 3.0 |
| Comparative Example 2 | Comparative Compound c2 | 498 | 6.3 | 2.5 |
| Comparative Example 3 | Comparative Compound c3 | 473 | 3.1 | 0.6 |
| Comparative Example 4 | Comparative Compound c4 | 452 | 7.8 | 2.8 |
| Comparative Example 5 | Comparative Compound c5 | 472 | 8.3 | 1.7 |

Referring to Table 1, Examples 1 to 20 showed increased emission efficiency and life when compared to those of Comparative Examples 1 to 5. More particularly, Examples 1 to 20 emitted light with similar wavelength as Comparative Examples 1 to 5, which include dopant materials with similar structures, and showed increased emission efficiency and device life.

The Example Compounds included in Examples 1 to 20 have a condensed structure via crosslinking a polycycle which is an electron acceptor via Si or Ge. Due to such a structure, the difference of the lowest triplet energy level value and the lowest singlet energy level value of the polycyclic compound represented by Formula 1 is decreased, and intersystem crossing of singlet-triplet may be promoted. Accordingly, an organic electroluminescence device using each of the Example Compounds as a dopant material may efficiently emit thermally activated delayed fluorescence (TADF) without loss of the energy of triplet excitons. Accordingly, Examples 1 to 5 may secure high emission efficiency and long life.

Comparative Compounds c1, c3, c4 and c5 correspond to Formula 1 where X is O, that is, correspond to a case of crosslinking via an oxygen atom. Example Compounds correspond to Formula 1 where X is Si or Ge, and in this case, electron accepting properties of an electron accepting group become strong. Accordingly, if connected with an electron donating part, overlap of HOMO and LUMO of a molecule may be further reduced, and difference between singlet-triplet energy levels may be further reduced. As a result, reverse intersystem crossing may be promoted. Therefore, Examples 1 to 20 achieved improved efficiency and life when compared to those of Comparative Examples 1, 3, 4 and 5.

Comparative Compounds c2 and c3 have a structure including an electron acceptor containing boron. In Comparative Compound c2, a ring included in an electron acceptor does not have a crosslinked structure, and HOMO and LUMO of a molecule may be insufficiently separated, and difference between singlet-triplet energy levels may not be sufficiently reduced. As a result, the possibility of reverse intersystem crossing between singlet-triplet may be reduced when compared to the examples. Therefore, Comparative Example 2 showed inferior efficiency and shorter life than Examples 1 to 20.

The organic electroluminescence device according to an embodiment of the inventive step has excellent efficiency.

The organic electroluminescence device according to an embodiment of the inventive step may achieve long life.

The polycyclic compound according to an embodiment of the inventive concept may be applied to an organic electroluminescence device and may contribute to high efficiency and long life.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. An organic electroluminescence device, comprising:
a first electrode;
a hole transport region on the first electrode;
an emission layer on the hole transport region;
an electron transport region on the emission layer; and
a second electrode on the electron transport region,
wherein the first electrode and the second electrode each independently comprise at least one selected from Ag, Mg, Cu, Al, Pt, Pd, Au, Ni, Nd, Ir, Cr, Li, Ca, LiF/Ca, LiF/Al, Mo, Ti, In, Sn, and Zn, a compound of two or more thereof, a mixture of two or more thereof, or an oxide thereof, and
wherein the emission layer comprises a polycyclic compound represented by Formula 1:

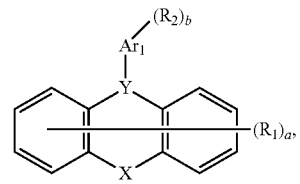

[Formula 1]

wherein in Formula 1,
Y is B or P=O,
$Ar_1$ is a substituted or unsubstituted aryl group having 6 to 30 carbon atoms for forming a ring, or a substituted or unsubstituted heteroaryl group having 2 to 30 carbon atoms for forming a ring,
each of $R_1$ and $R_2$ is independently a hydrogen atom, a deuterium atom, a halogen atom, a substituted or unsubstituted amine group, a substituted or unsubstituted silyl group, a substituted or unsubstituted boryl group, a substituted or unsubstituted aralkyl group having 6 to 30 carbon atoms, a substituted or unsubstituted aryloxy group having 6 to 30 carbon atoms, a substituted or unsubstituted arylthio group having 6 to 30 carbon atoms, a substituted or unsubstituted phosphine group, a substituted or unsubstituted phosphine oxide group, a substituted or unsubstituted phosphine sulfide group, a substituted or unsubstituted alkyl group having 1 to 20 carbon atoms, a substituted or unsubstituted aryl group having 6 to 30 carbon atoms for forming a ring, or a substituted or unsubstituted heteroaryl group having 2 to 30 carbon atoms for forming a ring, or is optionally combined with an adjacent group to form a hydrocarbon ring or a heterocycle, provided that at least one of $R_1$ or $R_2$ is $NAr_2Ar_3$,
$Ar_2$ and $Ar_3$ are each independently a substituted or unsubstituted aryl group having 6 to 30 carbon atoms for forming a ring, where $Ar_2$ and $Ar_3$ are optionally combined with each other to form a heterocyclic ring,
X is $SiR_3R_4$, or $GeR_5R_6$,
each of $R_3$ to $R_6$ is independently a substituted or unsubstituted alkyl group having 1 to 20 carbon atoms, a substituted or unsubstituted aryl group having 6 to 30 carbon atoms for forming a ring, or a substituted or unsubstituted heteroaryl group having 2 to 30 carbon atoms for forming a ring,
"a" is an integer between 0 and 8, inclusive,
"b" is an integer between 0 and 5, inclusive,
a+b≠0,
if $R_1$ is $NAr_2Ar_3$, "a" is an integer between 1 and 8, inclusive, and
if $R_2$ is $NAr_2Ar_3$, "b" is an integer between 1 and 5, inclusive.

2. An organic electroluminescence device comprising:
a first electrode;
a hole transport region on the first electrode;
an emission layer on the hole transport region;
an electron transport region on the emission layer; and
a second electrode on the electron transport region, wherein the first electrode and the second electrode each independently comprise at least one selected from Ag, Mg, Cu, Al, Pt, Pd, Au, Ni, Nd, Ir, Cr, Li, Ca, LiF/Ca, LiF/Al, Mo, Ti, In, Sn, and Zn, a compound of two or more thereof, a mixture of two or more thereof, or an oxide thereof, and wherein the emission layer comprises a polycyclic compound represented by Formula 1:

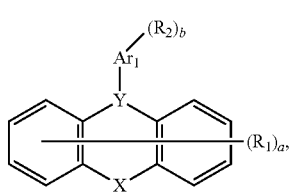

[Formula 1]

wherein in Formula 1,
Y is B, P=O, or P=S,
$Ar_1$ is a substituted or unsubstituted aryl group having 6 to 30 carbon atoms for forming a ring, or a substituted or unsubstituted heteroaryl group having 2 to 30 carbon atoms for forming a ring,
$R_1$ is a hydrogen atom, a deuterium atom, a halogen atom, a substituted or unsubstituted amine group, a substituted or unsubstituted silyl group, a substituted or unsubstituted boryl group, a substituted or unsubstituted aralkyl group having 6 to 30 carbon atoms, a substituted or unsubstituted aryloxy group having 6 to 30 carbon atoms, a substituted or unsubstituted arylthio group having 6 to 30 carbon atoms, a substituted or unsubstituted phosphine group, a substituted or unsubstituted phosphine oxide group, a substituted or unsubstituted phosphine sulfide group, a substituted or unsubstituted alkyl group having 1 to 20 carbon atoms, a substituted or unsubstituted aryl group having 6 to 30 carbon atoms for forming a ring, or a substituted or unsubstituted heteroaryl group having 2 to 30 carbon atoms for forming a ring, or is optionally combined with an adjacent group to form a hydrocarbon ring or a heterocycle,
X is $SiR_3R_4$ or $GeR_5R_6$,
each of $R_3$ to $R_6$ is independently a substituted or unsubstituted alkyl group having 1 to 20 carbon atoms, a substituted or unsubstituted aryl group having 6 to 30 carbon atoms for forming a ring, or a substituted or unsubstituted heteroaryl group having 2 to 30 carbon atoms for forming a ring,
"a" is an integer between 0 and 8, inclusive,
"b" is an integer between 0 and 5, inclusive,
a+b≠0, and
$R_2$ is represented by Formula 2:

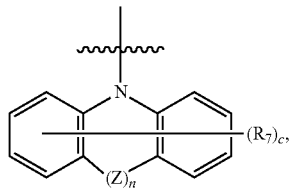

[Formula 2]

wherein in Formula 2,
Z is a direct linkage, O, S, Se, $NAr_{11}$, $POAr_{12}$, $CAr_{14}Ar_{15}$, $SiAr_{16}Ar_{17}$, $GeAr_{18}Ar_{19}$, or $BAr_{20}$,
n is 0 or 1, each one of $Ar_{11}$ to $Ar_{10}$ is independently a substituted or unsubstituted alkyl group having 1 to 20 carbon atoms, a substituted or unsubstituted aryl group having 6 to 30 carbon atoms for forming a ring, or a substituted or unsubstituted heteroaryl group having 2 to 30 carbon atoms for forming a ring, or is optionally combined with an adjacent group to form a hydrocarbon ring or a heterocycle, $R_7$ is a hydrogen atom, a deuterium atom, a halogen atom, a substituted or unsubstituted amine group, a substituted or unsubstituted alkyl group having 1 to 20 carbon atoms, a substituted or unsubstituted aryl group having 6 to 30 carbon atoms for forming a ring, or a substituted or unsubstituted heteroaryl group having 2 to 30 carbon atoms for forming a ring, and "c" is an integer between 0 and 8, inclusive.

3. The organic electroluminescence device of claim 2, wherein "b" is 1.

4. The organic electroluminescence device of claim 2, wherein
"a" is 1 or 2.

5. The organic electroluminescence device of claim 2, wherein the polycyclic compound represented by Formula 1 is represented by at least one of Formulae 3-1 to 3-3:

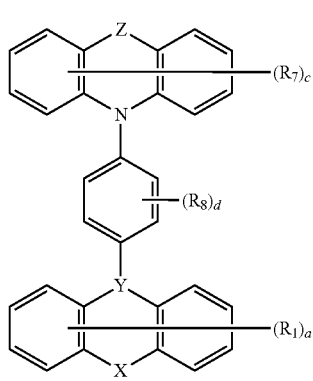

[Formula 3-1]

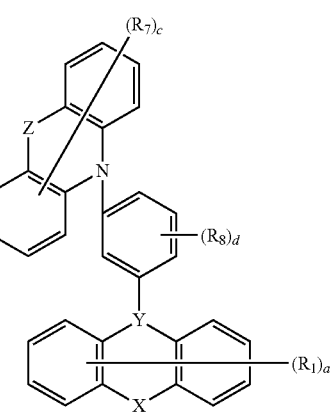

[Formula 3-2]

107

-continued

[Formula 3-3]

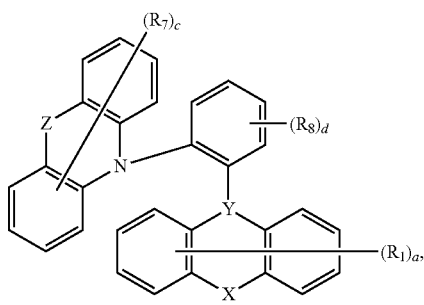

wherein in Formulae 3-1 to 3-3, $R_8$ is a hydrogen atom, a deuterium atom, a halogen atom, a substituted or unsubstituted alkyl group having 1 to 20 carbon atoms, a substituted or unsubstituted aryl group having 6 to 30 carbon atoms for forming a ring, or a substituted or unsubstituted heteroaryl group having 2 to 30 carbon atoms for forming a ring, "d" is an integer between 0 and 4, inclusive, and $R_1$, $R_7$, "a", "c", X, Y, and Z are the same as defined above.

6. The organic electroluminescence device of claim 1, wherein the polycyclic compound represented by Formula 1 is represented by one of Formulae 4-1 to 4-4:

[Formula 4-1]

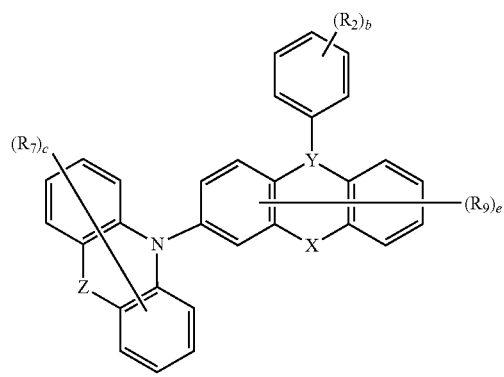

[Formula 4-2]

108

-continued

[Formula 4-3]

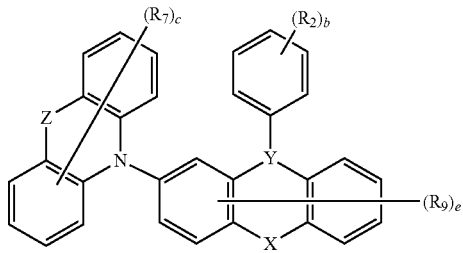

[Formula 4-4]

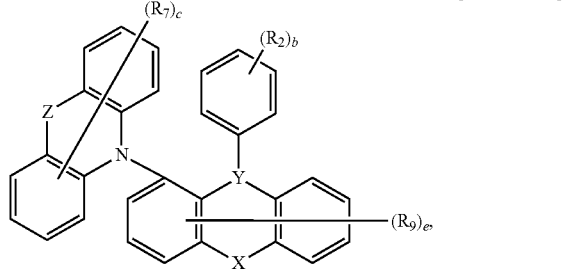

wherein in Formulae 4-1 to 4-4, each one of $R_2$ and $R_9$ is independently a hydrogen atom, a deuterium atom, a halogen atom, a substituted or unsubstituted alkyl group having 1 to 20 carbon atoms, a substituted or unsubstituted aryl group having 6 to 30 carbon atoms for forming a ring, or a substituted or unsubstituted heteroaryl group having 2 to 30 carbon atoms for forming a ring, or is optionally combined with an adjacent group to form a hydrocarbon ring or a heterocycle, "e" is an integer between 0 and 7, inclusive, and $R_7$, "b", "c", X, Y, and Z are the same as defined above.

7. The organic electroluminescence device of claim 2, wherein $R_2$ is represented by one of Formulae 2-1 to 2-14:

[Formula 2-1]

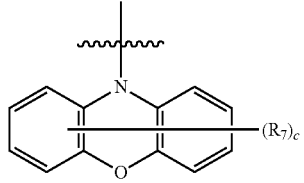

[Formula 2-2]

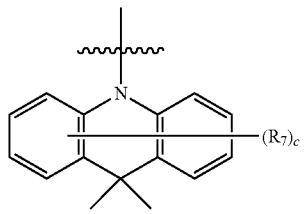

[Formula 2-3]

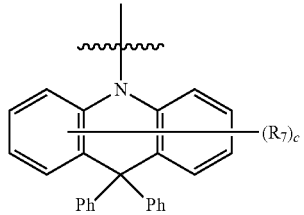

[Formula 2-4]
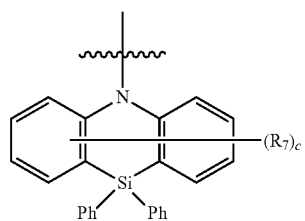

[Formula 2-5]
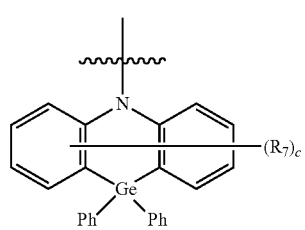

[Formula 2-6]
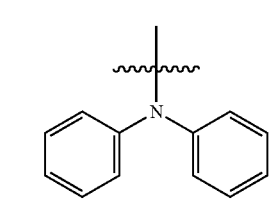

[Formula 2-7]
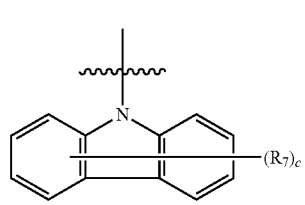

[Formula 2-8]
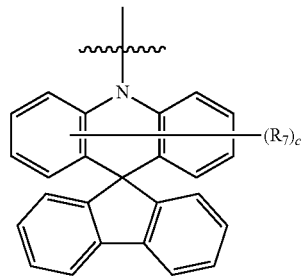

[Formula 2-9]
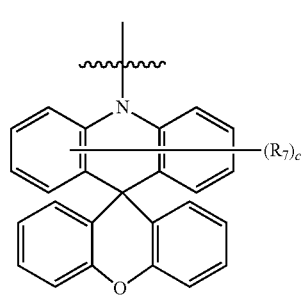

[Formula 2-10]
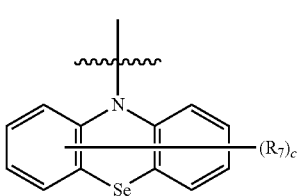

[Formula 2-11]
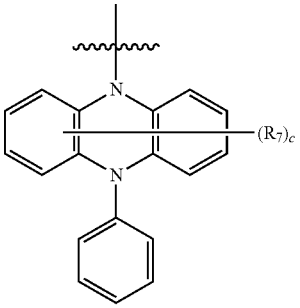

[Formula 2-12]
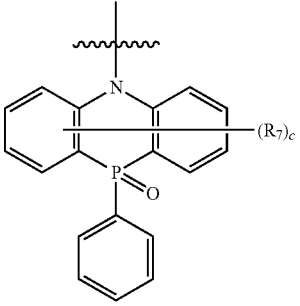

[Formula 2-13]
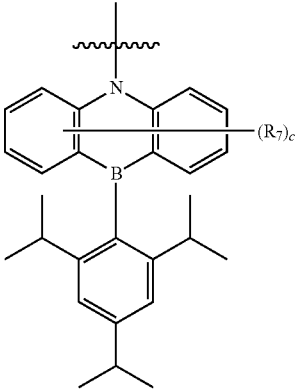

[Formula 2-14]
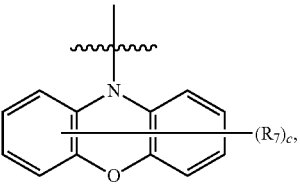

wherein in Formulae 2-1 to 2-14,
$R_7$, and "c" are the same as defined above.

8. The organic electroluminescence device of claim 1, wherein each of $R_3$ to $R_6$ is independently a substituted or unsubstituted alkyl group having 3 to 10 carbon atoms, or a substituted or unsubstituted phenyl group.

9. The organic electroluminescence device of claim 1, wherein
the emission layer comprises a host and a dopant, and
the dopant comprises the polycyclic compound represented by Formula 1.

10. The organic electroluminescence device of claim 1, wherein the polycyclic compound represented by Formula 1 has an energy difference ($\Delta E_{ST}$) between the lowest singlet energy level ($S_1$) and the lowest triplet energy level ($T_1$) of 0.2 eV or less.

11. The organic electroluminescence device of claim 1, wherein the maximum light-emitting wavelength of the emission layer is 510 nm or less.
12. The organic electroluminescence device of claim 2, wherein the polycyclic compound represented by Formula 1 is at least one selected from compounds represented in Compound Group 1:
[Compound Group 1]
1
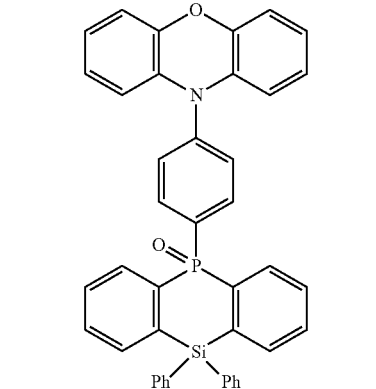
2
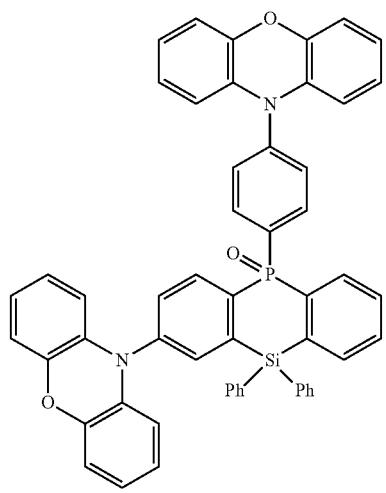
3
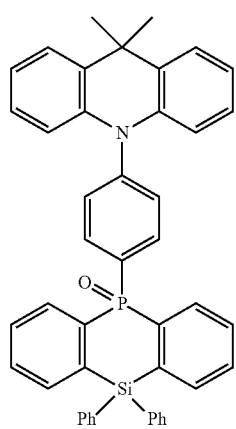
4
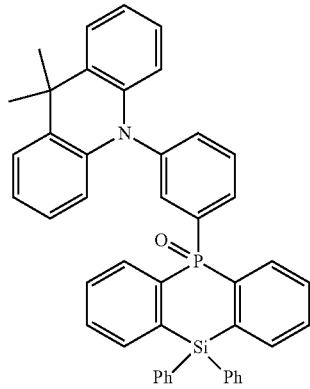
5
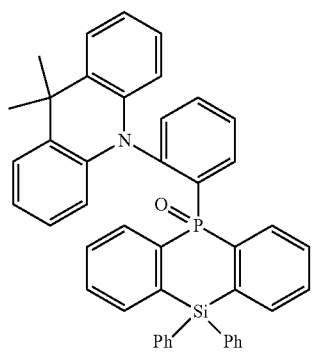
6
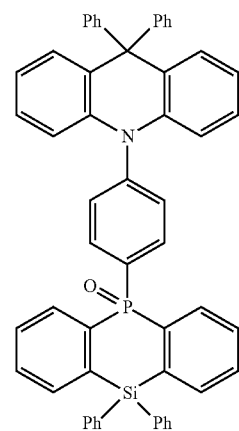
7
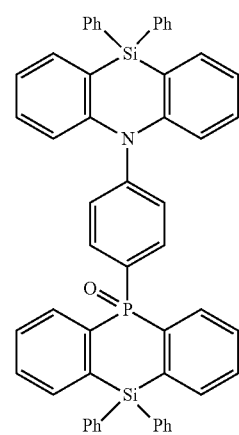

8
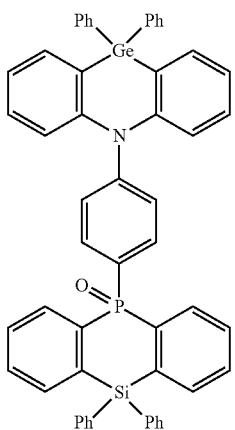
9
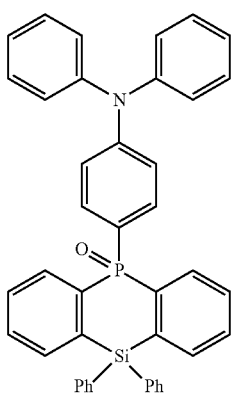
10
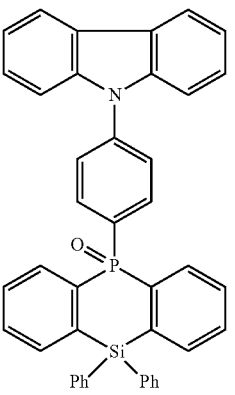
11
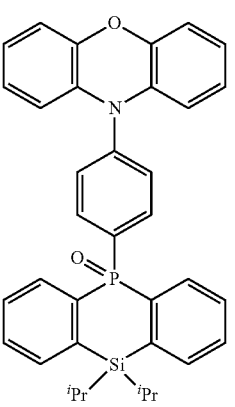
12
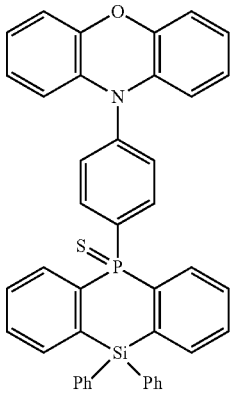
13
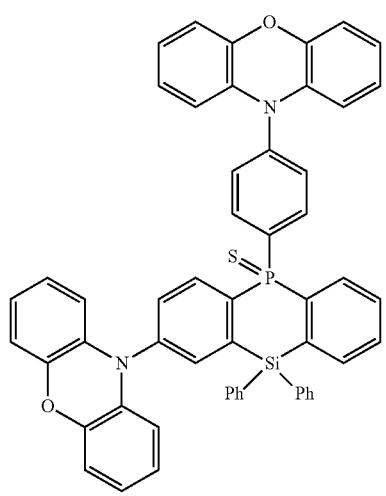
14
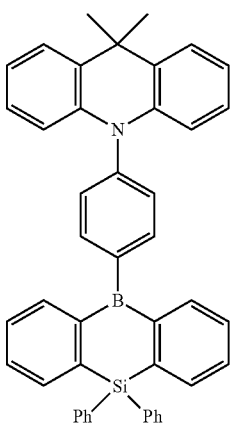

115
-continued
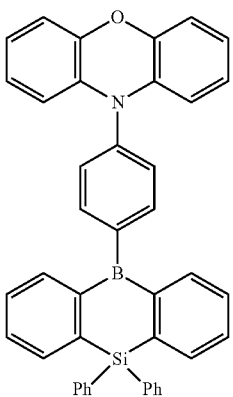
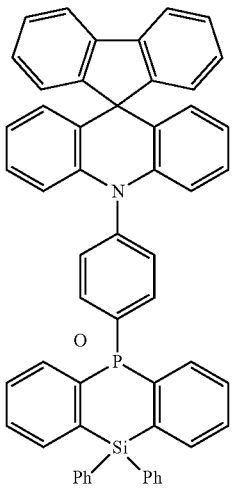
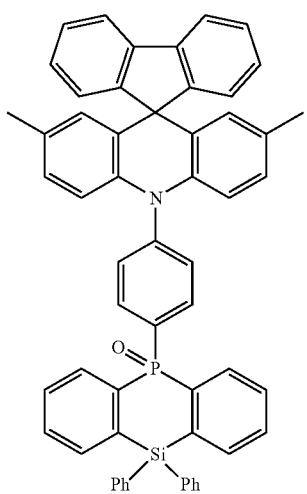
116
-continued
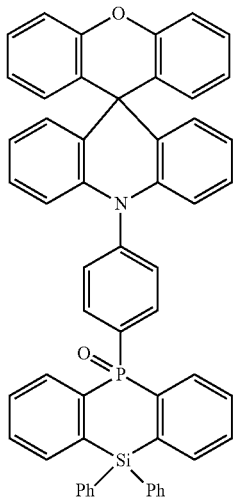
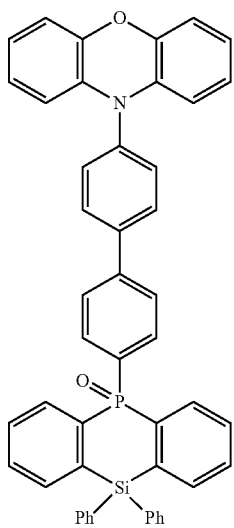
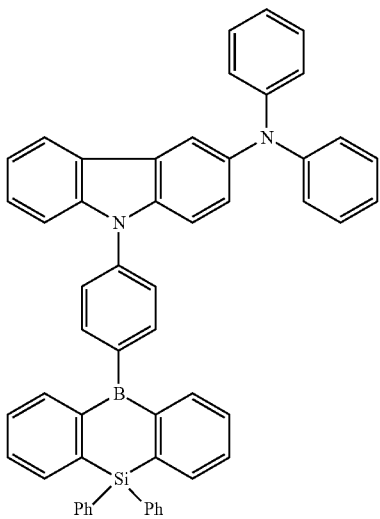

21
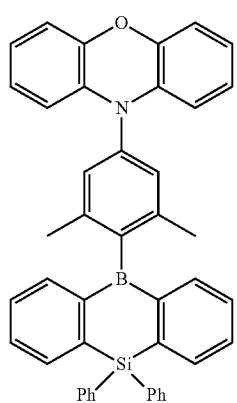
22
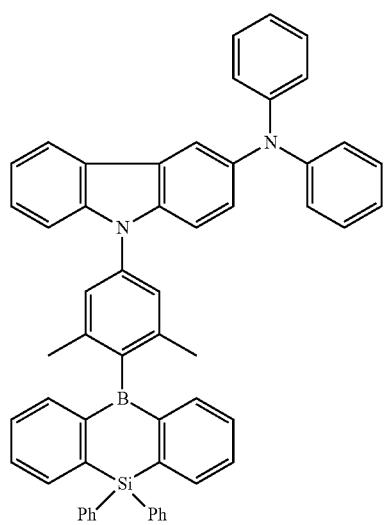
23
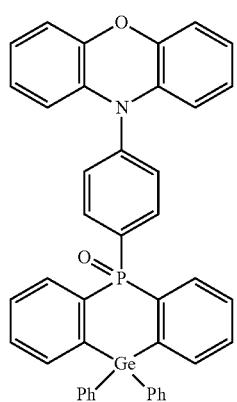
24
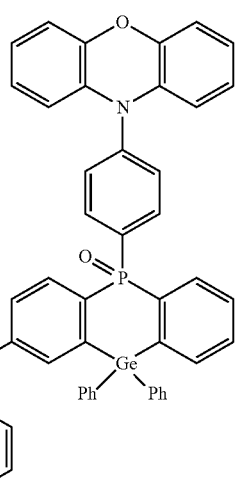
25
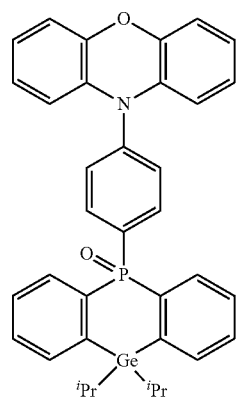
26
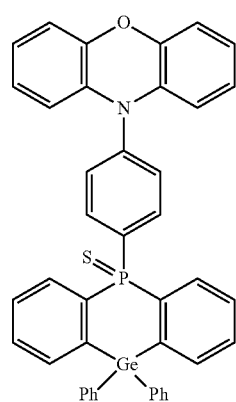

27
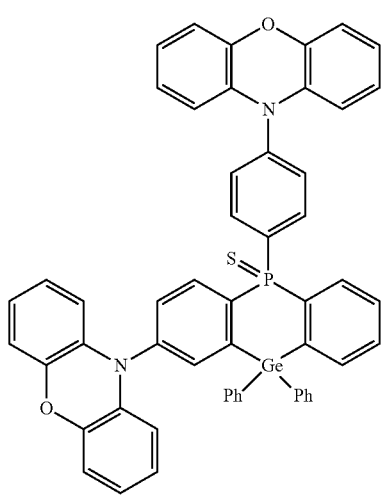
28
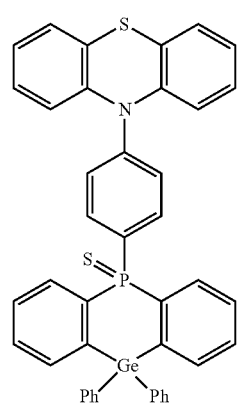
29
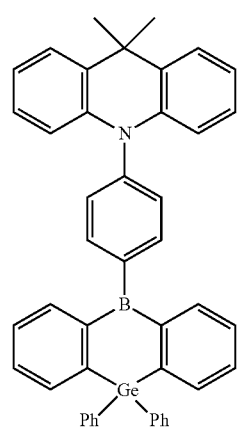
30
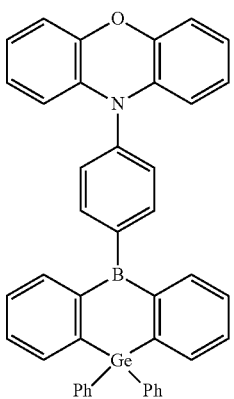
31
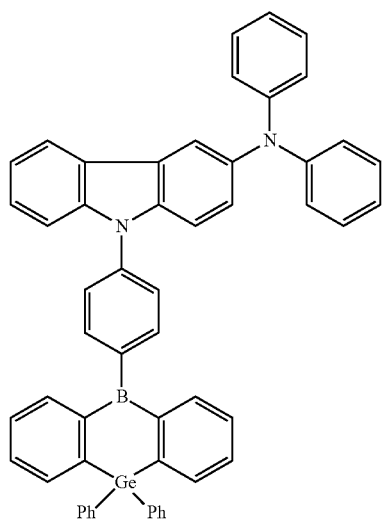
32
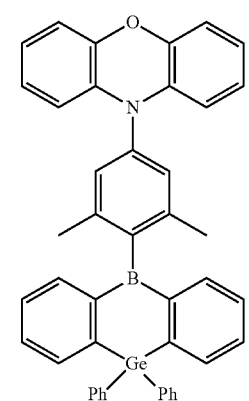

33
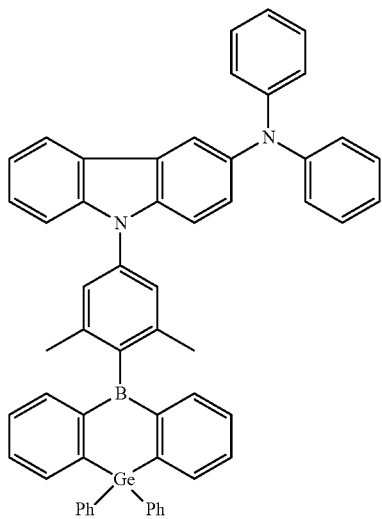
34
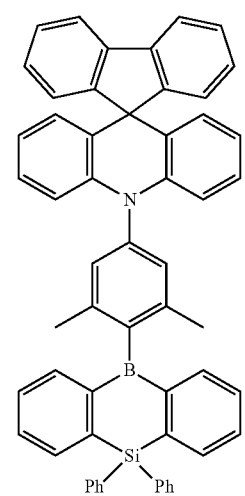
35
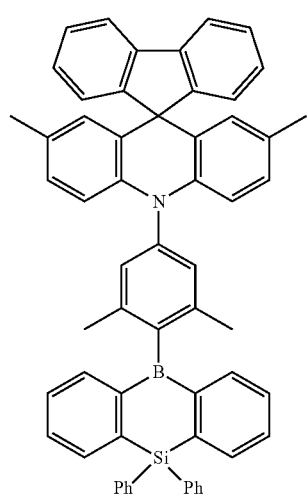
36
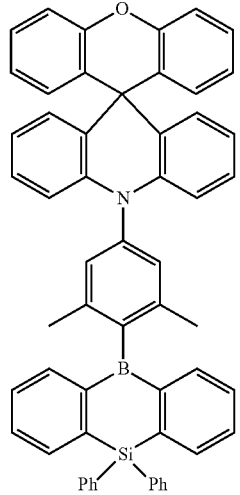
37
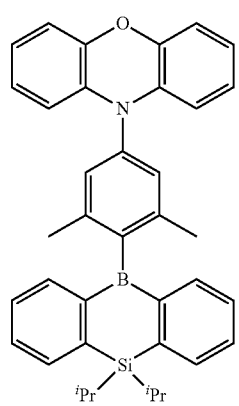
38
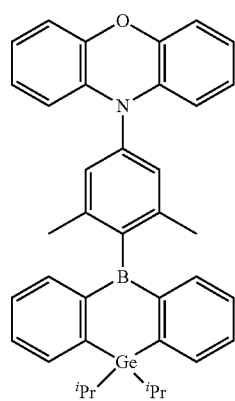

39
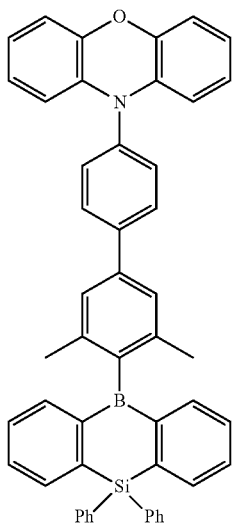
40
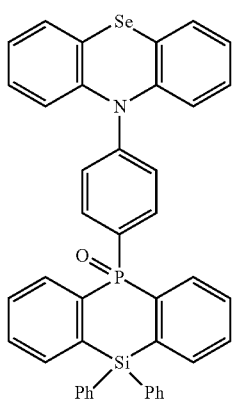
41
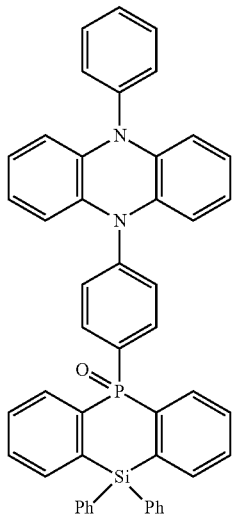
42
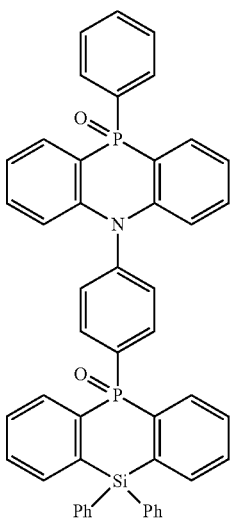
43
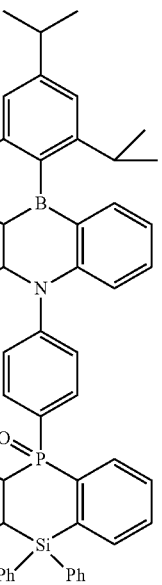
44

-continued
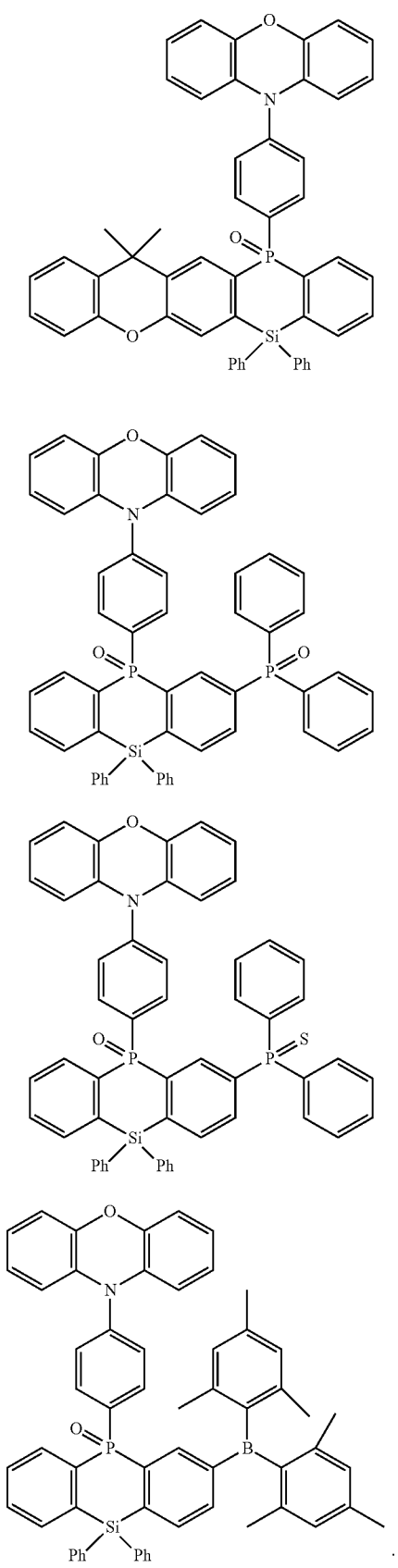
13. The organic electroluminescence device of claim 1, wherein the polycyclic compound represented by Formula 1 is at least one selected from compounds represented in Compound Group 2:
[Compound Group 2]
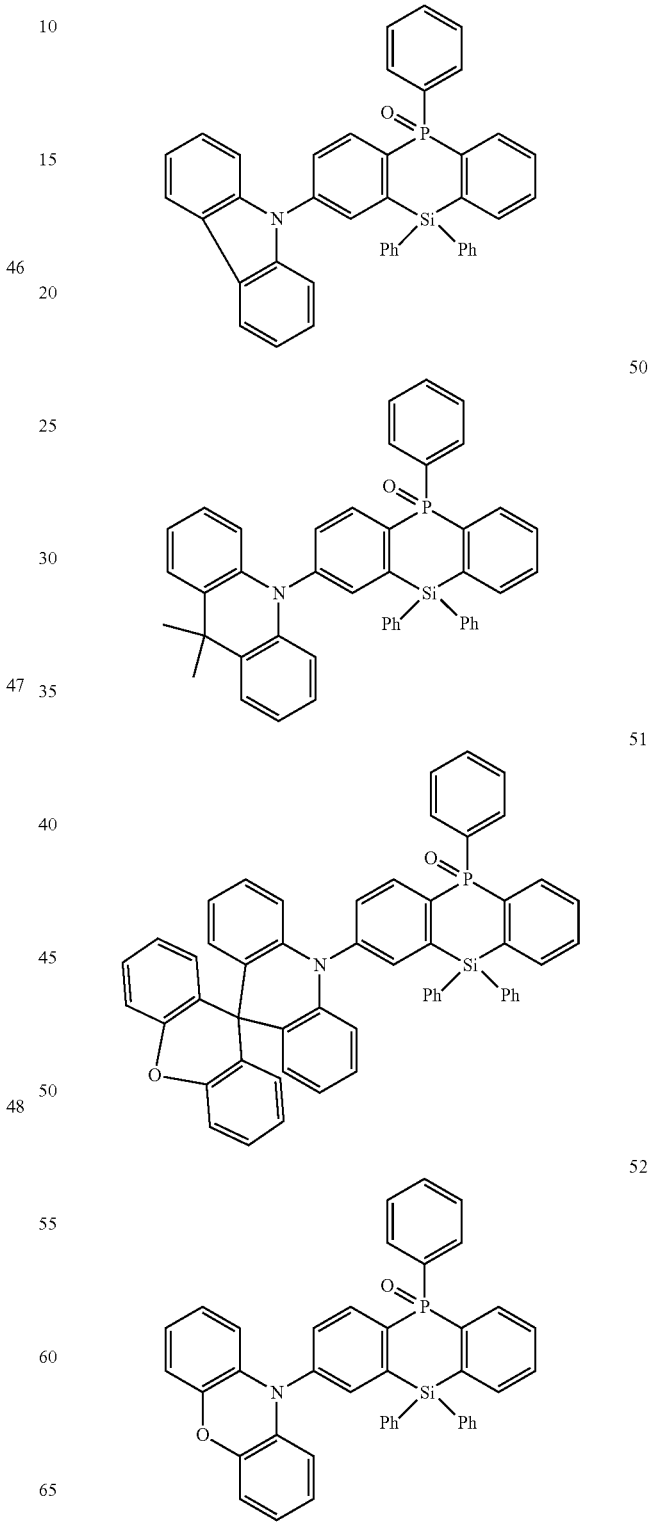

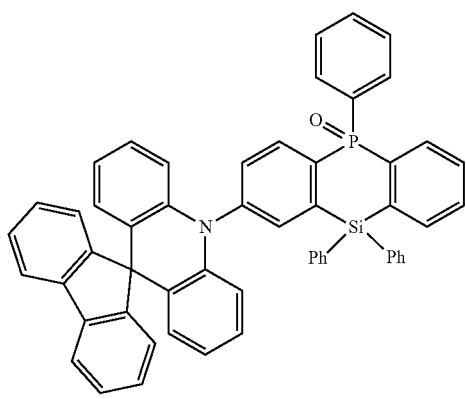
53
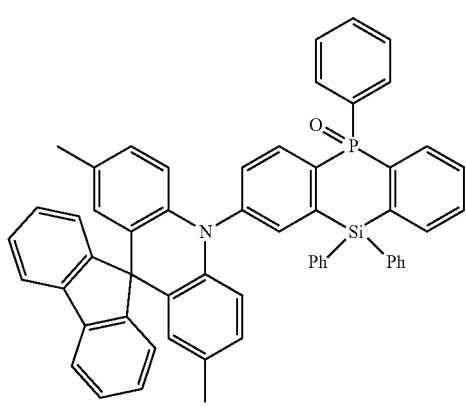
54
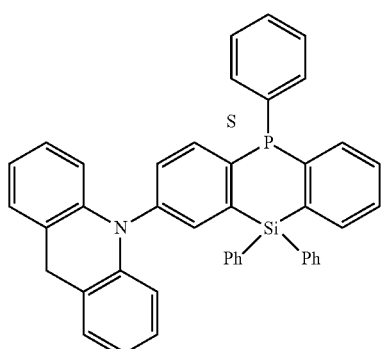
55
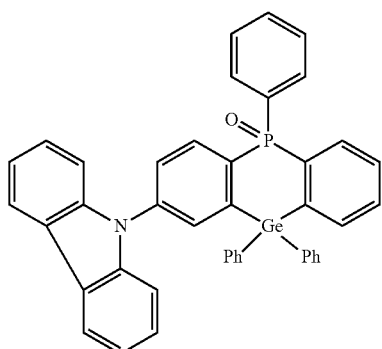
61
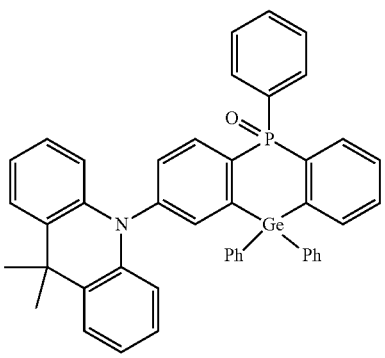
62
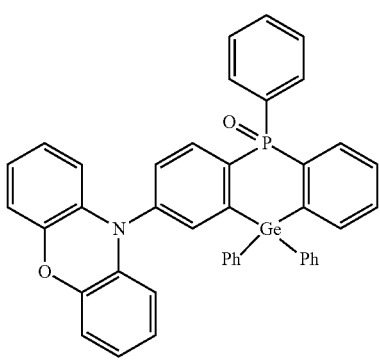
63
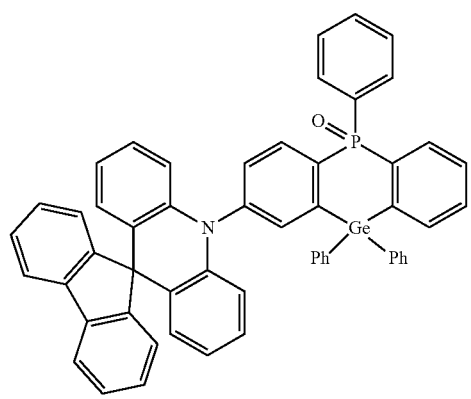
64
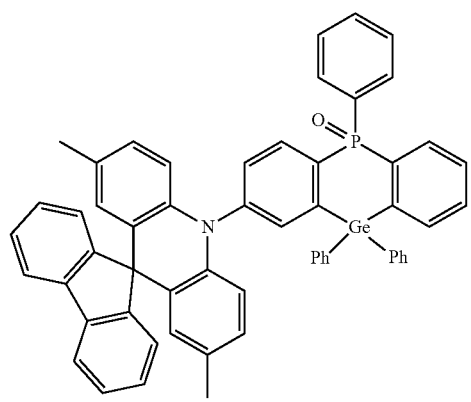
65

66
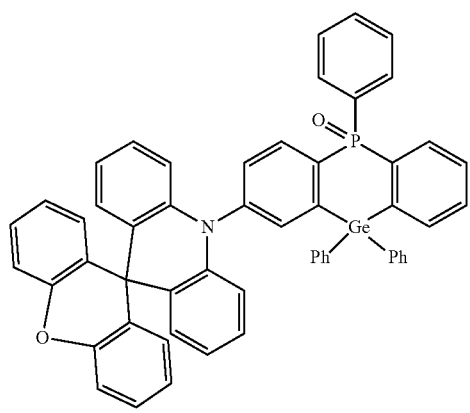
67
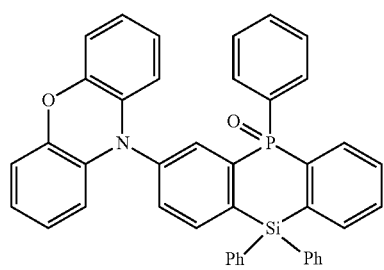
68
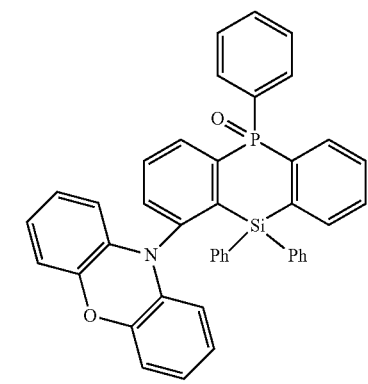
69
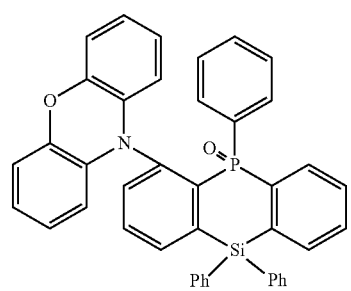
70
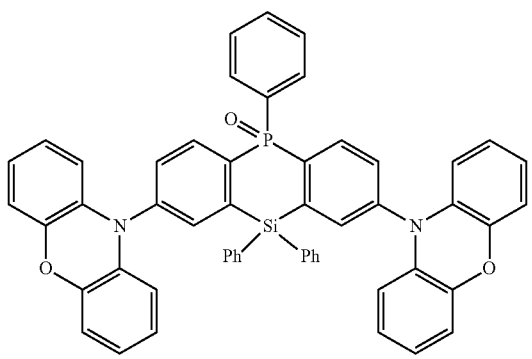
71
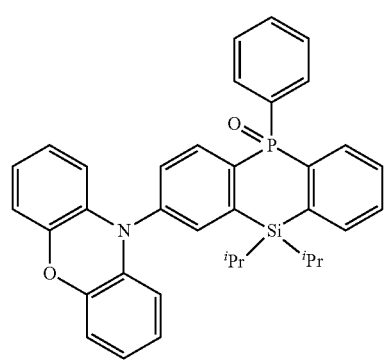
72
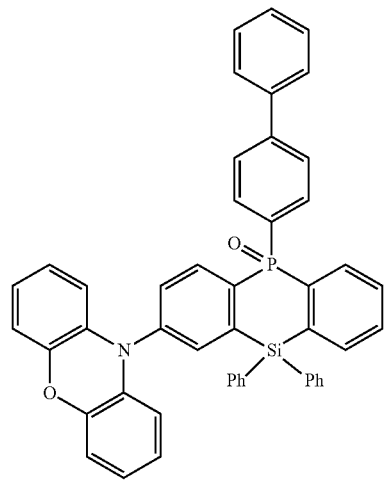
73
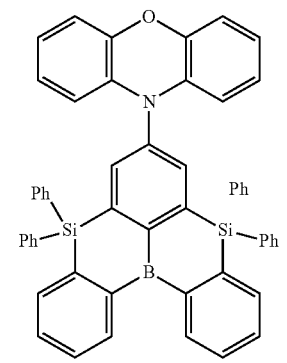

-continued
74
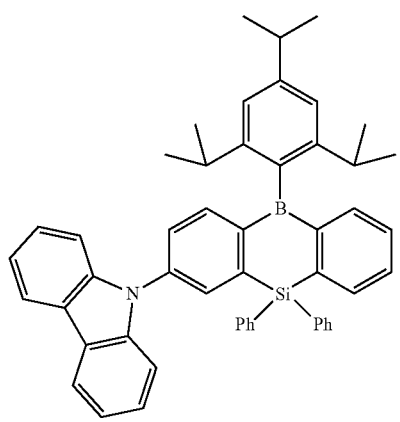
75
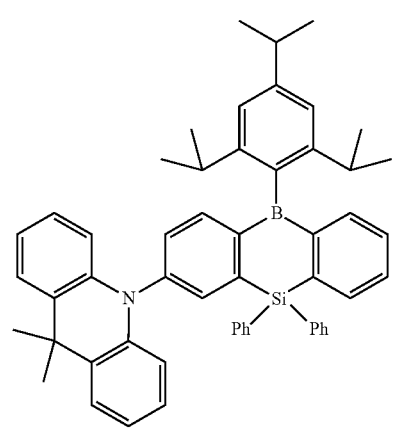
76
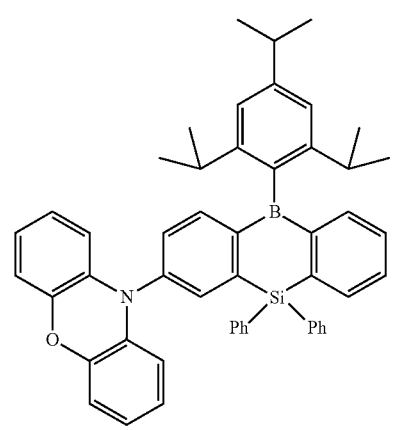
-continued
77
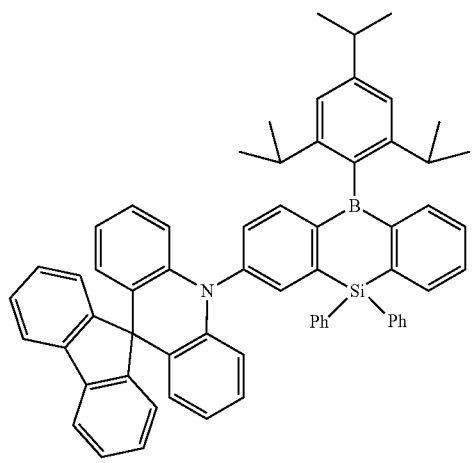
78
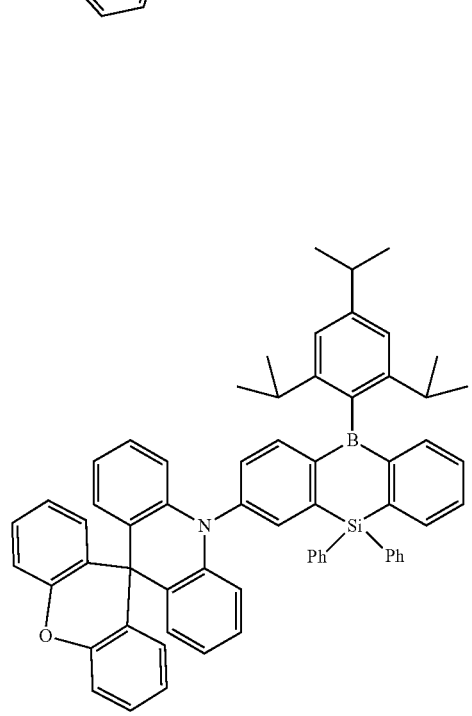
79
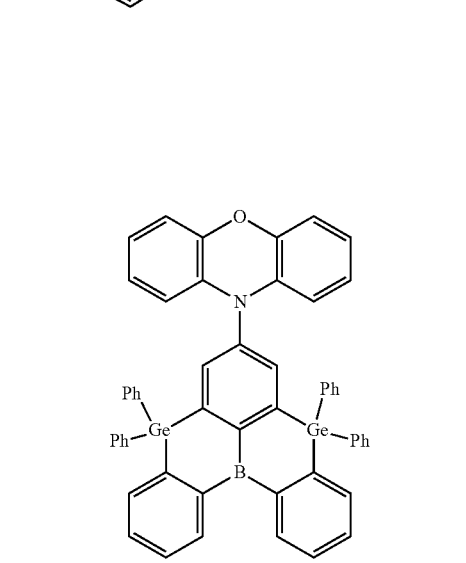

-continued
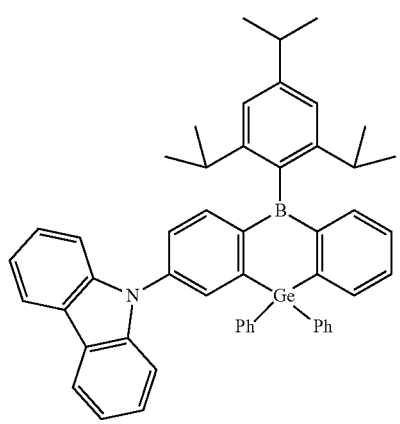
80
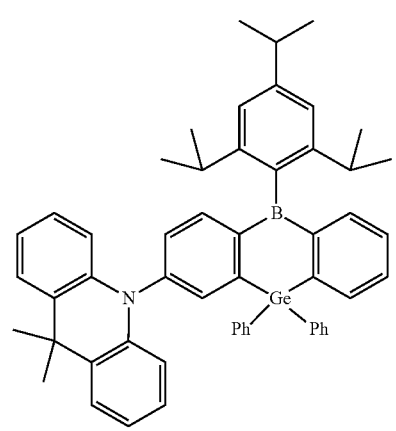
81
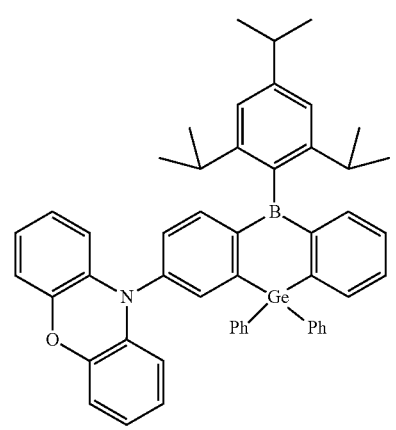
82
-continued
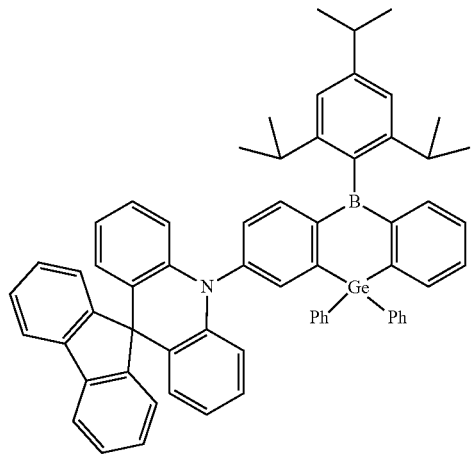
83
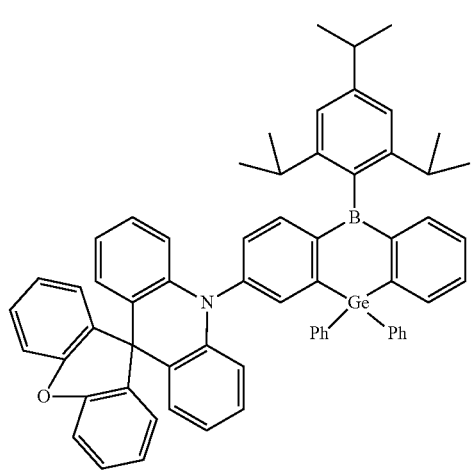
84
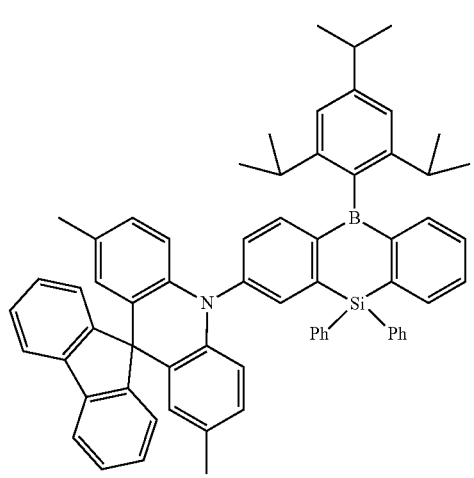
85

-continued
86
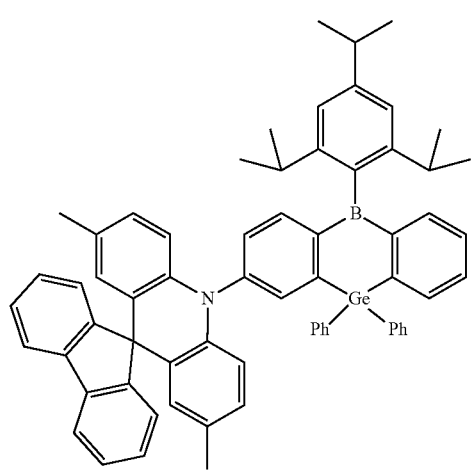
87
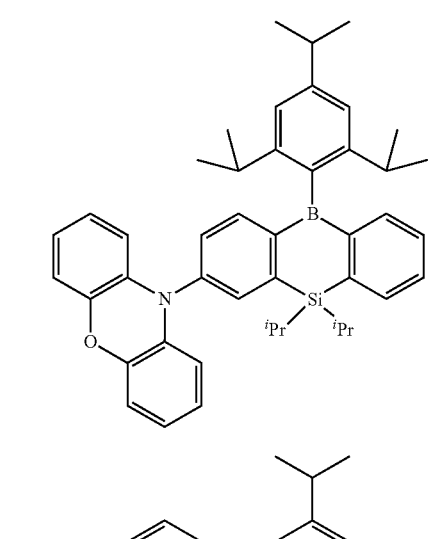
88
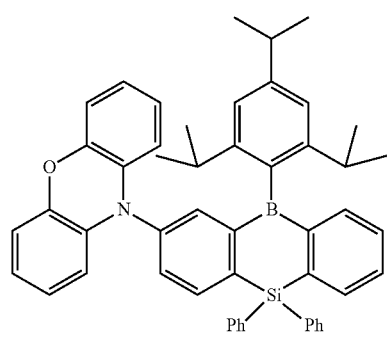
89
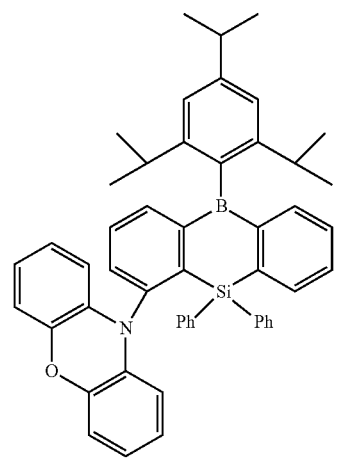
-continued
90
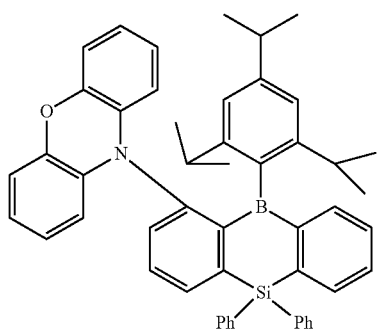
91
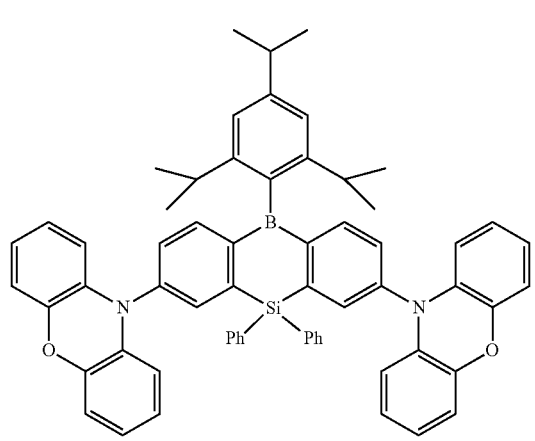
92
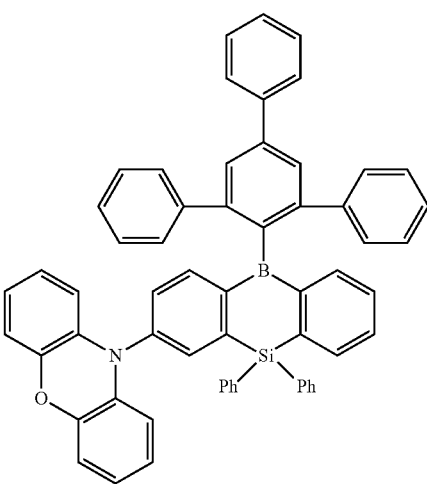

93
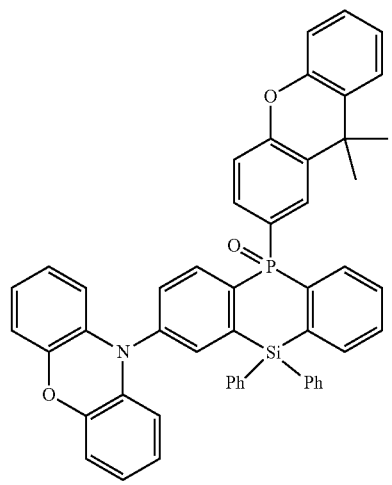
94
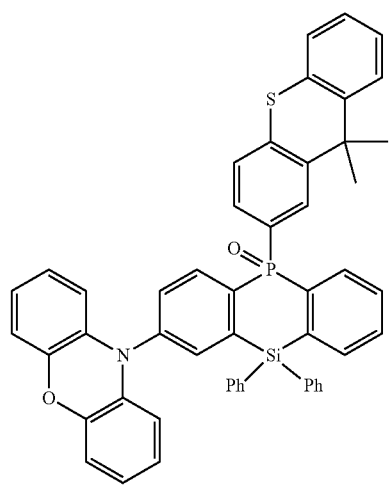
95
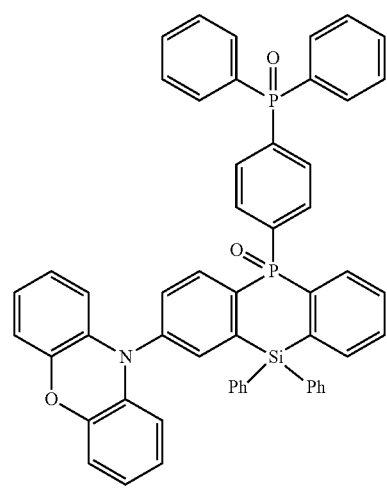
96
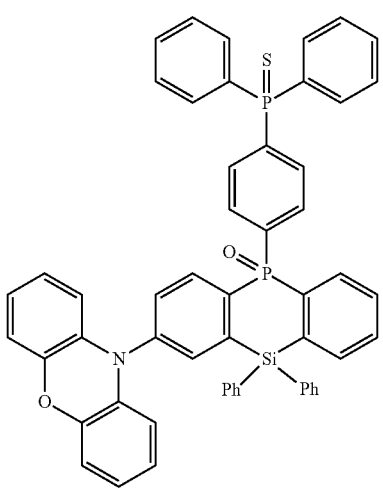
97
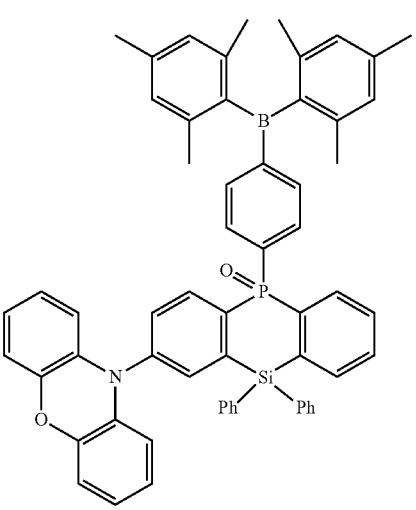
98
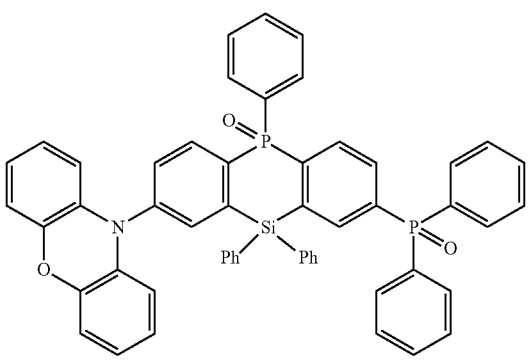

-continued

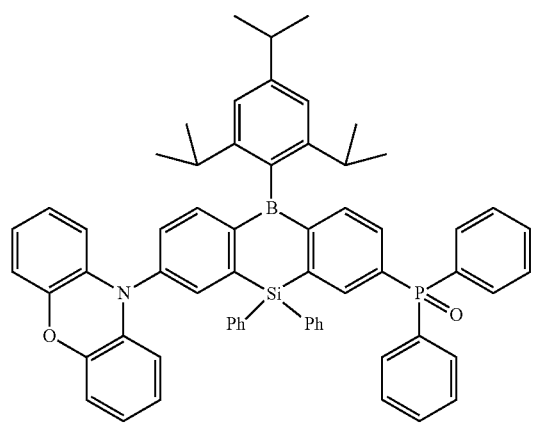

99

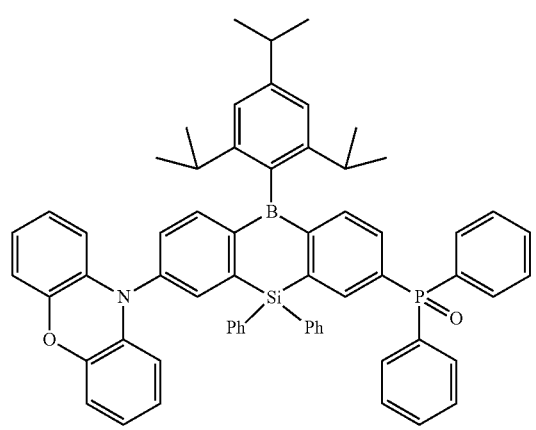

100

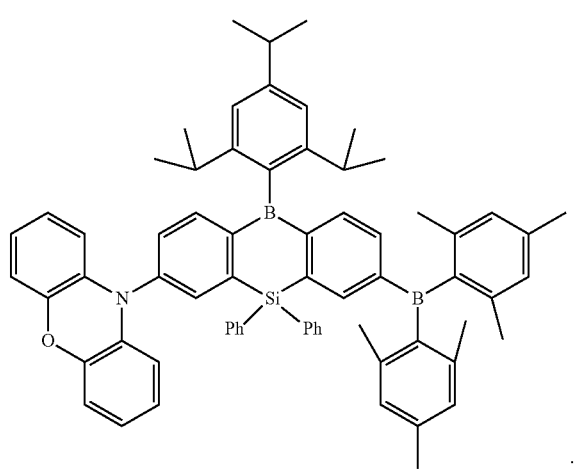

101

14. A polycyclic compound represented by Formula 1:

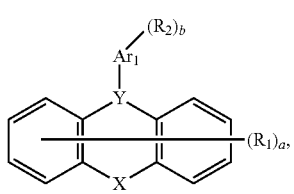

[Formula 1]

wherein in Formula 1,

Y is B or P=O,

Ar$_1$ is a substituted or unsubstituted aryl group having 6 to 30 carbon atoms for forming a ring, or a substituted or unsubstituted heteroaryl group having 2 to 30 carbon atoms for forming a ring, each of R$_1$ and R$_2$ is independently a hydrogen atom, a deuterium atom, a halogen atom, a substituted or unsubstituted amine group, a substituted or unsubstituted silyl group, a substituted or unsubstituted boryl group, a substituted or unsubstituted aralkyl group having 6 to 30 carbon atoms, a substituted or unsubstituted aryloxy group having 6 to 30 carbon atoms, a substituted or unsubstituted arylthio group having 6 to 30 carbon atoms, a substituted or unsubstituted phosphine group, a substituted or unsubstituted phosphine oxide group, a substituted or unsubstituted phosphine sulfide group, a substituted or unsubstituted alkyl group having 1 to 20 carbon atoms, a substituted or unsubstituted aryl group having 6 to 30 carbon atoms for forming a ring, or a substituted or unsubstituted heteroaryl group having 2 to 30 carbon atoms for forming a ring, or is optionally combined with an adjacent group to form a hydrocarbon ring or a heterocycle, provided that at least one of R$_1$ or R$_2$ is NAr$_2$Ar$_3$:

Ar$_2$ and Ar$_3$ are each independently a substituted or unsubstituted aryl group having 6 to 30 carbon atoms for forming a ring, where Ar$_2$ and Ar$_3$ are optionally combined with each other to form a heterocyclic ring, X is SiR$_3$R$_4$, or GeR$_5$R$_6$, each of R$_3$ to R$_6$ is independently a substituted or unsubstituted alkyl group having 1 to 20 carbon atoms, a substituted or unsubstituted aryl group having 6 to 30 carbon atoms for forming a ring, or a substituted or unsubstituted heteroaryl group having 2 to 30 carbon atoms for forming a ring, "a" is an integer between 0 and 8, inclusive, "b" is an integer between 0 and 5, inclusive, a+b≠0, if R$_1$ is NAr$_2$Ar$_3$, "a" is an integer between 1 and 8, inclusive, and if R$_2$ is NAr$_2$Ar$_3$, "b" is an integer between 1 and 5, inclusive.

15. A polycyclic compound represented by Formula 1:

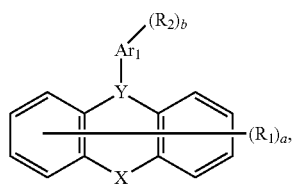

[Formula 1]

wherein in Formula 1,
Y is B, P=O, or P=S,
$Ar_1$ is a substituted or unsubstituted aryl group having 6 to 30 carbon atoms for forming a ring, or a substituted or unsubstituted heteroaryl group having 2 to 30 carbon atoms for forming a ring,
$R_1$ is a hydrogen atom, a deuterium atom, a halogen atom, a substituted or unsubstituted amine group, a substituted or unsubstituted silyl group, a substituted or unsubstituted boryl group, a substituted or unsubstituted aralkyl group having 6 to 30 carbon atoms, a substituted or unsubstituted aryloxy group having 6 to 30 carbon atoms, a substituted or unsubstituted arylthio group having 6 to 30 carbon atoms, a substituted or unsubstituted phosphine group, a substituted or unsubstituted phosphine oxide group, a substituted or unsubstituted phosphine sulfide group, a substituted or unsubstituted alkyl group having 1 to 20 carbon atoms, a substituted or unsubstituted aryl group having 6 to 30 carbon atoms for forming a ring, or a substituted or unsubstituted heteroaryl group having 2 to 30 carbon atoms for forming a ring, or is optionally combined with an adjacent group to form a hydrocarbon ring or a heterocycle,
X is $SiR_3R_4$ or $GeR_5R_6$,
each of $R_3$ to $R_6$ is independently a substituted or unsubstituted alkyl group having 1 to 20 carbon atoms, a substituted or unsubstituted aryl group having 6 to 30 carbon atoms for forming a ring, or a substituted or unsubstituted heteroaryl group having 2 to 30 carbon atoms for forming a ring,
"a" is an integer between 0 and 8, inclusive,
"b" is an integer between 0 and 5, inclusive,
a+b≠0, and
$R_2$ is represented by Formula 2:

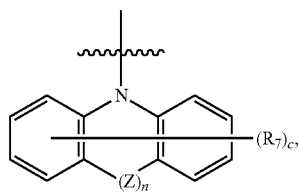

[Formula 2]

wherein in Formula 2,
Z is a direct linkage, O, S, Se, $NAr_{11}$, $POAr_{12}$, $CAr_{14}Ar_{15}$, $SiAr_{16}Ar_{17}$, $GeAr_{18}Ar_{19}$, or $BAr_{20}$,
n is 0 or 1,
each of $Ar_{11}$ to $Ar_{10}$ is independently a substituted or unsubstituted alkyl group having 1 to 20 carbon atoms, a substituted or unsubstituted aryl group having 6 to 30 carbon atoms for forming a ring, or a substituted or unsubstituted heteroaryl group having 2 to 30 carbon atoms for forming a ring, or is optionally combined with an adjacent group to form a hydrocarbon ring or a heterocycle,
$R_7$ is a hydrogen atom, a deuterium atom, a halogen atom, a substituted or unsubstituted amine group, a substituted or unsubstituted alkyl group having 1 to 20 carbon atoms, a substituted or unsubstituted aryl group having 6 to 30 carbon atoms for forming a ring, or a substituted or unsubstituted heteroaryl group having 2 to 30 carbon atoms for forming a ring, and
"c" is an integer between 0 and 8, inclusive.

16. The polycyclic compound of claim 15, wherein "b" is 1.

17. The polycyclic compound of claim 15, wherein "a" is 1 or 2.

18. The polycyclic compound of claim 15, wherein the polycyclic compound represented by Formula 1 is represented by one of Formulae 3-1 to 3-3:

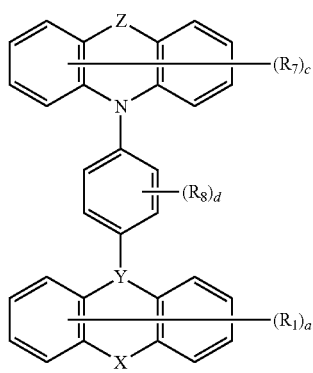

[Formula 3-1]

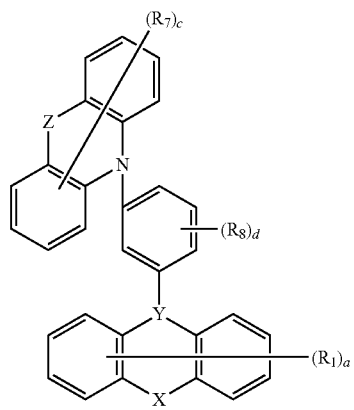

[Formula 3-2]

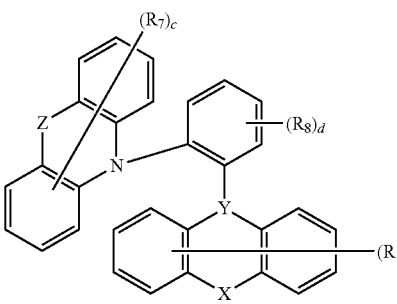

[Formula 3-3]

wherein in Formulae 3-1 to 3-3,
$R_8$ is a hydrogen atom, a deuterium atom, a halogen atom, a substituted or unsubstituted alkyl group having 1 to 20 carbon atoms, a substituted or unsubstituted aryl group having 6 to 30 carbon atoms for forming a ring, or a substituted or unsubstituted heteroaryl group having 2 to 30 carbon atoms for forming a ring, "d" is an integer between 0 and 4, inclusive, and $R_1$, $R_7$, "a", "c", X, Y, and Z are the same as defined above.

19. The polycyclic compound of claim 14, wherein the polycyclic compound represented by Formula 1 is represented by one of Formulae 4-1 to 4-4:

[Formula 4-1]

[Formula 4-2]

[Formula 4-3]

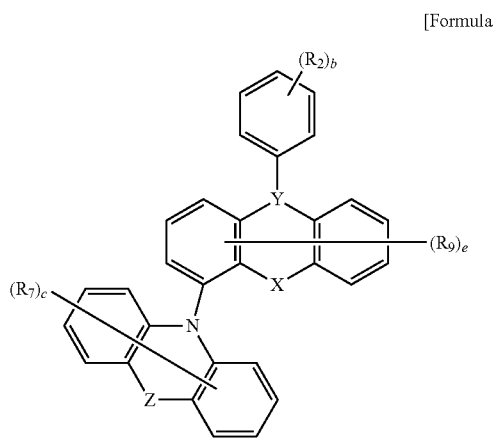

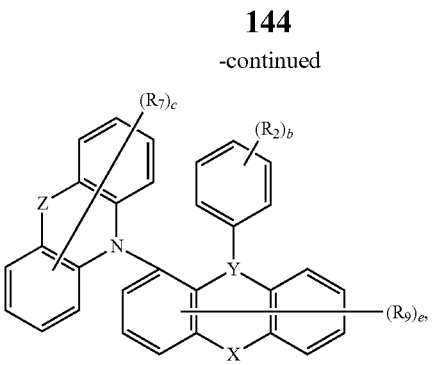

[Formula 4-4]

wherein in Formulae 4-1 to 4-4, each of $R_2$ and $R_9$ is independently a hydrogen atom, a deuterium atom, a halogen atom, a substituted or unsubstituted alkyl group having 1 to 20 carbon atoms, a substituted or unsubstituted aryl group having 6 to 30 carbon atoms for forming a ring, or a substituted or unsubstituted heteroaryl group having 2 to 30 carbon atoms for forming a ring, or is optionally combined with an adjacent group to form a hydrocarbon ring or a heterocycle, "e" is an integer between 0 and 7, inclusive, and $R_7$, "b", "c", X, Y, and Z are the same as defined above.

20. The polycyclic compound of claim 15, wherein $R_2$ is represented by one of Formulae 2-1 to 2-14:

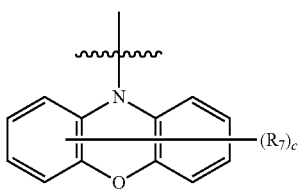

[Formula 2-1]

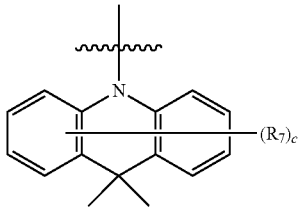

[Formula 2-2]

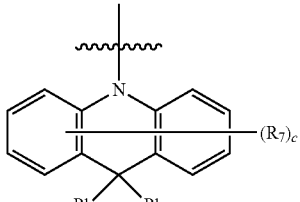

[Formula 2-3]

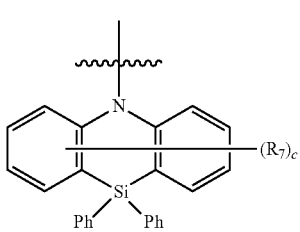

[Formula 2-4]

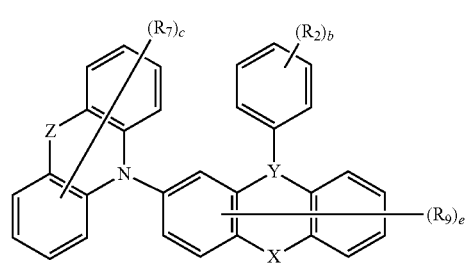

[Formula 2-5]
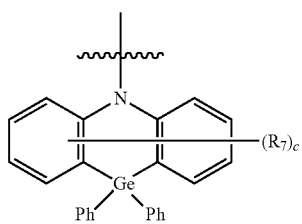

[Formula 2-6]
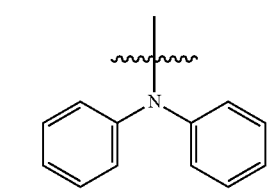

[Formula 2-7]
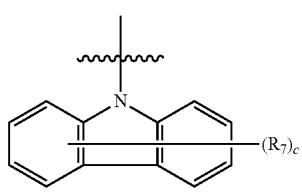

[Formula 2-8]
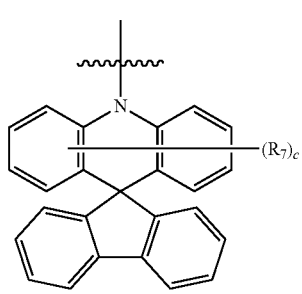

[Formula 2-9]
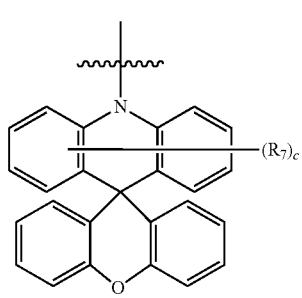

[Formula 2-10]
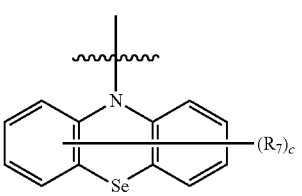

[Formula 2-11]
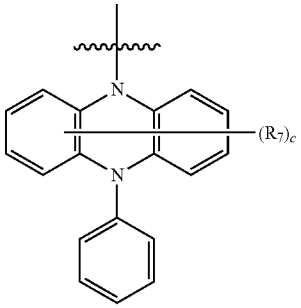

[Formula 2-12]
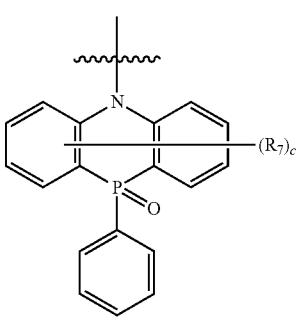

[Formula 2-13]
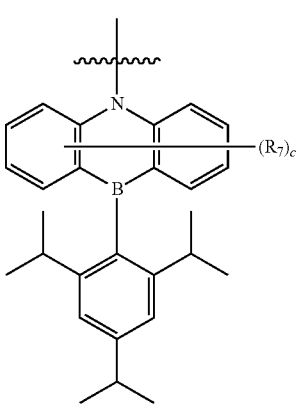

[Formula 2-14]
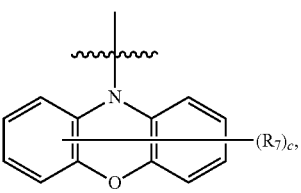

wherein in Formulae 2-1 to 2-14, $R_7$, and "c" are the same as defined above.

21. The polycyclic compound of claim 14, wherein each of $R_3$ to $R_6$ is independently a substituted or unsubstituted alkyl group having 3 to 10 carbon atoms, or a substituted or unsubstituted phenyl group.

22. The polycyclic compound of claim 15, wherein the polycyclic compound represented by Formula 1 is one selected from compounds represented in Compound Group 1:

[Compound Group 1]
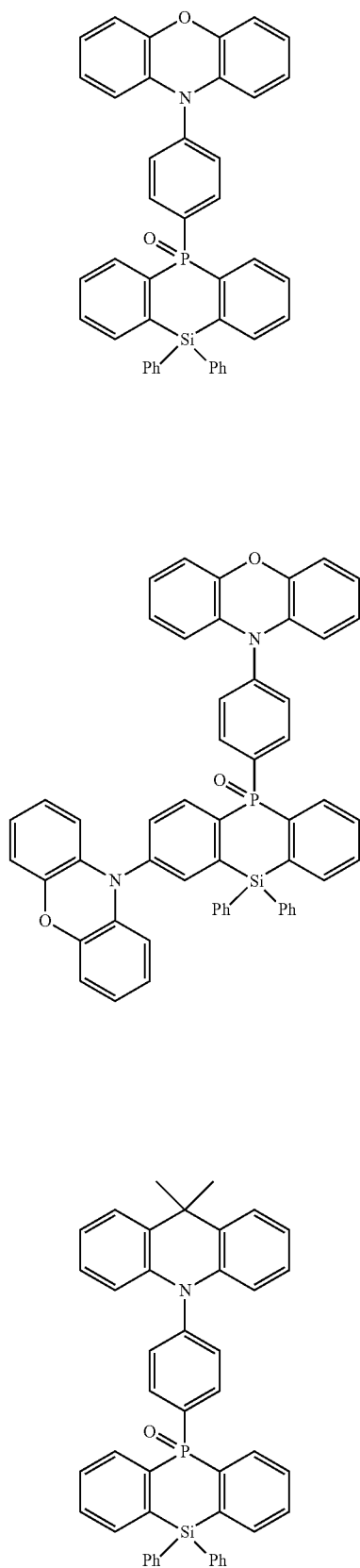
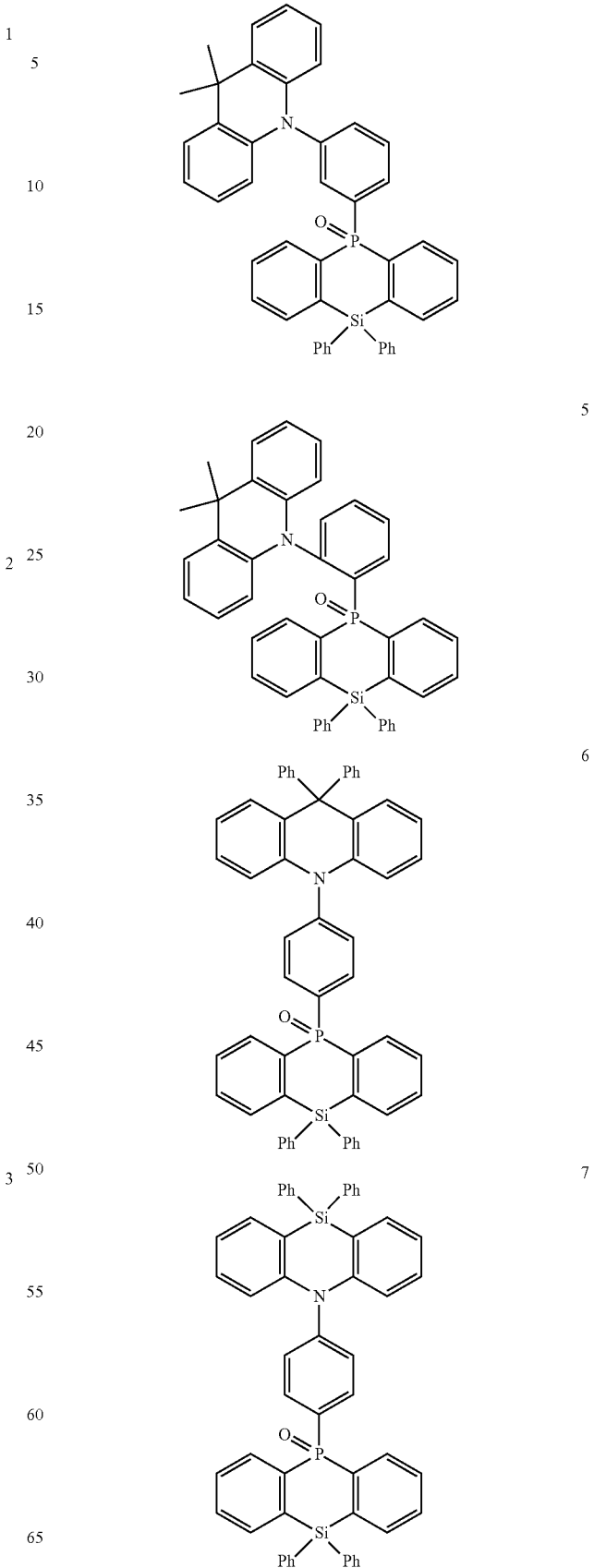

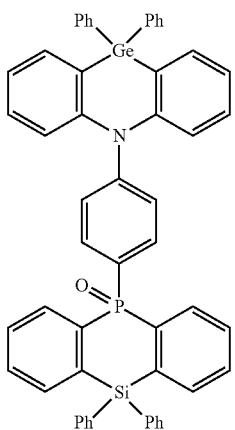
8
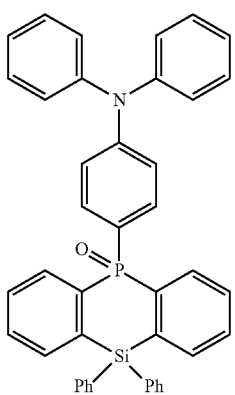
9
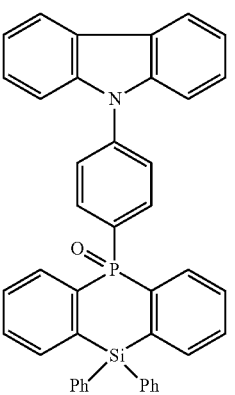
10
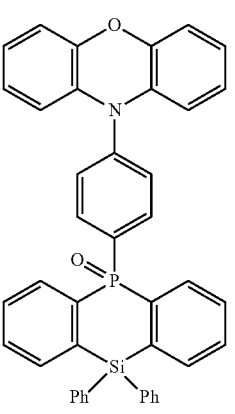
11
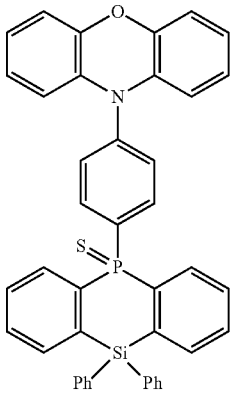
12
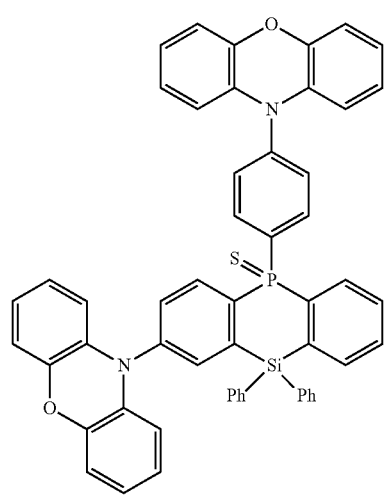
13
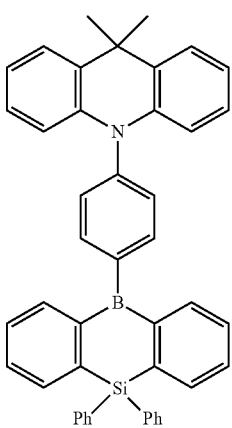
14

151
-continued
15
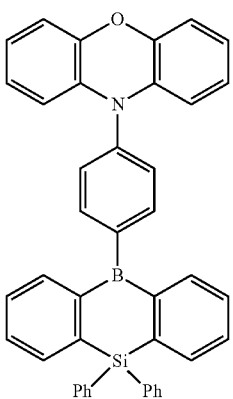
16
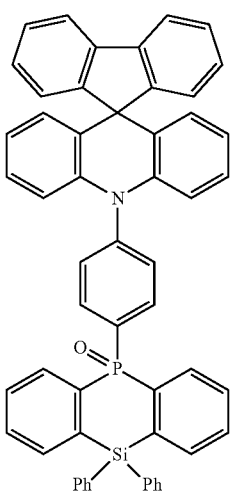
17
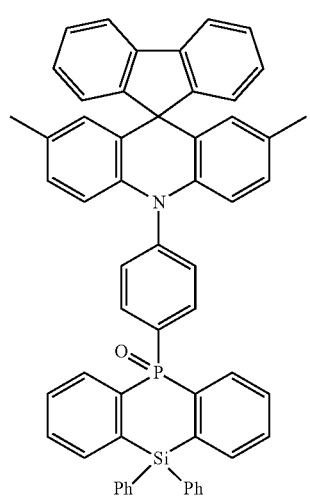
152
-continued
18
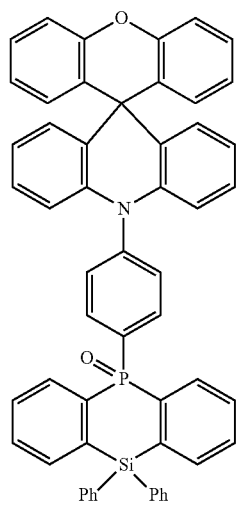
19
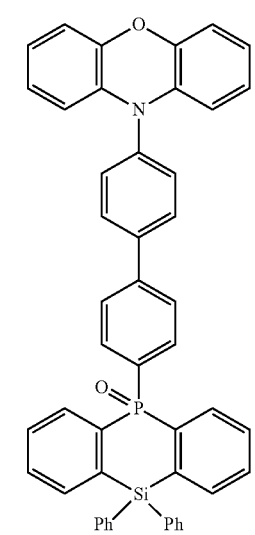
20
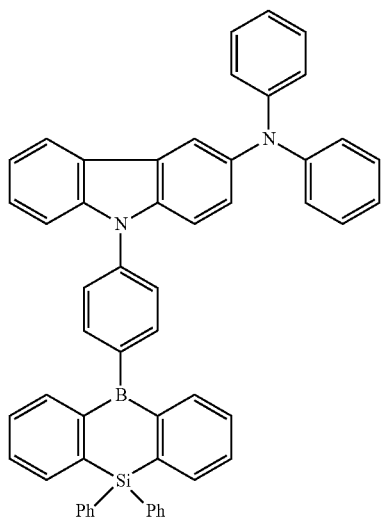

21
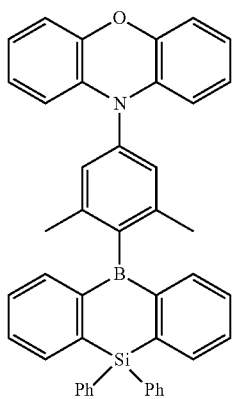
22
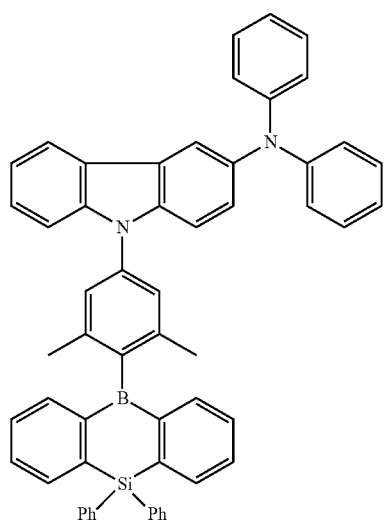
23
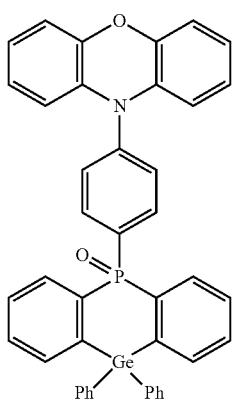
24
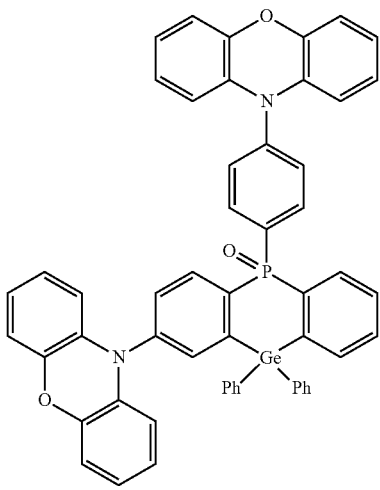
25
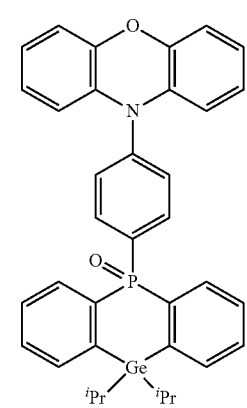
26
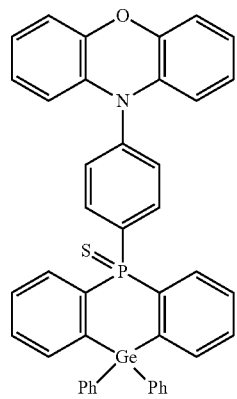

27
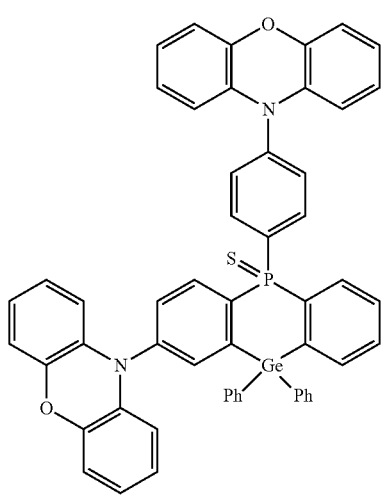
28
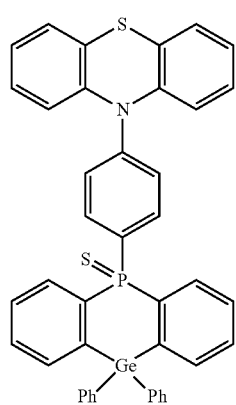
29
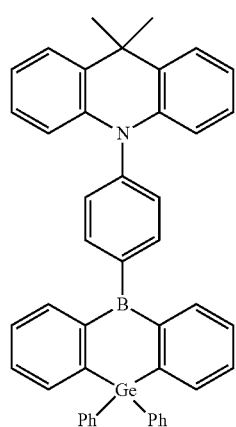
30
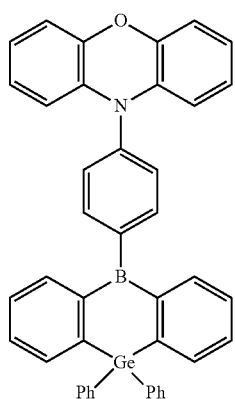
31
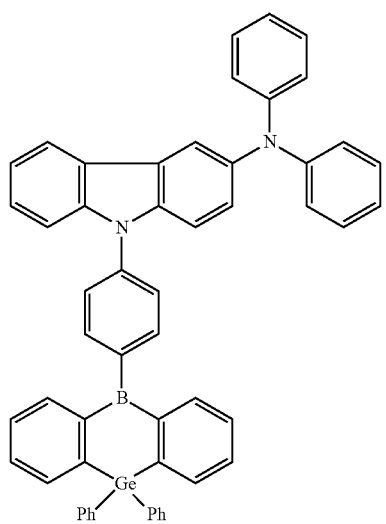
32
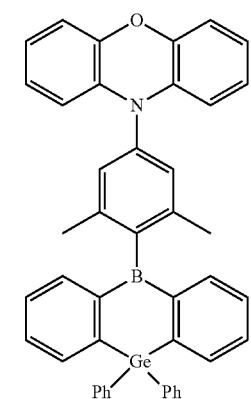

33
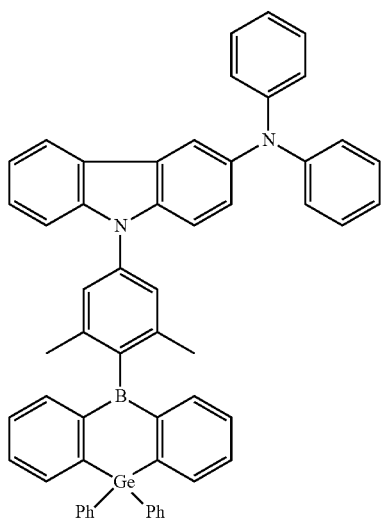
34
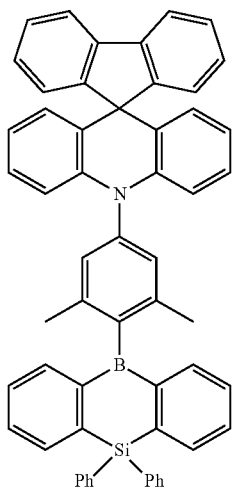
35
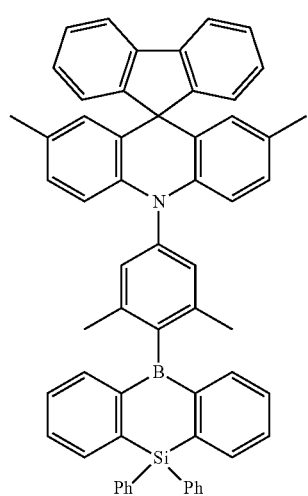
36
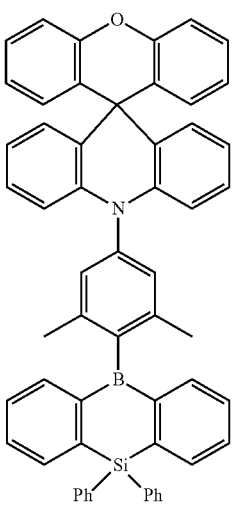
37
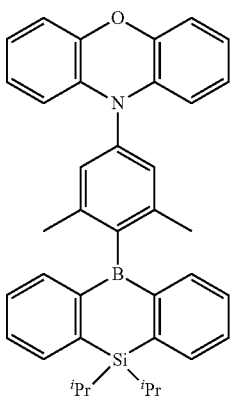
38
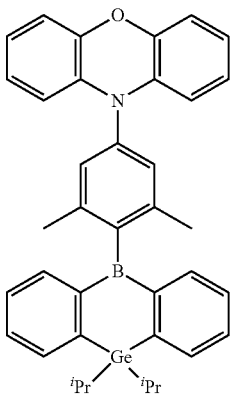

39
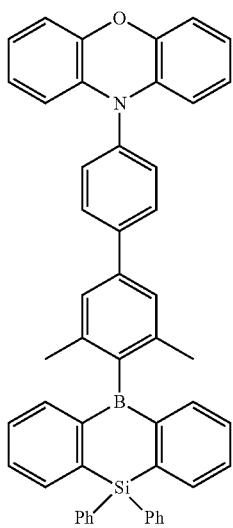
40
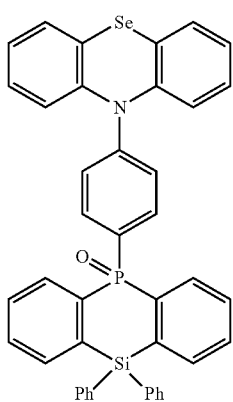
41
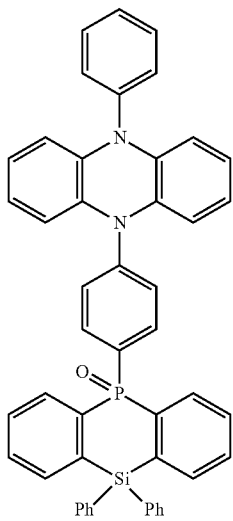
42
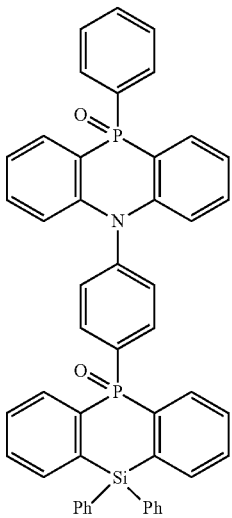
43
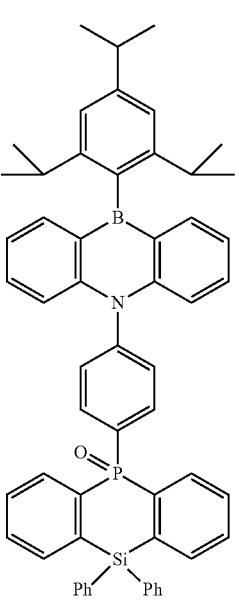
44
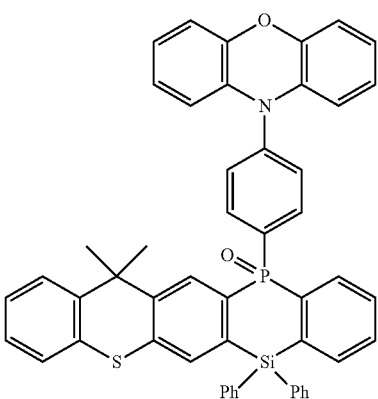

-continued
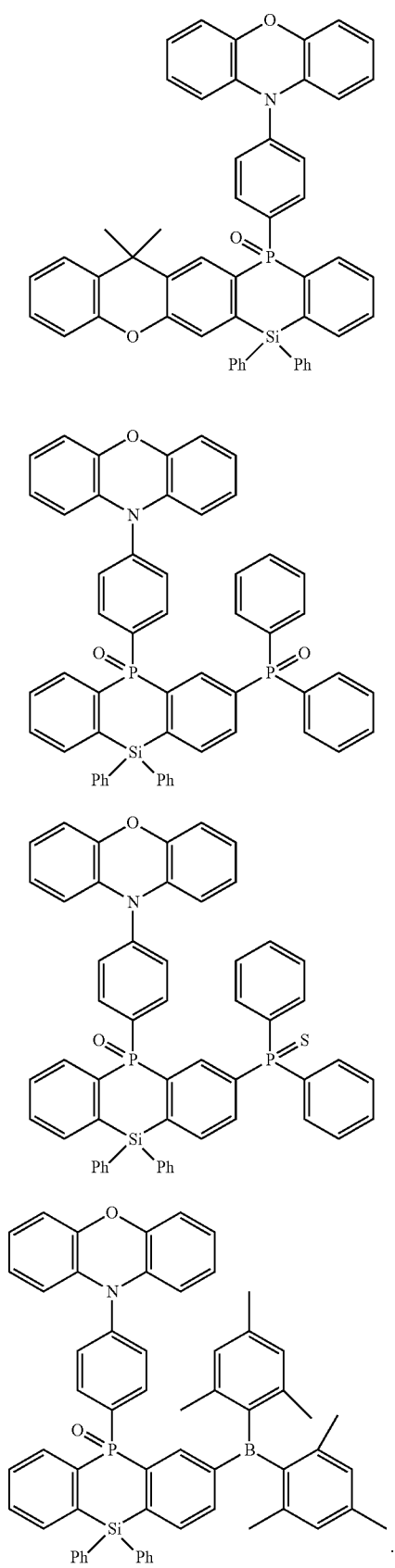
23. The polycyclic compound of claim 14, wherein the polycyclic compound represented by Formula 1 is one selected from compounds represented in Compound Group 2:
[Compound Group 2]
49
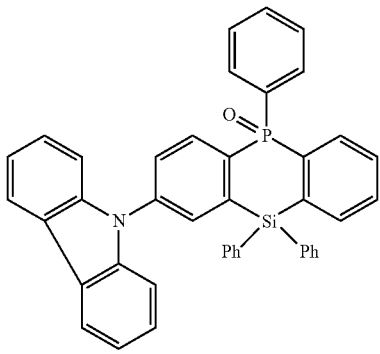
50
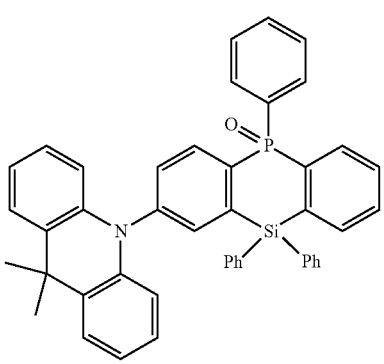
51
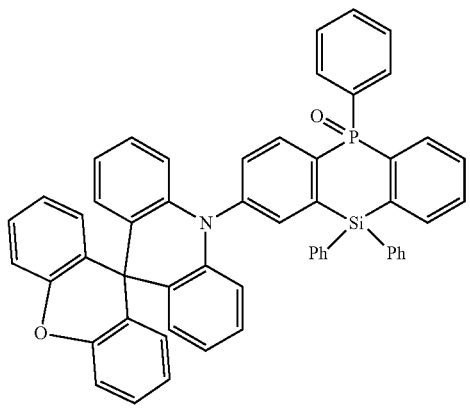
52
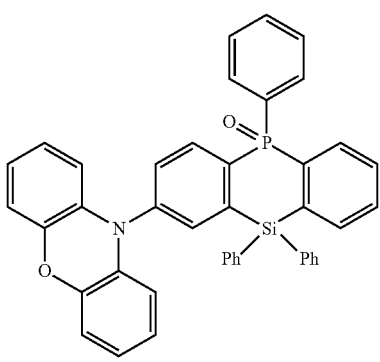

53
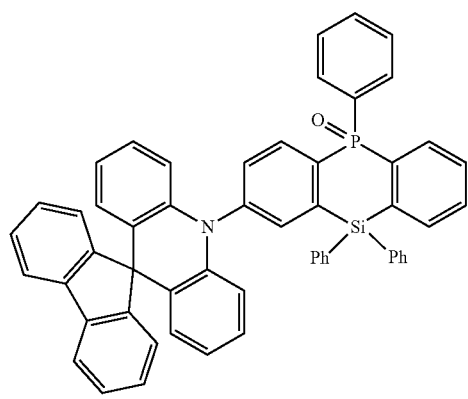
54
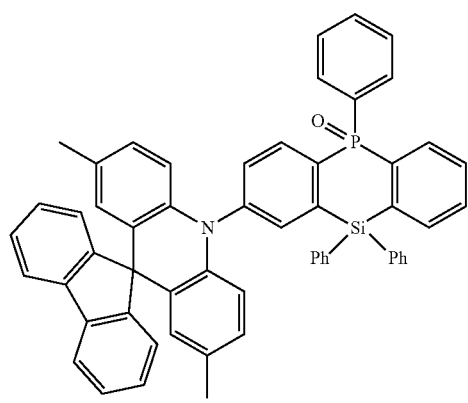
55
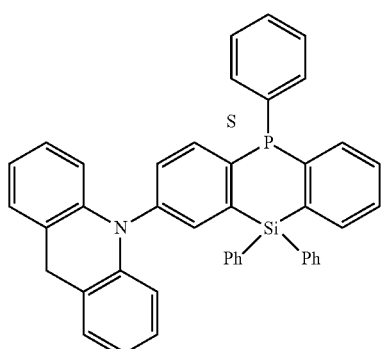
61
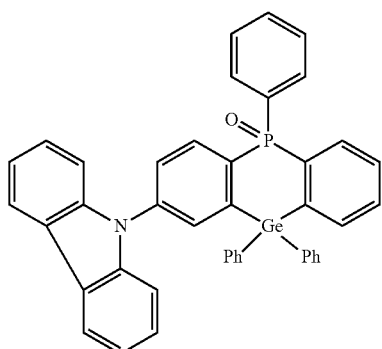
62
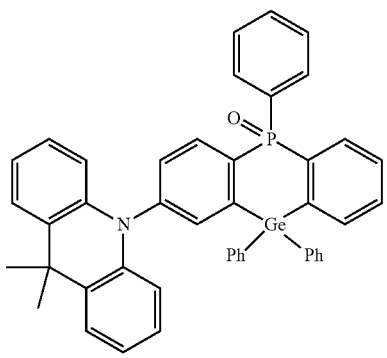
63
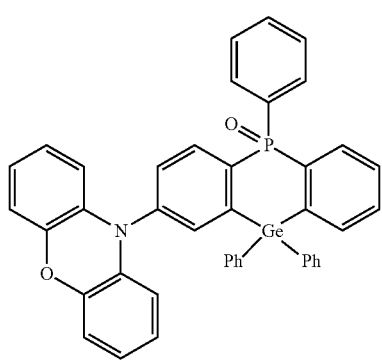
64
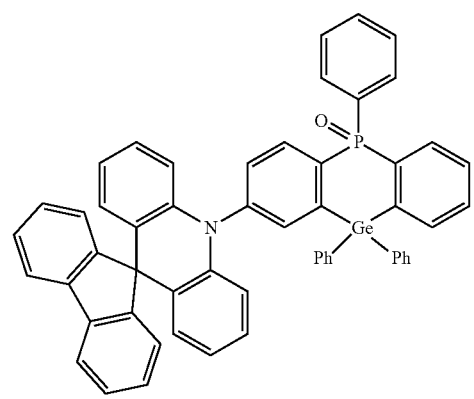
65
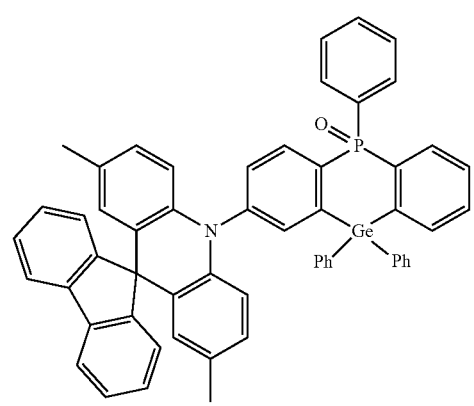

66
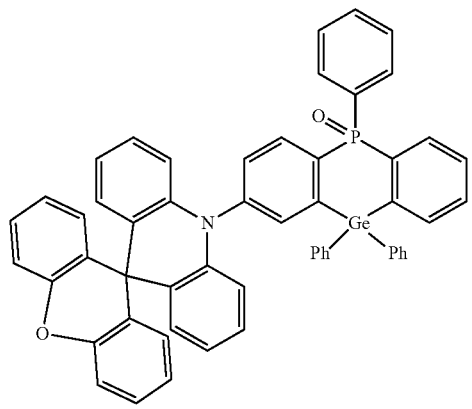
67
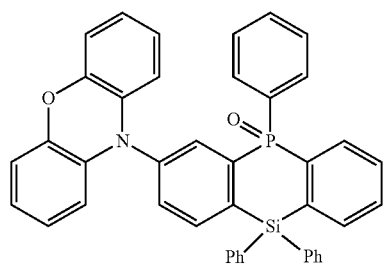
68
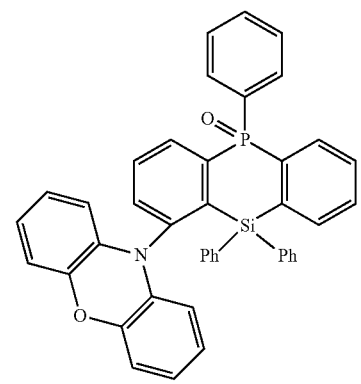
69
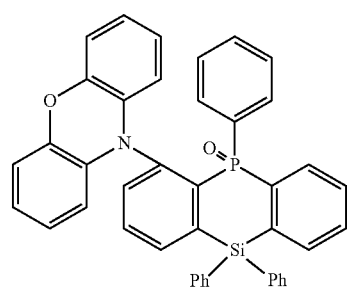
70
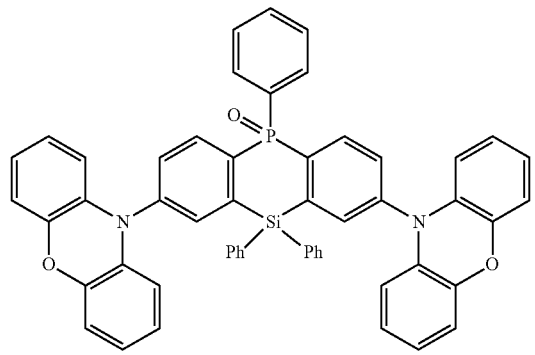
71
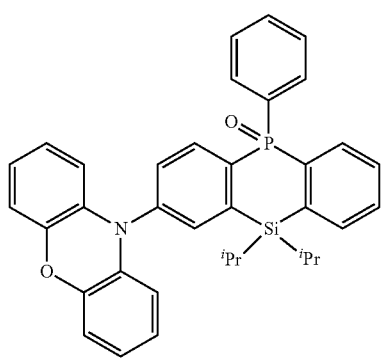
72
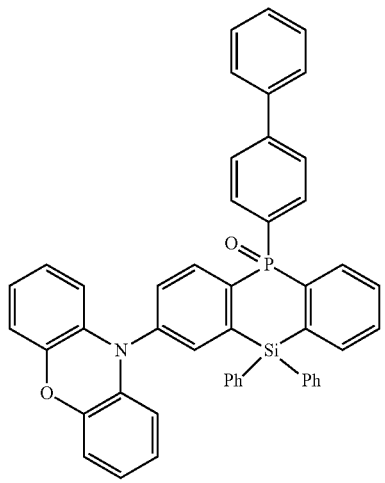
73
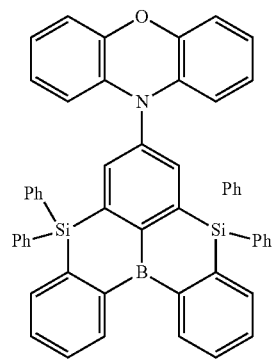

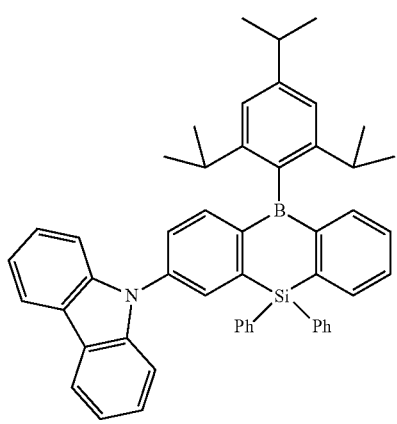
74
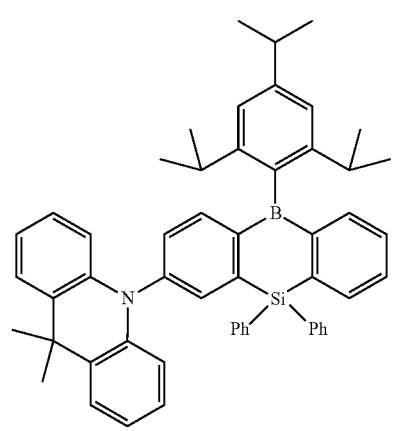
75
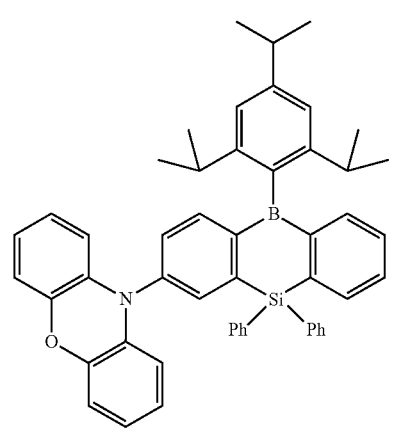
76
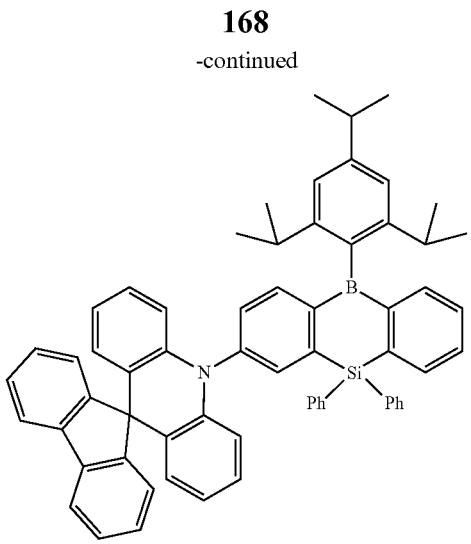
77
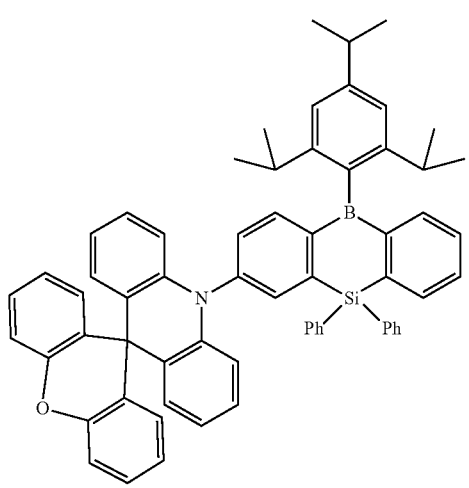
78
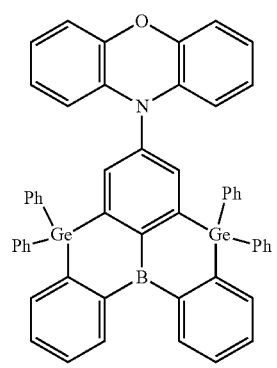
79

80 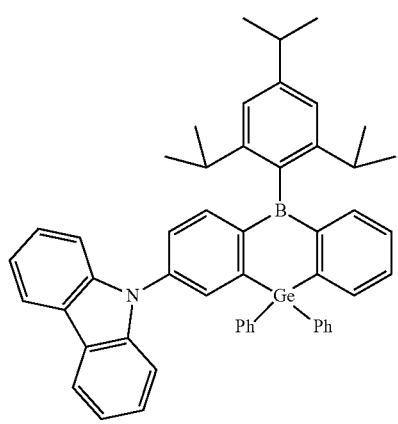
83 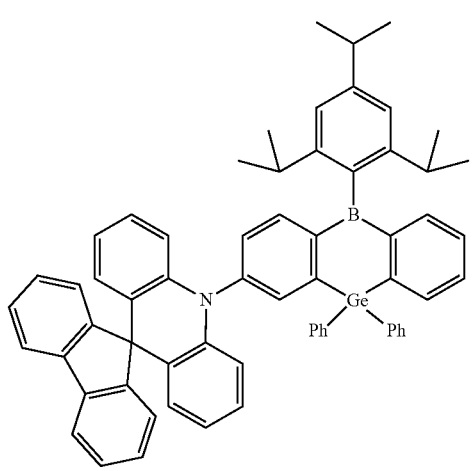
81 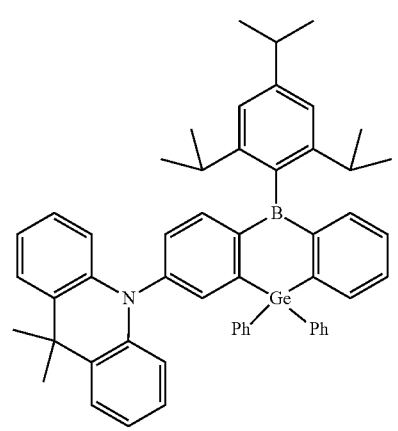
84 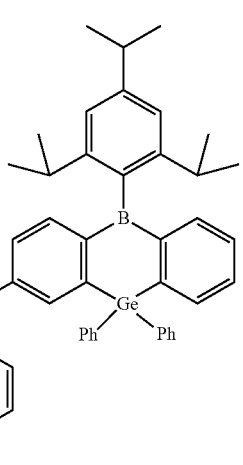
82 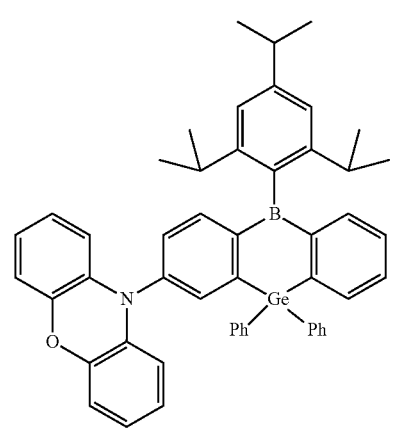
85 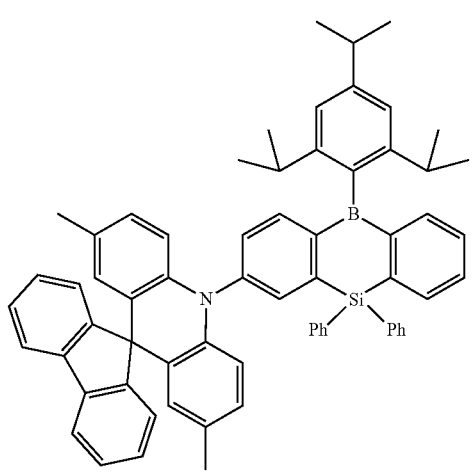

86
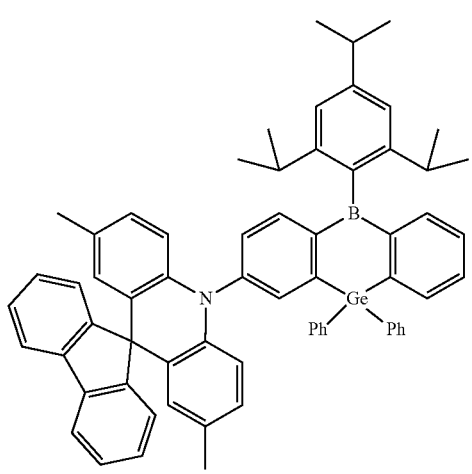
87
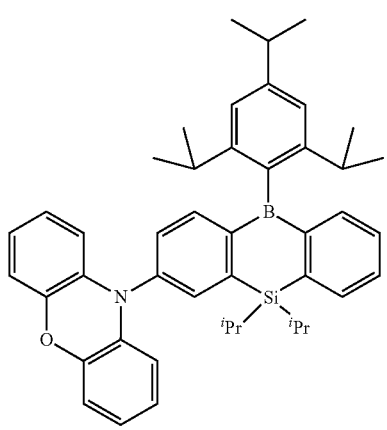
88
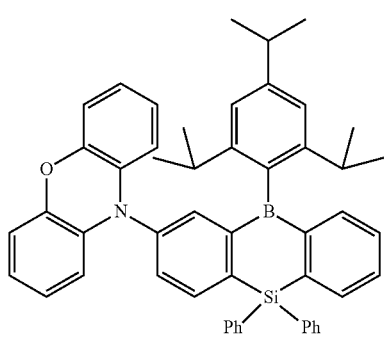
89
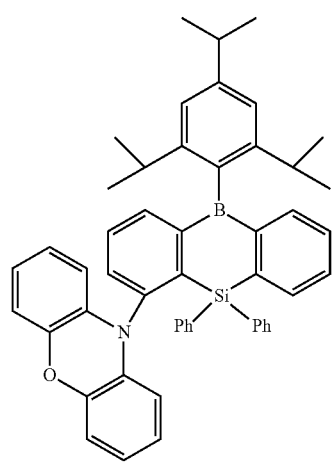
90
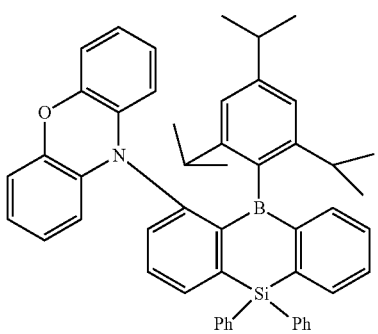
91
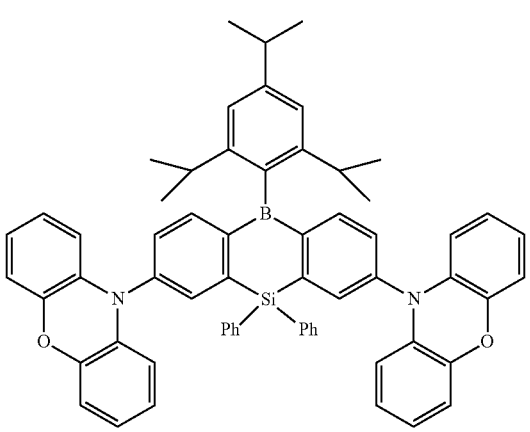
92
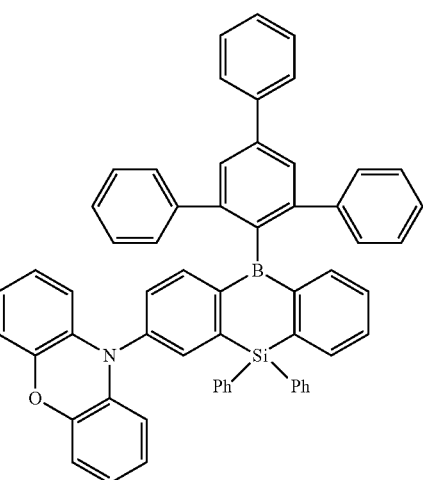

93
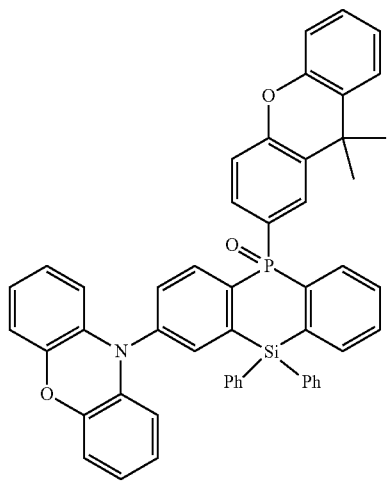
94
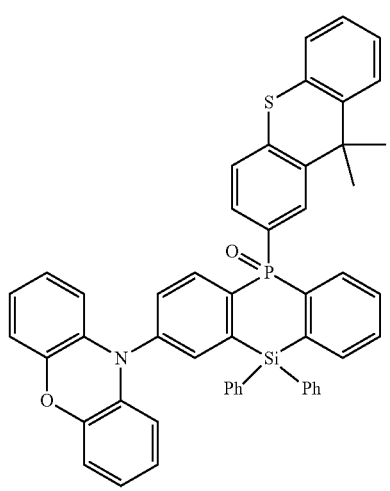
95
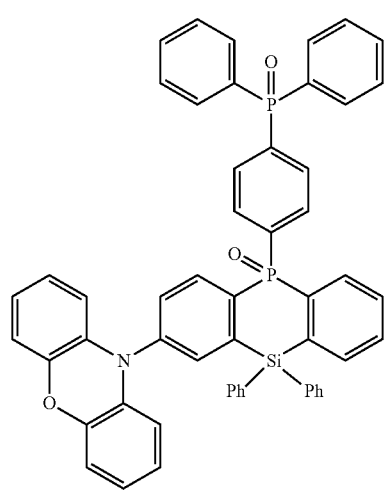
96
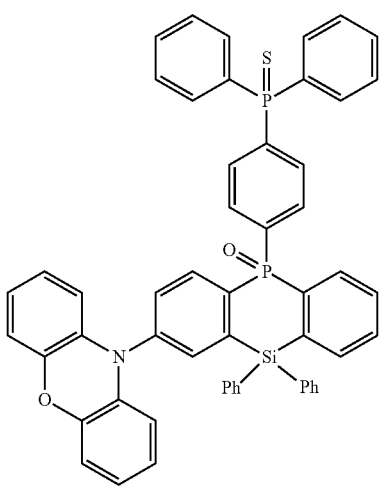
97
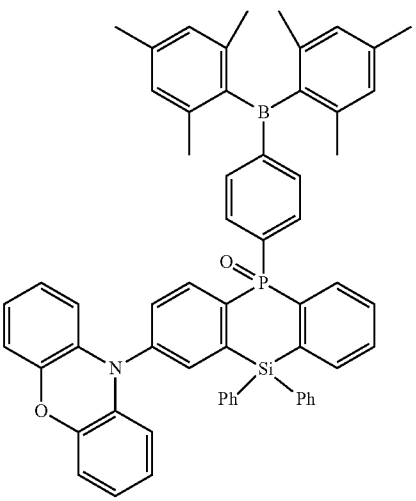
98
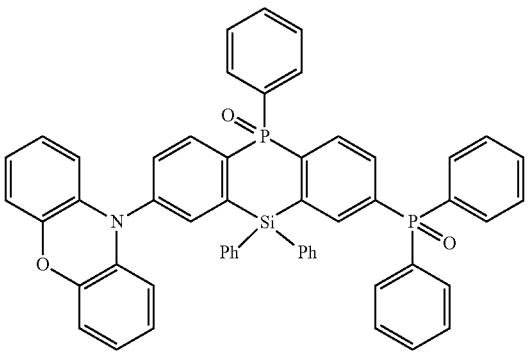

-continued

99
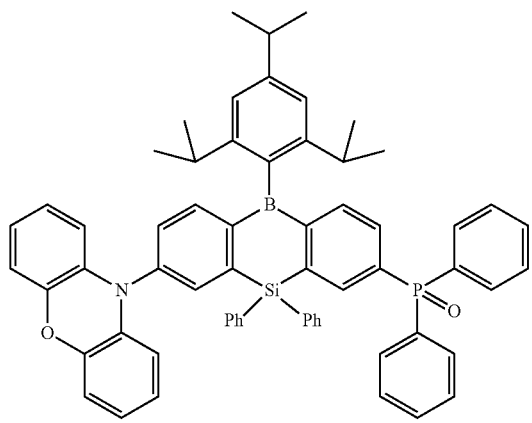

100
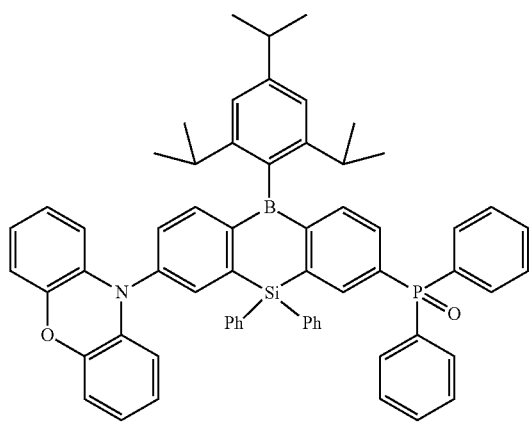

101
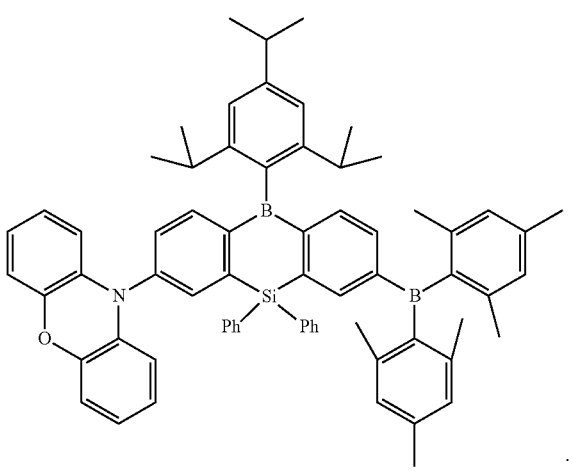

24. A polycyclic compound represented by Formula 5:

[Formula 5]

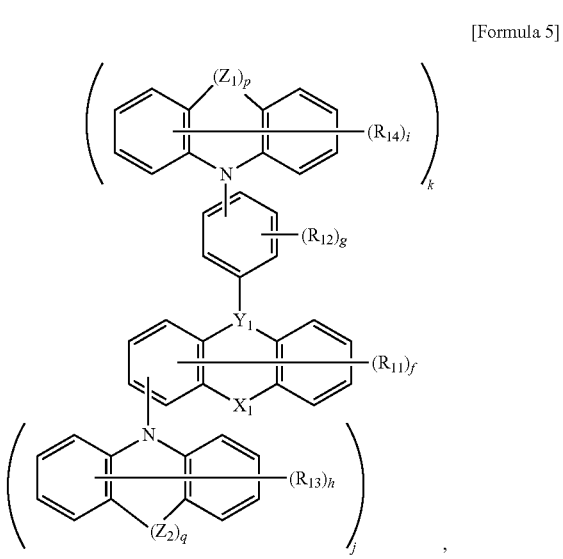

wherein in Formula 5,
$Y_1$ is B or P=O,
$X_1$ is $SiR_{15}R_{16}$, or $GeR_{17}R_{18}$,
each of $R_{11}$ to $R_{18}$ is independently a hydrogen atom, a deuterium atom, a halogen atom, a substituted or unsubstituted silyl group, a substituted or unsubstituted boryl group, a substituted or unsubstituted aralkyl group having 6 to 30 carbon atoms, a substituted or unsubstituted aryloxy group having 6 to 30 carbon atoms, a substituted or unsubstituted arylthio group having 6 to 30 carbon atoms, a substituted or unsubstituted phosphine group, a substituted or unsubstituted phosphine oxide group, a substituted or unsubstituted phosphine sulfide group, a substituted or unsubstituted alkyl group having 1 to 20 carbon atoms, a substituted or unsubstituted aryl group having 6 to 30 carbon atoms for forming a ring, or a substituted or unsubstituted heteroaryl group having 2 to 30 carbon atoms for forming a ring, or is optionally combined with an adjacent group to form a hydrocarbon ring,
each of $Z_1$ and $Z_2$ is independently a direct linkage, O, S, Se, $NAr_{21}$, $POAr_{22}$, $CAr_{24}Ar_{25}$, $SiAr_{26}Ar_{27}$, $GeAr_{28}Ar_{29}$, or $BAr_{30}$,
each of $Ar_{21}$ to Arm is independently a substituted or unsubstituted alkyl group having 1 to 20 carbon atoms, a substituted or unsubstituted aryl group having 6 to 30 carbon atoms for forming a ring, or a substituted or unsubstituted heteroaryl group having 2 to 30 carbon atoms for forming a ring, or is optionally combined with an adjacent group to form a hydrocarbon ring or a heterocycle,
each of "p" and "q" is independently 0 or 1,
"f" is an integer between 0 and 7, inclusive,
"g" is an integer between 0 and 4, inclusive,
each of "h" and "i" is independently an integer between 0 and 8, inclusive,
each of "j" and "k" is independently an integer between 0 and 1, inclusive, and j+k≠0.

* * * * *